United States Patent
Raspopovic et al.

(10) Patent No.: US 6,230,306 B1
(45) Date of Patent: *May 8, 2001

(54) METHOD AND APPARATUS FOR MINIMIZATION OF PROCESS DEFECTS WHILE ROUTING

(75) Inventors: Pedja Raspopovic, Cupertino; Ranko Scepanovic, San Jose; Alexander E. Andreev, Sunnyvale, all of CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/062,310

(22) Filed: Apr. 17, 1998

(51) Int. Cl.⁷ .................................................. G06F 17/50
(52) U.S. Cl. .................................................. 716/13; 716/9
(58) Field of Search ........................ 395/500.14; 716/13

(56) References Cited

U.S. PATENT DOCUMENTS

| | | |
|---|---|---|
| 5,491,641 | 2/1996 | Scepanovic et al. . |
| 5,495,419 | 2/1996 | Rostoker et al. . |
| 5,565,322 | 10/1996 | Azami et al. . |
| 5,568,636 * | 10/1996 | Koford ................................. 395/500 |
| 5,578,840 | 11/1996 | Scepanovic et al. . |
| 5,615,128 | 3/1997 | Scepanovic et al. . |
| 5,636,125 | 3/1997 | Rostoker et al. . |
| 5,638,293 | 6/1997 | Scepanovic et al. . |
| 5,661,663 | 8/1997 | Scepanovic et al. . |
| 5,682,322 | 10/1997 | Boyle et al. . |
| 5,712,793 | 1/1998 | Scepanovic et al. . |
| 5,742,510 | 4/1998 | Rostoker et al. . |
| 5,745,363 | 4/1998 | Rostoker et al. . |
| 5,808,899 | 9/1998 | Scepanovic et al. . |
| 5,880,969 * | 3/1999 | Hama ............................ 395/500.02 |
| 5,880,970 * | 3/1999 | Scepanovic ......................... 395/14 |

* cited by examiner

Primary Examiner—Matthew Smith
Assistant Examiner—Thuan Do
(74) Attorney, Agent, or Firm—Mitchell Silberberg & Knupp LLP

(57) ABSTRACT

A method for optimizing the routing of nets in an integrated circuit device, said method comprising the steps of dividing an integrated circuit design with lines in a first direction and lines in a second direction, wherein said first direction is substantially orthogonal to said second direction, forming a routing graph with vertices corresponding to locations where lines in said first direction and lines in said second direction cross and edges connect vertices, for each edge in a plurality of edges in said routing graph, computing an individual edge occupancy value, for an edge in said plurality of edges, computing a penalty value as a function of the individual edge occupancy value of a different edge, and routing a net as a function of said penalty value.

31 Claims, 31 Drawing Sheets

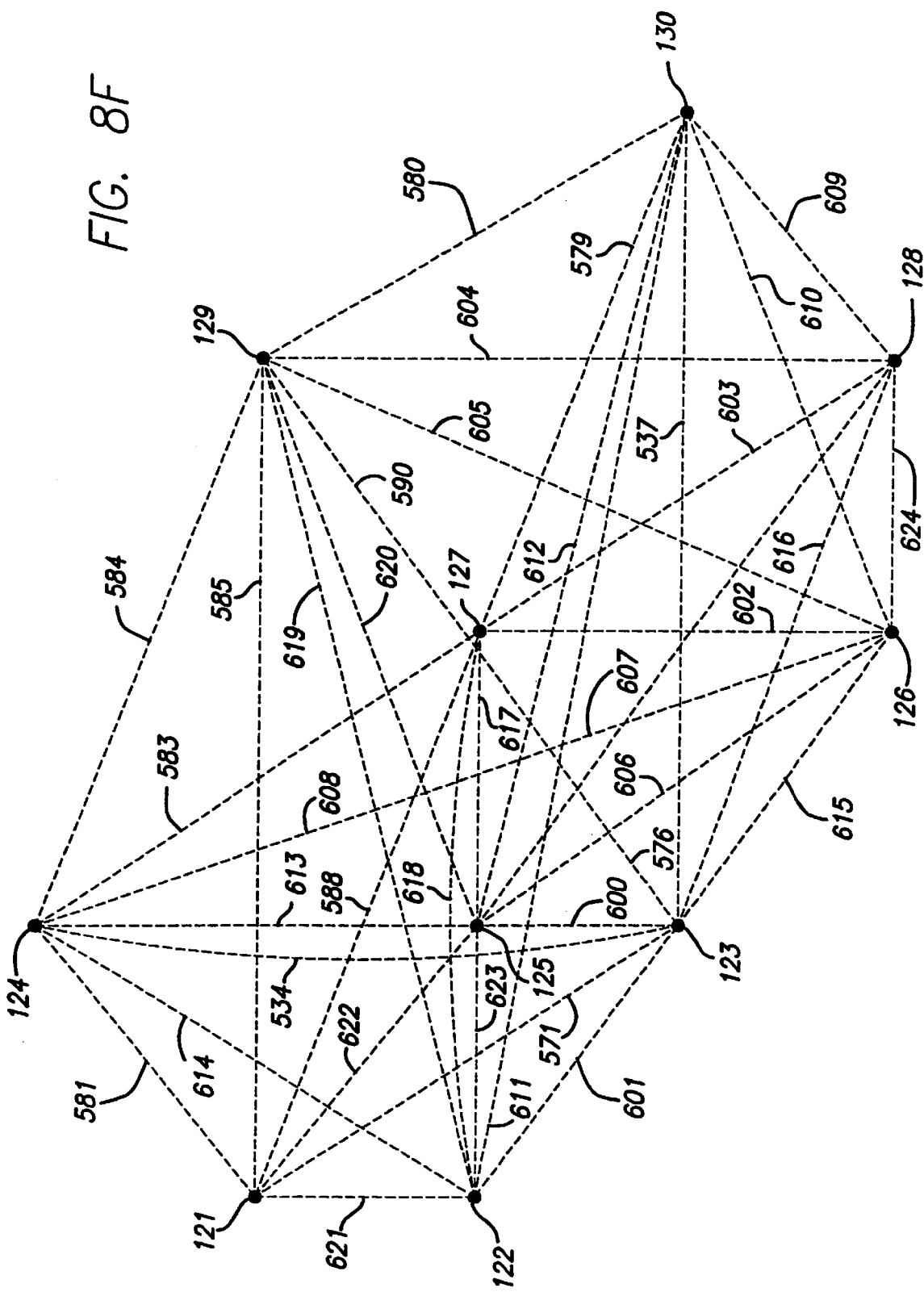

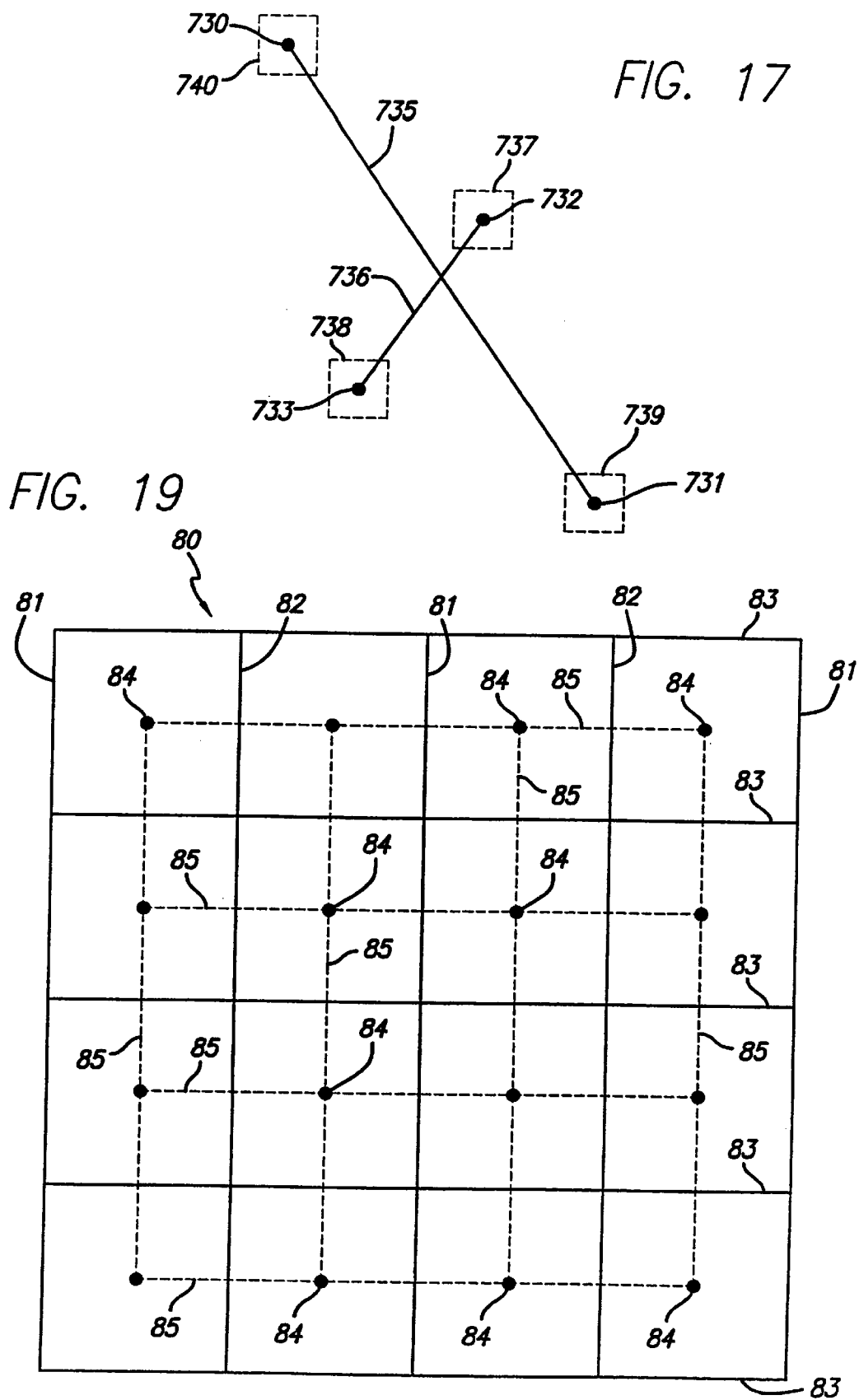

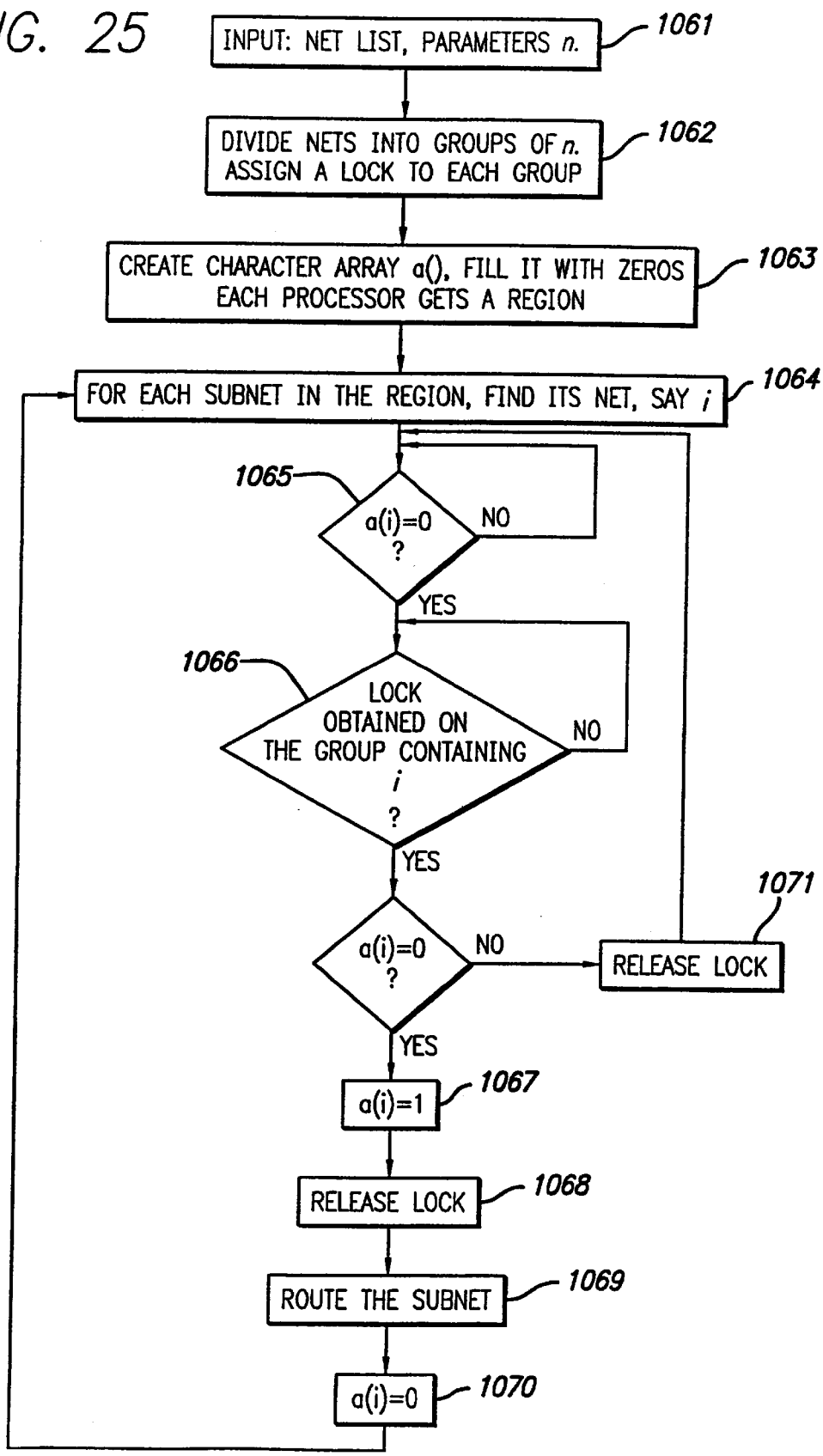

METHOD AND APPARATUS FOR MINIMIZATION OF PROCESS DEFECTS WHILE ROUTING

BACKGROUND OF THE INVENTION

1. Field of the Invention

The present invention generally relates to the art of microelectronic integrated circuits. In particular, the present invention relates to the art of processing high fanout nets for purposes of routing integrated circuit chips.

2. Description of Related Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins. Some nets may include hundreds of pins to be connected. A netlist is a list of nets for a chip.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

A. IC Configuration.

An exemplary integrated circuit chip is illustrated in FIG. 1 and generally designated by the reference numeral 26. The circuit 26 includes a semiconductor substrate 26A on which are formed a number of functional circuit blocks that can have different sizes and shapes. Some are relatively large, such as a central processing unit (CPU) 27, a read-only memory (ROM) 28, a lock/timing unit 29, one or more random access memories (RAM) 30 and an input/output (I/O) interface unit 31. These blocks, commonly known as macroblocks, can be considered as modules or use in various circuit designs, and are represented as standard designs in circuit libraries.

The integrated circuit 26 further comprises a large number, which can be tens of thousands, hundreds of thousands or even millions or more of small cells 32. Each cell 32 represents a single logic element, such as a gate, or several logic elements interconnected in a standardized manner to perform a specific function. Cells that consist of two or more interconnected gates or logic elements are also available as standard modules in circuit libraries.

The cells 32 and the other elements of the circuit 26 described above are interconnected or routed in accordance with the logical design of the circuit to provide the desired functionality. Although not visible in the drawing, the various elements of the circuit 26 are interconnected by electrically conductive lines or traces that are routed, for example, through vertical channels 33 and horizontal channels 34 that run between the cells 32.

B. Layout Design Process.

The input to the physical design problem is a circuit diagram, and the output is the layout of the circuit. This is accomplished in several stages including partitioning, floor planning, placement, routing and compaction.

1. Partitioning.

A chip may contain several million transistors. Layout of the entire circuit cannot be handled due to the limitation of memory space as well as the computation power available. Therefore it is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

2. Floor planning and placement.

This step is concerned with selecting good layout alternatives for each block of the entire chip, as well as between blocks and to the edges. Floor planning is a critical step as it sets up the ground work for a good layout. Floor planning is discussed in U.S. Pat. No. 4,918,614, entitled "Hierarchical Floorplanner" issued to Modarres on Apr. 17, 1990. Said patent is incorporated herein as though set forth in full. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications. One particular placement process is described in U.S. patent application Ser. No. 08/647,605, of R. Scepanovic et al., entitled "Advanced Modular Cell Placement System With Neighborhood System Driven Optimization", filed Jun. 28, 1996. Said patent application is incorporated herein by this reference as though set forth in full.

3. Routing.

The objective of the routing phase is to complete the interconnections between blocks according to the specified netlist. First, the space not occupied by blocks, which is called the routing space, is partitioned into rectangular regions called channels. The goal of a router is to complete all circuit connections using the shortest possible wire length and using only the channel.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes the exact channel routing of wires.

4. Compaction.

Compaction is the task of compressing the layout in all directions such that the total area is reduced. By making the chips smaller, wire lengths are reduced which in turn reduces the signal delay between components of the circuit. At the same time a smaller area enables more chips to be produced on a wafer which in turn reduces the cost of manufacturing. Compaction must ensure that no rules regarding the design and fabrication process are violated.

C. Wafer Construction.

Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. Such a pattern may include the wires that connect cells. Where the present invention is utilized, the wiring patterns will be formed as a function of the output of the present invention. The wiring patterns will be a material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (wafer is heated and exposed to the desired dopant) and ion implantation (dopant atoms are ionized, accelerated to high velocities and implanted into the wafer surface).

SUMMARY OF THE INVENTION

Described herein is a method for optimizing the routing of nets in an integrated circuit device, said method comprising the steps of dividing an integrated circuit design with lines in a first direction and lines in a second direction, wherein said first direction is substantially orthogonal to said second direction, forming a routing graph with vertices corresponding to locations where lines in said first direction and lines in said second direction cross and edges connect vertices, for each edge in a plurality of edges in said routing graph, computing an individual edge occupancy value, for an edge in said plurality of edges, computing a penalty value as a function of the individual edge occupancy value of a different edge, and routing a net as a function of said penalty value.

The present invention also provides for an apparatus for implementing the parallel processing of net routing. The apparatus includes at least one processor and memory connected to the processor. The memory may be any machine-readable storage medium containing the instructions for the processor to perform the steps of the present invention.

These and other aspects, features, and advantages of the present invention will be apparent to those persons having ordinary skilled in the art to which the present invention relates from the foregoing description and the accompanying drawings.

BRIEF DESCRIPTION OF THE DRAWINGS

FIG. 8F shows the next expansion step, wherein the net has been expanded in the x-direction;

FIG. 17 shows four pins with intersecting edges.

FIG. 19 is a routing graph;

FIG. 25 is a flowchart that depicts the parallel routing locking mechanism;

DETAILED DESCRIPTION OF THE PREFERRED EMBODIMENT(S)

I. Method and Apparatus for Parallel Simultaneous Global and Detailed Routing.

Figure 2:
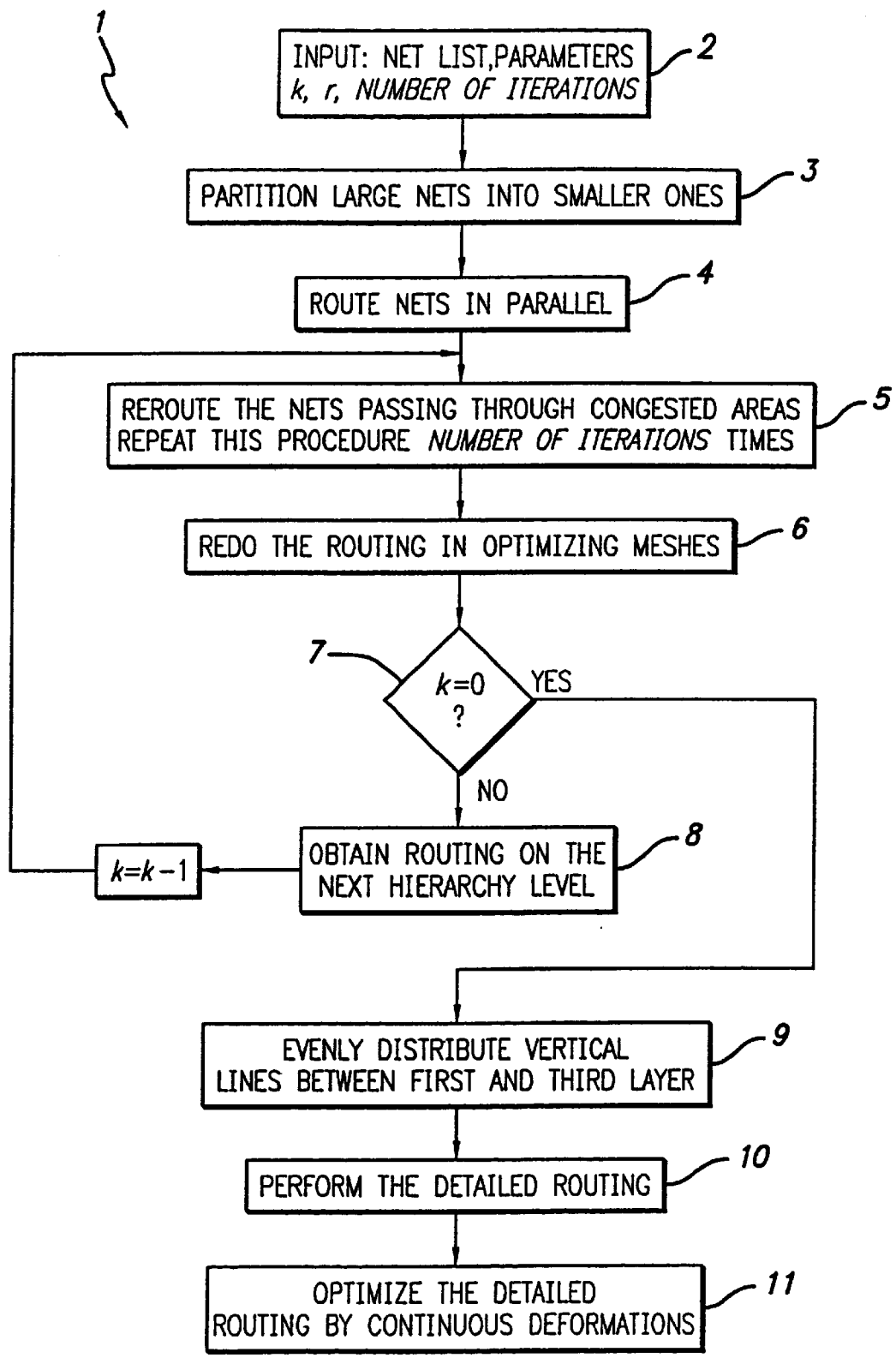
FIG. 2 is a flowchart illustrating the Parallel Simultaneous Global and Detailed Routing System.

Described in this Section I ("Method and Apparatus for Parallel Simultaneous Global and Detailed Routing") is a system for routing an integrated circuit in parallel. The system takes into account congestion and routes nets so as to avoid congested areas. The system also minimizes process defects by spreading wires as evenly as is possible. This routing system utilizes several steps as are shown in FIG. 2. FIG. 2 is a flow chart 1 that shows the basic steps of the routing system.

As an initializing step 2, certain information must be input into the system, including the netlist and certain specified parameters. The parameters include k, r, number of iterations, each of which is discussed more fully below. Additional parameters may also be input at this point of the operations. Such additional parameters include the parameter D (described more fully below in Section II), the parameter K (described more fully below in Section V).

The first operational step 3 is to divide large nets into smaller ones. Preferably, the method described in Section II below ("Method and Apparatus for Parallel Steiner Tree Routing) will be utilized to accomplish this task. For very large nets (e.g. 500 pins or more), the method described in Section III ("Method and Apparatus for Memory-Saving Parallel Steiner Tree Routing") can be utilized to break those nets into smaller nets.

Figure 1:
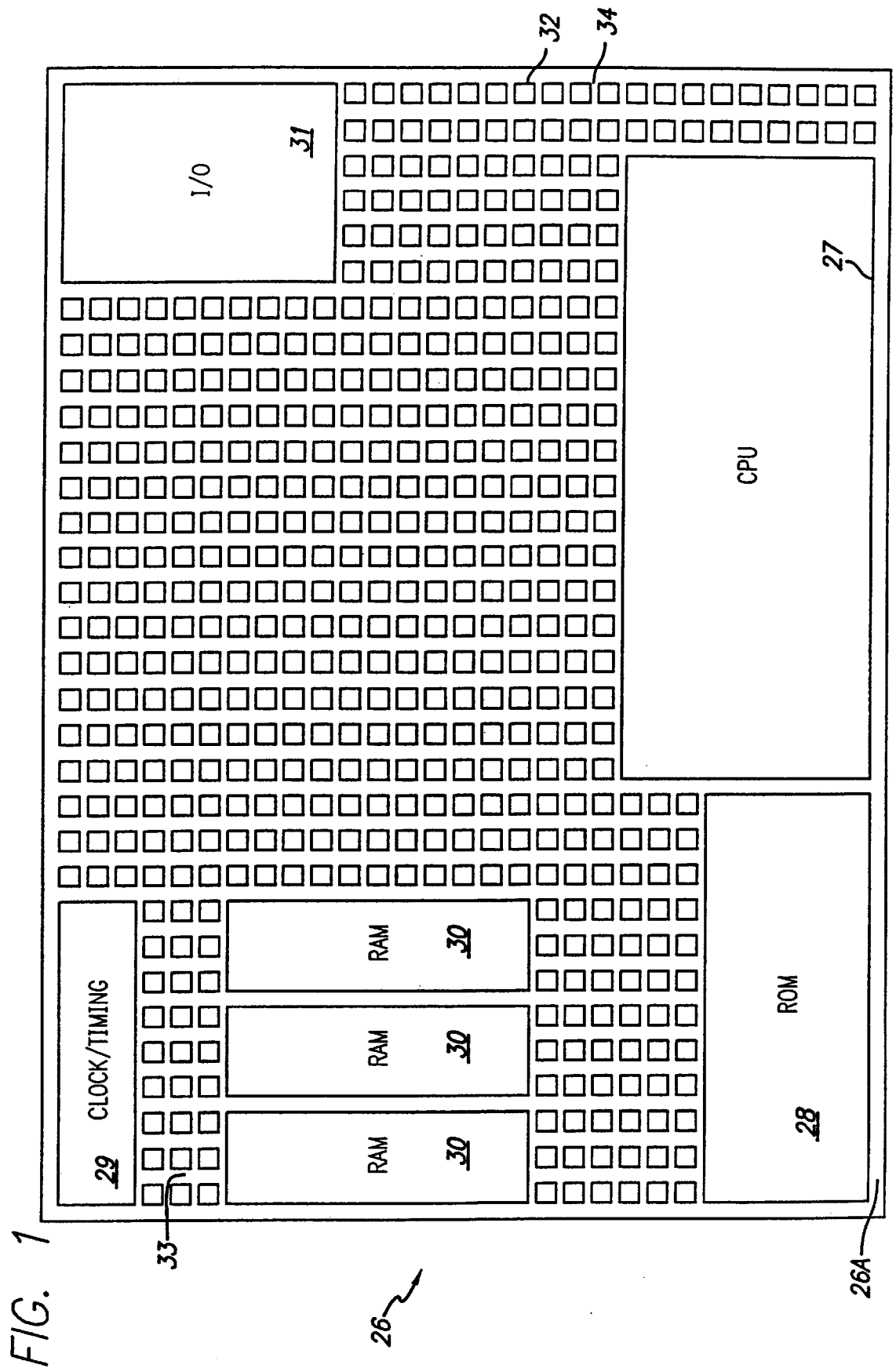
FIG. 1 is a simplified illustration of an integrated circuit chip on semiconducting material.

The second operational step 4 is to route the nets in parallel. The initial routing is accomplished with the method described in Section IV below ("Method and Apparatus for Course Global Routing"). At this step, the design is initially divided with horizontal and vertical lines. Preferably, the IC has vertical columns with channels. See, FIG. 1. A vertical line passes through the middle of each column and a vertical line passes through the middle of each channels and the vertical lines, columns and channels do not change as the process progresses. Horizontal lines are initially $2^k$ grid lines apart. The parameterk is input at the initial system step 2 and is usually 4. As is described more fully below, the horizontal lines will move toward each other and new horizontal lines will be added as the process proceeds. In the preferred embodiment, the Course Global Routing process utilizes the Construction of a Spanning Hypertree described below in Section V.

The third operational step is to reroute nets passing through congested areas 5. Preferably, we repeat this third operational step predetermined number of times. This third operational step is described in Section IV below (Method and Apparatus for Hierarchical Global Routing Descend).

As a fourth operational step, we redo the routing in optimizing meshes 5. This process is described more fully below in Section VII (Method and Apparatus for Local Optimization of the Global Routing."). Next, if k is more than zero we repeat (subtracting one from k) the third and fourth operational steps as a function of the previous level 8. With the smaller k, the IC surface is divided by horizontal lines $2^k$ grids apart, so the number of horizontal lines dividing the design is almost doubled.

If k is equal to zero 7, we proceeded to distribute evenly vertical lines between the first and third layers of the IC design 9. The preferred process for this step is described in Section VIII below (Method and Apparatus for the Minimization of Process Defects While Routing).

Next, we perform detailed routing 10 and optimize the detailed routing by continuous deformations 11. This is also described in Section VIII below.

Also described herein is a Method and Apparatus for a Parallel Routing Locking Mechanism. This is discussed more fully in Section IX below. Since an object of the present invention is to allow the parallel routing of nets, this mechanism can be utilized throughout the system as a memory-efficient means of parallel processing the routing.

II. Method and Apparatus for Parallel Steiner Tree Routing.

A class of paths termed Steiner trees has been developed as one method that is used in the physical design of integrated circuits to efficiently route multi-terminal interconnective nets. The utilization of Steiner tree routing algorithms is well known to those skilled in the art of IC design. It is described, for example, in (1) the United States Application for Letters Patent, entitled "Parallel Processor Implementation of Net Routing", filed by Ranko Scepanovic, Edwin Jones and Alexander E. Andreev, on Feb. 11, 1997, (2) U.S. Pat. No. 5,615,128, issued on Mar. 25, 1997, to Ranko Scepanovic and Cheng-Liang Ding, entitled "Towards optimal steiner tree routing in the presence of rectilinear obstacles, and (3) U.S. Pat. No. 5,587, 923, issued on Dec. 24, 1996, to Deborah C. Wang, entitled "Method for estimating routability and congestion in a cell placement for integrated circuit chip. Applicants incorporate said patent application and said two issued patents herein by this reference as though each were set forth herein in full.

A Steiner tree for n demand points is a tree (a connected graph with no closed paths) made up of lines that interconnect all n demand points of the tree. A Steiner tree, unlike for example a spanning tree, may also contain additional vertices that are not among the n demand points, in order to achieve a shorter pathway among these n demand points. A rectilinear Steiner tree (RST) of n demand points may be characterized as a tree composed only of orthogonal line segments (typically termed edges) that interconnect all n demand points (which are located at vertices). A rectilinear Steiner tree (RST) is confined to an underlying grid type graph which has traditionally been defined as the intersections of orthogonal lines (usually horizontally and vertically oriented) that are drawn through the n demand points. A graph may be considered a pair of sets G=(V, E), where V is a set of vertices or points, and E is a set of edges between the vertices. Finding a minimum rectilinear Steiner tree (MRST) can be characterized as finding a Steiner tree whose edges are constrained to rectilinear shapes that in combination connect all of the desired points in the shortest path available.

Because there are a large number of pins to connect and the complex nature of the connections required, a proper placement of the cells and the routing of the wires are critical for a successful implementation of a chip. Generally, as mentioned above, nets comprise 2 or 3 pins. However, a small number of nets for a particular IC may have many pins. Due to the nonlinear complexity of routing algorithms (in particular Steiner tree routing algorithms), it is very expensive computationally to apply them directly to high fanout nets. Applying the same algorithms on a number of much smaller subnets is considerably less expensive. The purpose of the present invention is to provide a method and apparatus by which high fanout nets can be partitioned into smaller subnets such that the subnets can be routed separately and in parallel.

In accordance with the Parallel Steiner Tree Routing method described in this Section II, a high fanout net is partitioned into subnets so that the subnets can be routed separately in parallel. For a given net we create a set of subnets that satisfy the following conditions: (1) The union of the subnets is the whole net; (2) the number of pins in each subnet is bounded by a given number; and (3) the sum of half-perimeters of the subnets' bounding boxes is as small as possible. Partitioning of a netlist in accordance with the Parallel Steiner Tree Routing method described herein can be parallelized by splitting high fanouts nets among different processors. Steiner tree routing algorithms can then be applied, again in parallel, to the newly obtained netlist that contains no high fanout nets. See FIG. 2, element 3.

Figure 3:
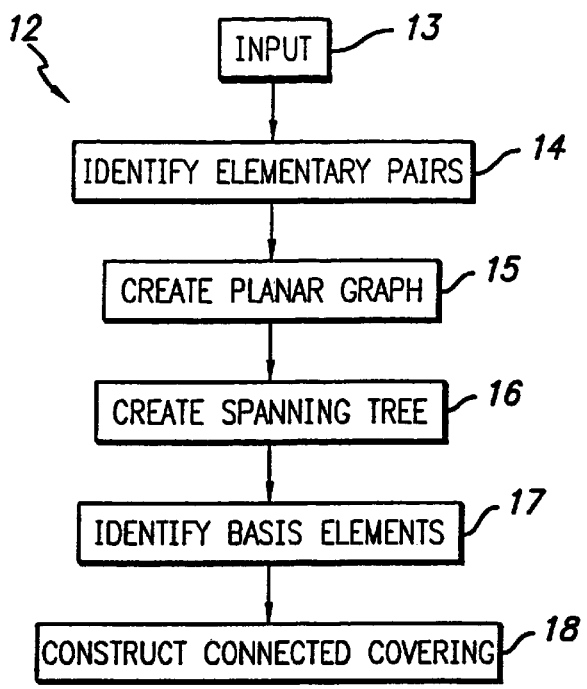
FIG. 3 is a flowchart illustrating the Parallel Steiner Tree Routing system.

FIG. 3 consists of a flow chart 12 which shows the general operation of the Parallel Steiner Tree Routing method. The initiation step 13 involves the input of initial information. The initial information is the net to be processed and a parameter D, which is discussed in more detail below. The first operational step 14 involves finding all elementary pairs of pins in the net. The second operational step 15 involves constructing a planar graph from the graph obtained by joining the two pins comprising each elementary pair of pins. The third operational step 16 involves constructing a spanning tree from the planar graph by removing the longest edges possible. The fourth operational step 17 involves finding all subtrees of the spanning tree having a graph diameter less than the parameter D and such that their bounding box does not contain other pins. The final step 18 is to construct the connected covering of the tree with these subtrees which minimizes the sum of the subtrees' half-perimeters.

A. First Operational Step: Finding All Elementary Pairs of Pins In The Net.

As discussed above, the first operational step in the Parallel Steiner Tree Routing method is to identify all elementary pairs of pins in the net. The details of this step are discussed below.

1. Concepts of Elementary and Quasi-Elementary Pairs of Pins.

The purpose of the Parallel Steiner Tree Routing method is to partition a net into subnets satisfying the above conditions. The key to the Parallel Steiner Tree Routing method is the concept of an "elementary" pair of pins. A pair of pins is said to be elementary if there are no other pins within or on its bounding box.

The concept of a "quasi-elementary" pair of pins is similar to the concept of an elementary pair of pins. A quasi-elementary pair of pins has no pins inside the bounding box, but has one or more pins, other than the pins comprising the subject pair, on the bounding box.

Figure 4A:
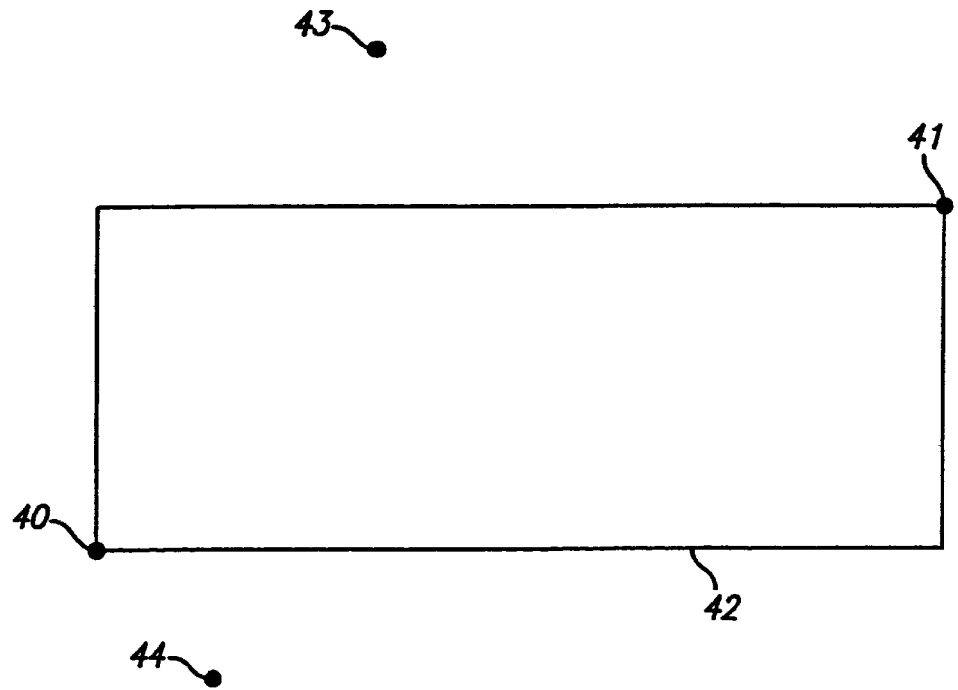
FIG. 4A shows an elementary pair of pins.

FIG. 4A shows an elementary pair of pins. In FIG. 4A, a pin 40 is paired with a second pin 41. There are no pins within the bounding box 42. Pins 43 and 44 are outside the bounding box, so the pair comprising pin 40 and pin 41 is elementary.

Figure 4B:
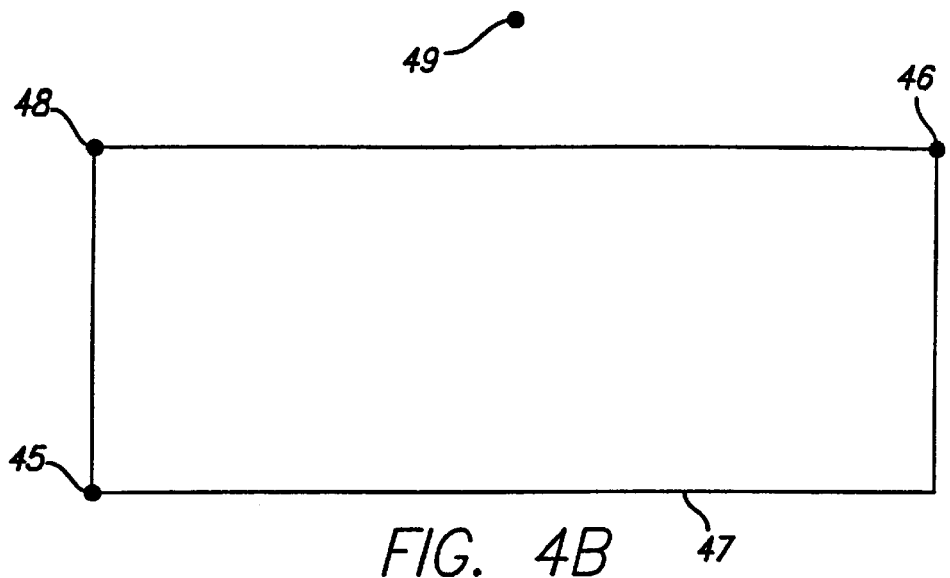
FIG. 4B shows a quasi-elementary pair of pins.

In FIG. 4B, a pin 45 is paired with a second pin 46, said pair having a bounding box 47. A third pin 48 is located on a corner of said bounding box and a fourth pin 49 is located outside the bounding box. The pair comprising pin 45 and pin 46 is not elementary because pin 48 is located on the corner of the bounding box. Said pair is quasi-elementary because there is no other pin within the bounding box and pin 48 is on the bounding box.

Figure 4C:
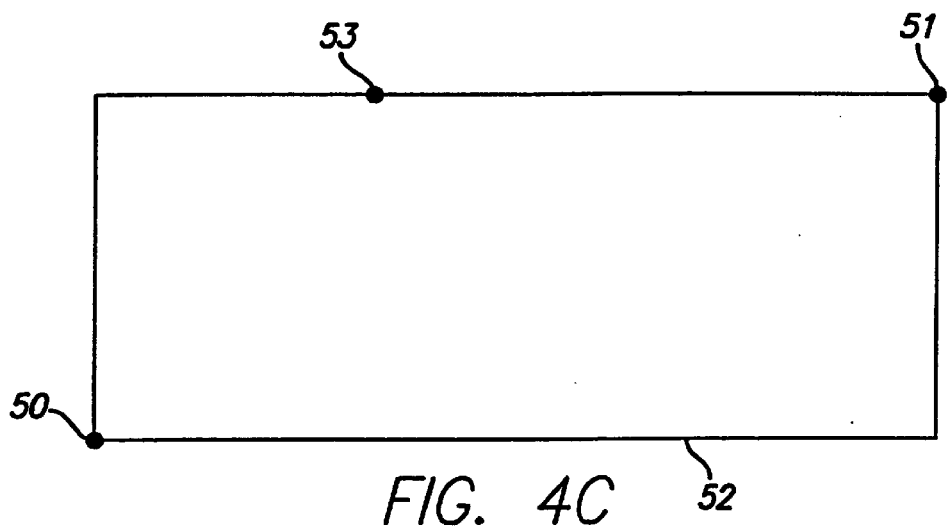
FIG. 4C shows a quasi-elementary pair of pins.

In FIG. 4C, a pin 50 is paired with a second pin 51, said pair having a bounding box 52. A third pin 53 is located on an edge of said bounding box and a fourth pin 54 is located outside the bounding box. The pair comprising pin 50 and pin 51 is not elementary because pin 53 is located on the edge of the bounding box. However, the pair is quasi-elementary because there are no pins within the bounding box and pin 53 is on the bounding box.

Figure 4D:
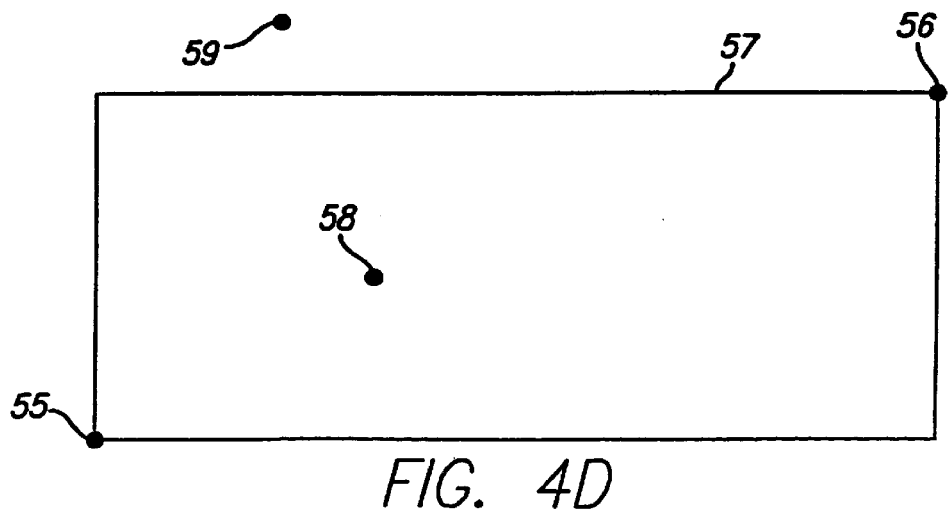
FIG. 4D shows a pair of pins which is neither elementary nor quasi-elementary.

In FIG. 4D, a pin 55 is paired with a second pin 56, said pair having a bounding box 57. A third pin 58 is located inside the bounding box, but not on a corner or an edge, and a fourth pin 59 is located outside the bounding box. The pair comprising pin 55 and pin 56 is not elementary or quasi-elementary because pin 58 is located inside the bounding box.

Figure 4E:
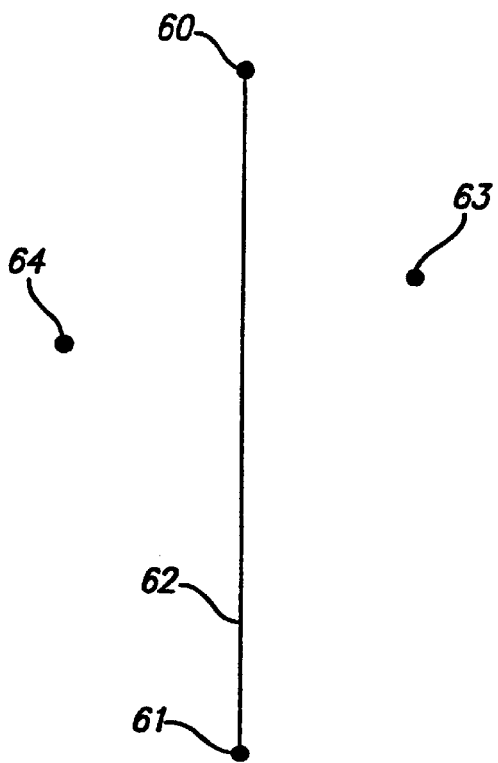
FIG. 4E shows an elementary pair of pins.

In FIG. 4E, a pin 60 is paired with a second pin 61. Because pins 60 and 61 have identical x-coordinates, their bounding box 62 forms a line. Pins 63 and 64 are outside the bounding box so the pair comprising pins 60 and 61 is elementary. Said pair is not quasi-elementary because there is no pin on the bounding box.

Figure 4F:
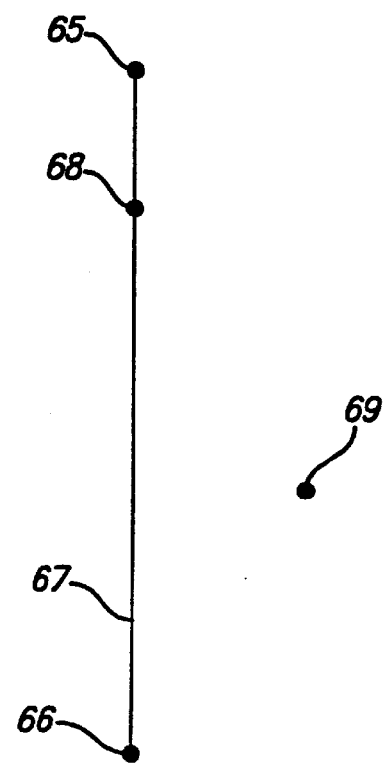
FIG. 4F shows a quasi-elementary pair of pins.

Finally, in FIG. 4F, a pin 65 is paired with a second pin 66, said pair having a bounding box 67. Again, the bounding box forms a line because pins 65 and 66 share the same x-coordinate. Pin 68 is located on the bounding box 67 and pin 69 is located outside the bounding box. The pair comprising pins 65 and 66 is not elementary because pin 68 is on the bounding box. However, for our purposes, the pair is considered quasi-elementary.

2. Lines Passing Through Pins In The Net.

Figure 5:
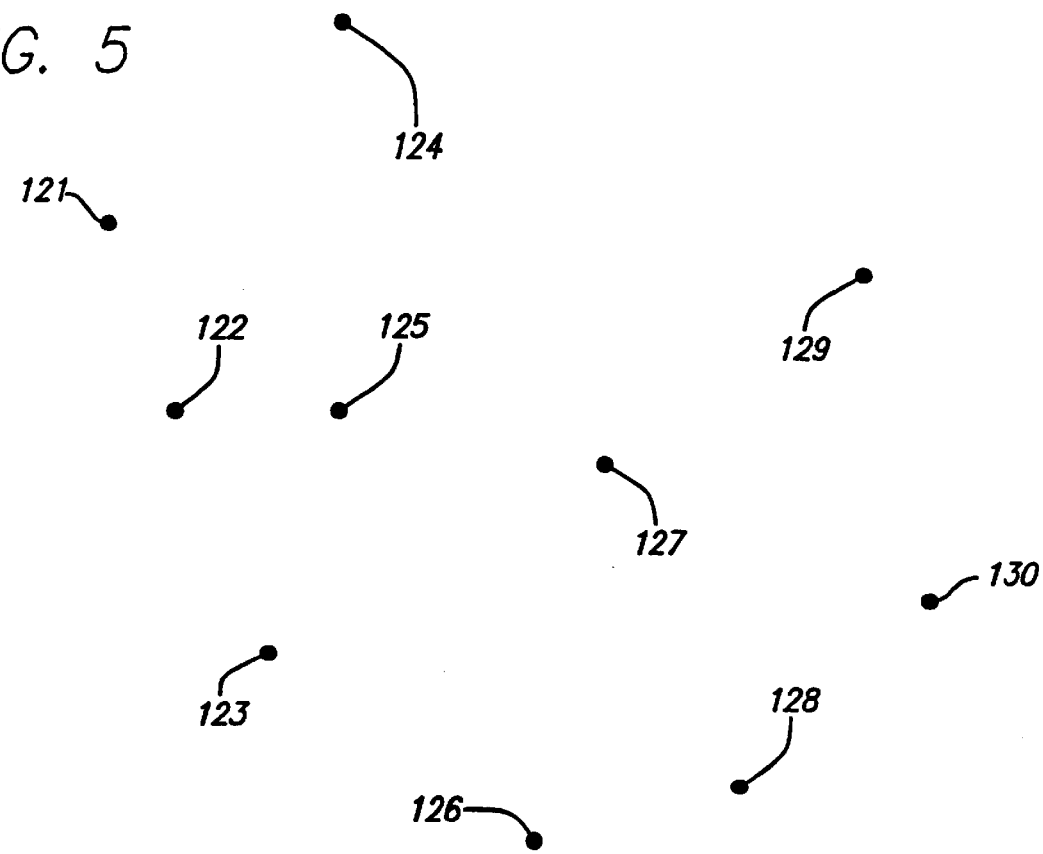
FIG. 5 shows a 10-pin net.

FIG. 5 shows a net comprising 10 pins. Although the Parallel Steiner Tree Routing method is generally applied to nets having greater numbers of pins, a 10-pin net is sufficient for illustration here. As shown in FIG. 5, the 10 pins are numbered 121 through 130.

Figure 6:
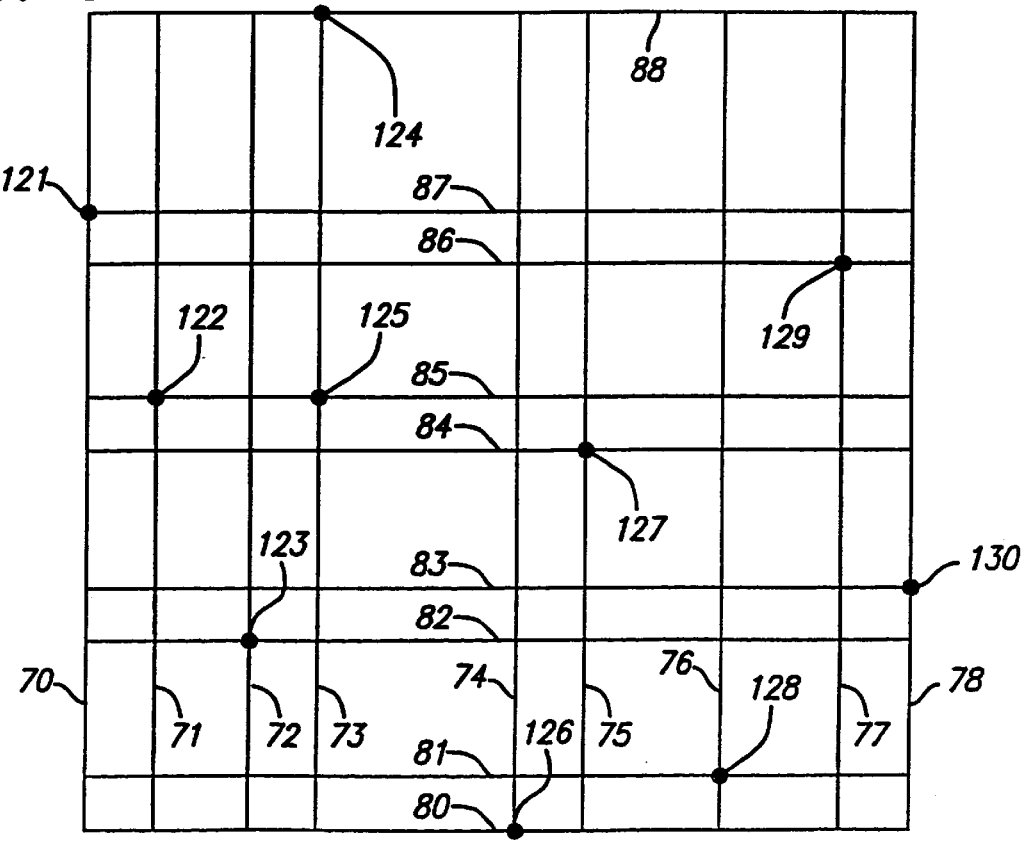
FIG. 6 shows the 10-pin net with horizontal and vertical lines drawn through the pins.

As is shown in FIG. 6, we draw horizontal and vertical lines through each pin. The vertical lines are numbered 70–78 and the horizontal lines are numbered 80–88. As such, each pin is assigned one vertical and one horizontal line as shown in Table 6 below.

TABLE 6

| PIN | VERTICAL LINE | HORIZONTAL LINE |
| --- | --- | --- |
| 121 | 70 | 87 |
| 122 | 71 | 85 |
| 123 | 72 | 82 |
| 124 | 73 | 88 |
| 125 | 73 | 85 |
| 126 | 74 | 80 |

TABLE 6-continued

| PIN | VERTICAL LINE | HORIZONTAL LINE |
| --- | --- | --- |
| 127 | 75 | 84 |
| 128 | 76 | 81 |
| 129 | 77 | 86 |
| 130 | 78 | 83 |

It should be noted that pins 122 and 125 share the same horizontal line and pins 124 and 125 share the same vertical line.

B. Compression of Pins.

Figure 7A:
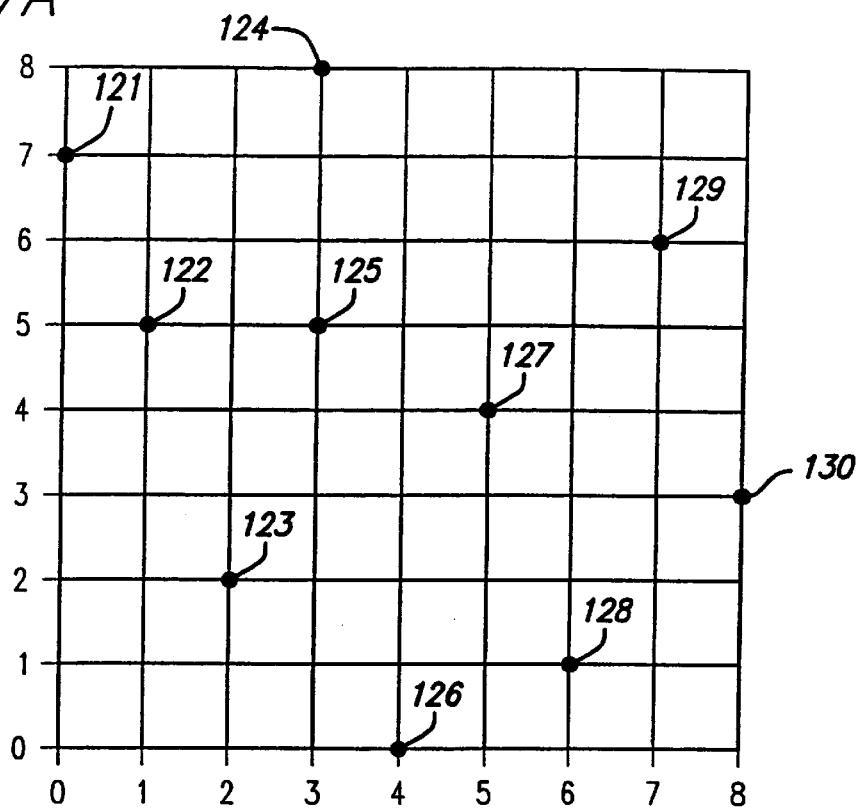
FIG. 7A shows the pins of the 10-pin net after the relative y-coordinates and x-coordinates are set.

The ordinal number of the horizontal line passing through a pin is considered its relative y-coordinate and the ordinal number of the vertical line passing through a pin is its relative x-coordinate. To illustrate, FIG. 7A shows the pins of the 10-pin net discussed above after the relative y-coordinates and x-coordinates are set. The pins and their respective relative x- and y-coordinates are shown in Table 7A below.

TABLE 7A

| PIN | X-COORDINATE | Y-COORDINATE |
| --- | --- | --- |
| 121 | 0 | 7 |
| 122 | 1 | 5 |
| 123 | 2 | 2 |
| 124 | 3 | 8 |
| 125 | 3 | 5 |
| 126 | 4 | 0 |
| 127 | 5 | 4 |
| 128 | 6 | 1 |
| 129 | 7 | 6 |
| 130 | 8 | 3 |

Figure 7B:
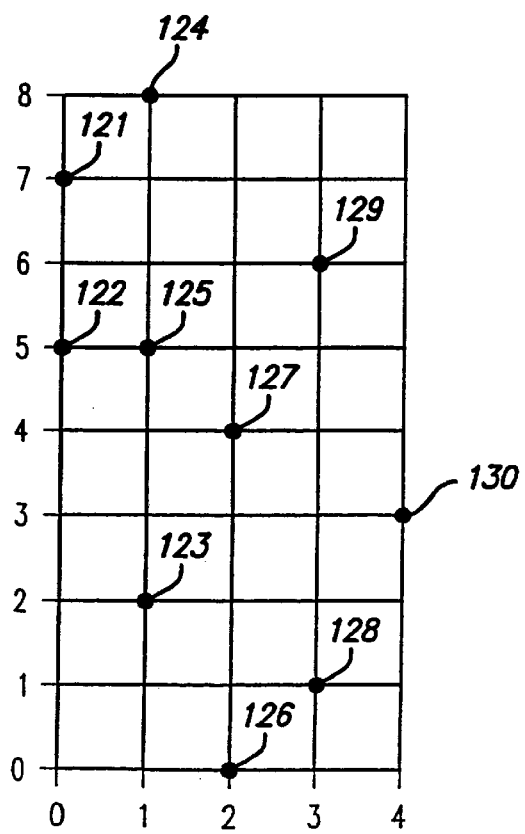
FIG. 7B shows the pins of the 10-pin net after the x-coordinates are halved.

FIG. 7B shows the pins of the 10-pin net after the x-coordinates are halved. The x-coordinate is set to the absolute value of half of the original x-coordinate. Therefore, if the first x-coordinate is 5, for example, the new x-coordinate is 2. If the first x-coordinate is 4, for example, the new x-coordinate is also 2. Table 7B lists the new positions of the pins as shown in FIG. 7B.

TABLE 7B

| PIN | X-COORDINATE | Y-COORDINATE |
| --- | --- | --- |
| 121 | 0 | 7 |
| 122 | 0 | 5 |
| 123 | 1 | 2 |
| 124 | 1 | 8 |
| 125 | 1 | 5 |
| 126 | 2 | 0 |
| 127 | 2 | 4 |
| 128 | 3 | 1 |
| 129 | 3 | 6 |
| 130 | 4 | 3 |

Figure 7C:
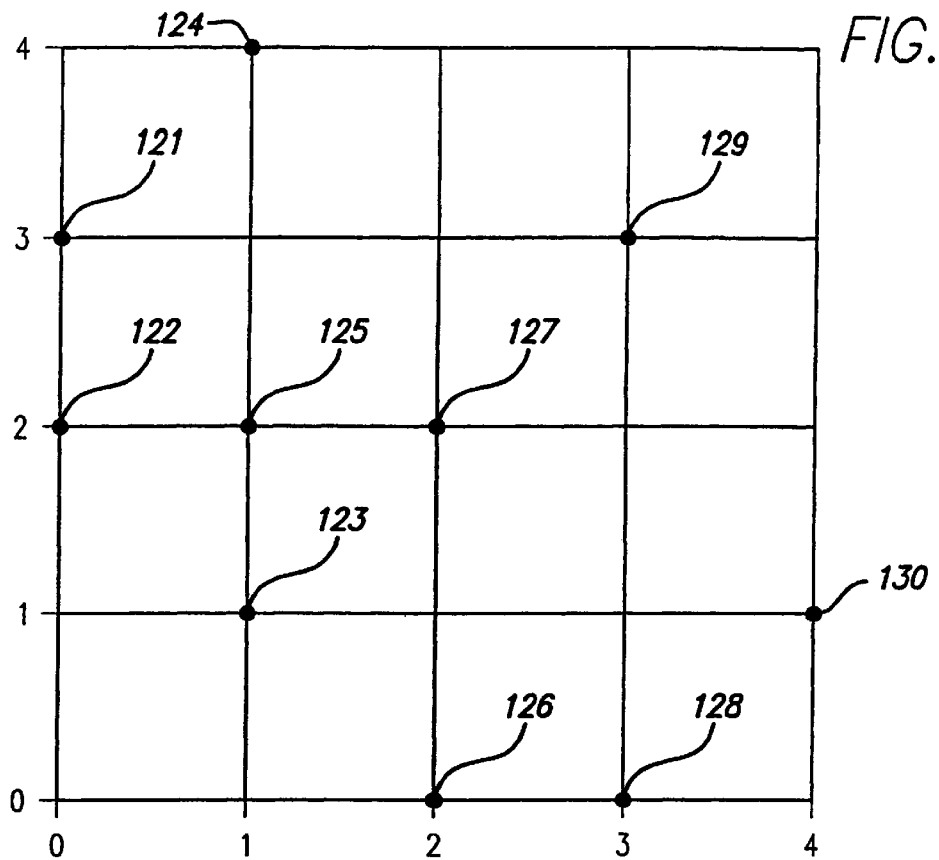
FIG. 7C shows the pins of the 10-pin net after the y-coordinates are halved.

FIG. 7C shows the pins of the 10-pin net after the y-coordinates are halved. Again, each pin which previously had an odd y-coordinate is set to the absolute value of half of its original y-coordinate. The new positions are listed in Table 7C below.

TABLE 7C

| PIN | X-COORDINATE | Y-COORDINATE |
|---|---|---|
| 121 | 0 | 3 |
| 122 | 0 | 2 |
| 123 | 1 | 1 |
| 124 | 1 | 4 |
| 125 | 1 | 2 |
| 126 | 2 | 0 |
| 127 | 2 | 2 |
| 128 | 3 | 0 |
| 129 | 3 | 3 |
| 130 | 4 | 1 |

Figure 7D:
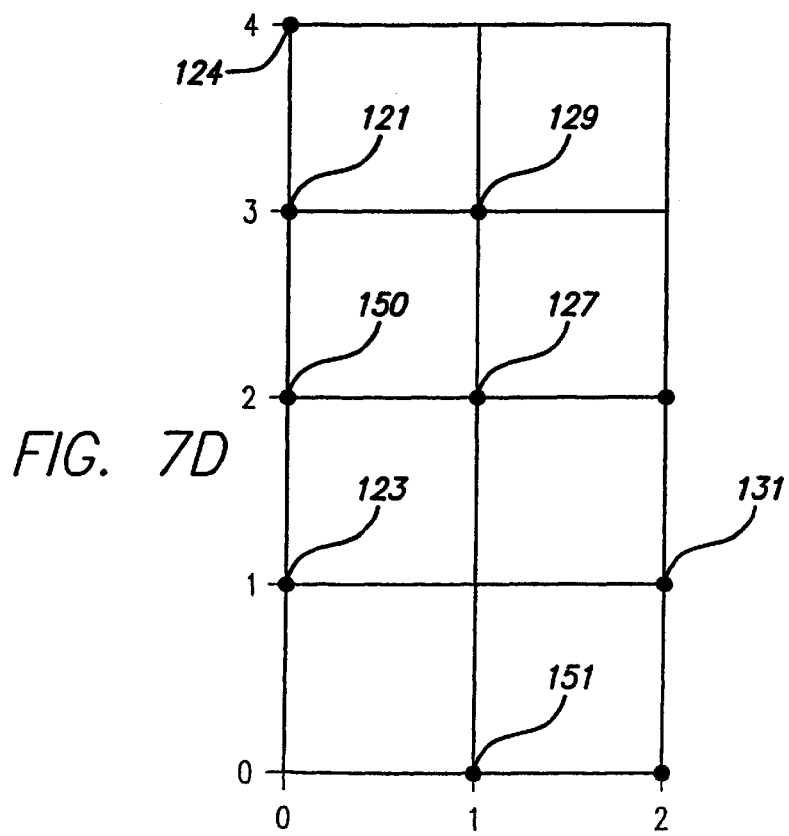
FIG. 7D shows the pins of the 10-pin net after the x-coordinates are again halved.

FIG. 7D shows the pins of the 10-pin net after the x-coordinates are again halved. Previously, pin 122 had an x-coordinate of 0. Pin 125 had an x-coordinate of 1. After halving the x-coordinates, x-coordinate of both of these two pins is 0. Accordingly, pin 122 and 125 collapse into pin 150. At this juncture, pin 150 is considered to be a single pin. Pins 126 and 128 have also collapsed into pin 151. Table 7D below sets forth the new pin coordinates.

TABLE 7D

| PIN | X-COORDINATE | Y-COORDINATE |
|---|---|---|
| 121 | 0 | 3 |
| 123 | 0 | 1 |
| 124 | 0 | 4 |
| 127 | 1 | 2 |
| 129 | 1 | 3 |
| 130 | 2 | 1 |
| 150 | 0 | 2 |
| 151 | 1 | 0 |

Figure 7E:
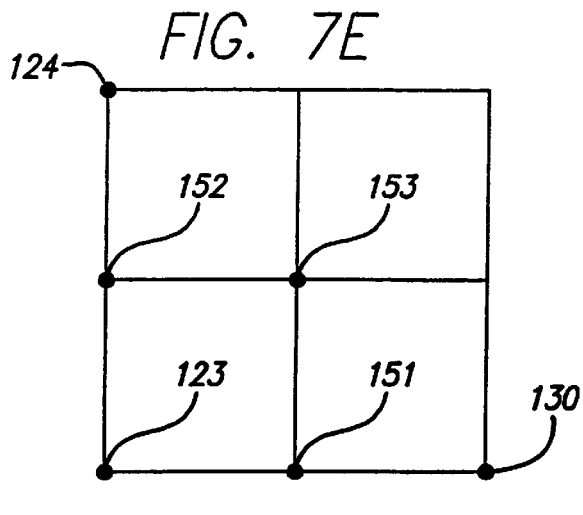
FIG. 7E shows the pins of the 10-pin net after the y-coordinates are again halved.

FIG. 7E shows the pins of the 10-pin net after the y-coordinates are again halved. As a result of this step, pins 121 and 150 have combined to form pin 152. Pins 127 and 129 have combined to form pin 153. The new coordinates are reflected in Table 7E below.

TABLE 7E

| PIN | X-COORDINATE | Y-COORDINATE |
|---|---|---|
| 123 | 0 | 0 |
| 124 | 0 | 2 |
| 130 | 2 | 0 |
| 151 | 1 | 0 |
| 152 | 0 | 1 |
| 153 | 1 | 1 |

Figure 7F:
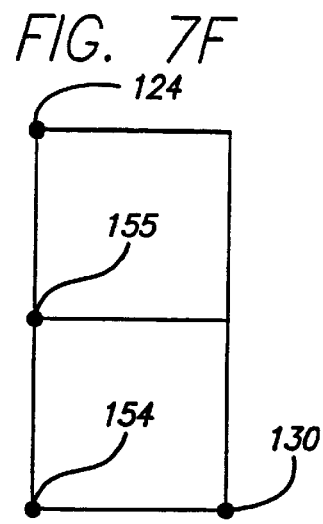
FIG. 7F shows the pins of the 10-pin net after the x-coordinates are again halved.

FIG. 7F shows the pins of the 10-pin net after the x-coordinates are again halved. As a result of this step, pins 123 and 151 have combined to form pin 154. Pins 152 and 153 have combined to form pin 155. The new pin coordinates are set forth in Table 7F below.

TABLE 7F

| PIN | X-COORDINATE | Y-COORDINATE |
|---|---|---|
| 124 | 0 | 2 |
| 130 | 1 | 0 |
| 154 | 0 | 0 |
| 155 | 0 | 1 |

Figure 7G:
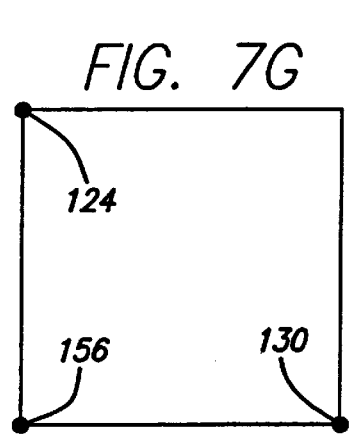
FIG. 7G shows the pins of the 10-pin net after the y-coordinates are again halved.

FIG. 7G shows the pins of the 10-pin net after the y-coordinates are again halved. As a result of this step, pins 154 and 155 have combined to form pin 156. The new pin coordinates are set forth in Table 7G below.

TABLE 7G

| PIN | X-COORDINATE | Y-COORDINATE |
|---|---|---|
| 124 | 0 | 1 |
| 130 | 1 | 0 |
| 156 | 0 | 0 |

Figures 7H, 8A:
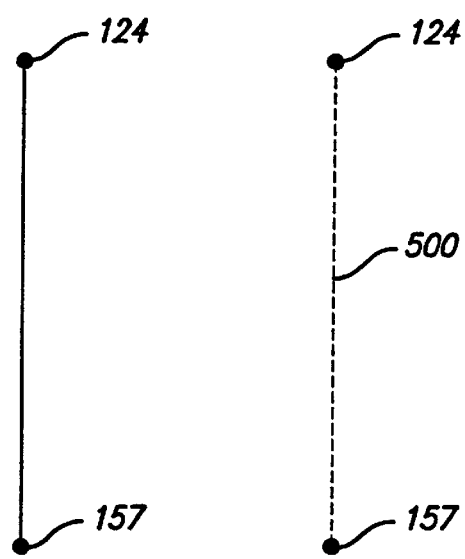
FIG. 7H shows the pins of the 10-pin net after the x-coordinates are again halved.
FIG. 8A shows the two pins remaining after net compression, which comprise an elementary pair.

FIG. 7H shows the pins of the 10-pin net after the x-coordinates are again halved. As a result of this last step, pins 130 and 156 collapse into pin 157 and only two pins remain, pins 124 and 157. Pins 124 and 157 form an elementary pair of pins. The compression process stops when two pins remain.

C. Expansion of Pins.

After the stage where only two pins remain is achieved, the process then reverses back through the hierarchy. At each step, the pins are evaluated to determine the existence of additional elementary and quasi-elementary pairs. This process ends at the lowest level, producing the list of elementary pairs. With respect to a high fanout net, this process is considerably faster than checking all possible pairs for elementariness.

FIG. 8A shows pins 124 and 157, which comprise an elementary pair 500. The fact that pins 124 and 157 form a pair is signified by the dashed line 500.

Figure 8B:
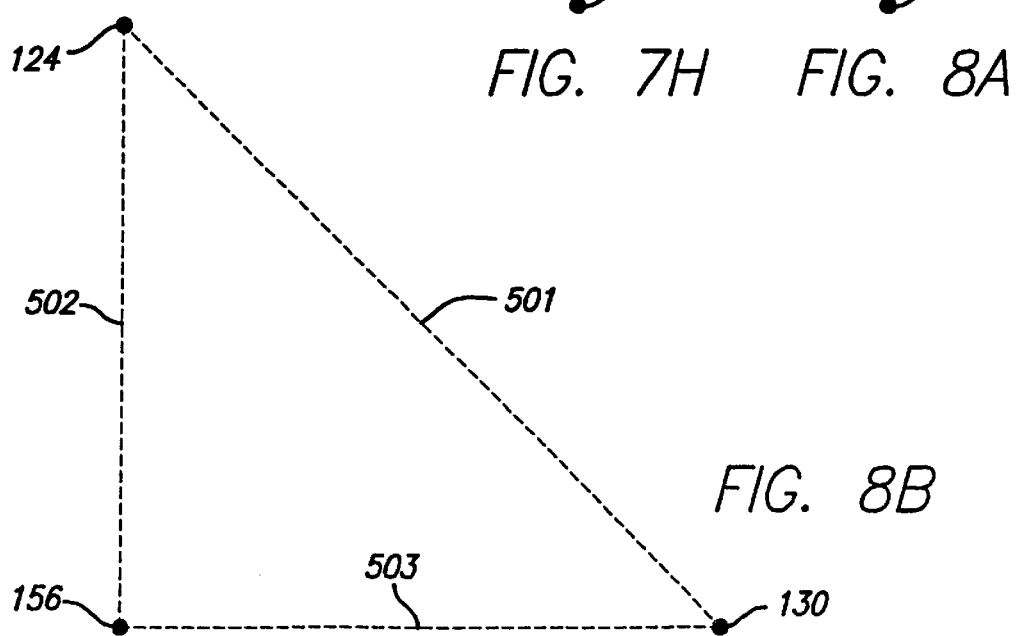
FIG. 8B shows the first expansion step.

FIG. 8B shows the first expansion step. The net has been expanded in the x-direction. After expansion, we have pins 124, 130 and 156, each of which have the coordinates shown in Table 7G above.

The pins from prior elementary and quasi-elementary pairs are first checked to determine if they remain elementary and/or quasi-elementary. In the previous step, pins 124 and 157 formed elementary pair 500. Now pin 157 has been divided back into pins 154 and 156. Therefore, we check between pins 124 and 154 and between pins 124 and 156. Pins 124 and 154 form quasi-elementary pair 501. Pins 124 and 156 form elementary pair 502.

We also consider pins which had comprised a single pin in the previous level, but have divided. When a single pin divides, a new elementary pair is formed. Therefore, we check between pins 154 and 156 because, at the previous level, said pins comprised pin 157. Pins 154 and 156 for n an elementary pair 503.

Table 8B below sets forth in the first column the elementary and quasi-elementary pairs as reflected by FIG. 8B, and for each such pair identifies whether the pair is elementary ("E") or quasi-elementary ("Q"), the pins forming the pair, and the former pin or pair from which the pair derives.

TABLE 8B

| PAIR | E OR Q | PINS | FORMER PIN or PAIR |
|---|---|---|---|
| 501 | E | 124 and 130 | 500 |
| 502 | Q | 124 and 156 | 500 |
| 503 | E | 130 and 156 | 157 |

Figure 8C:
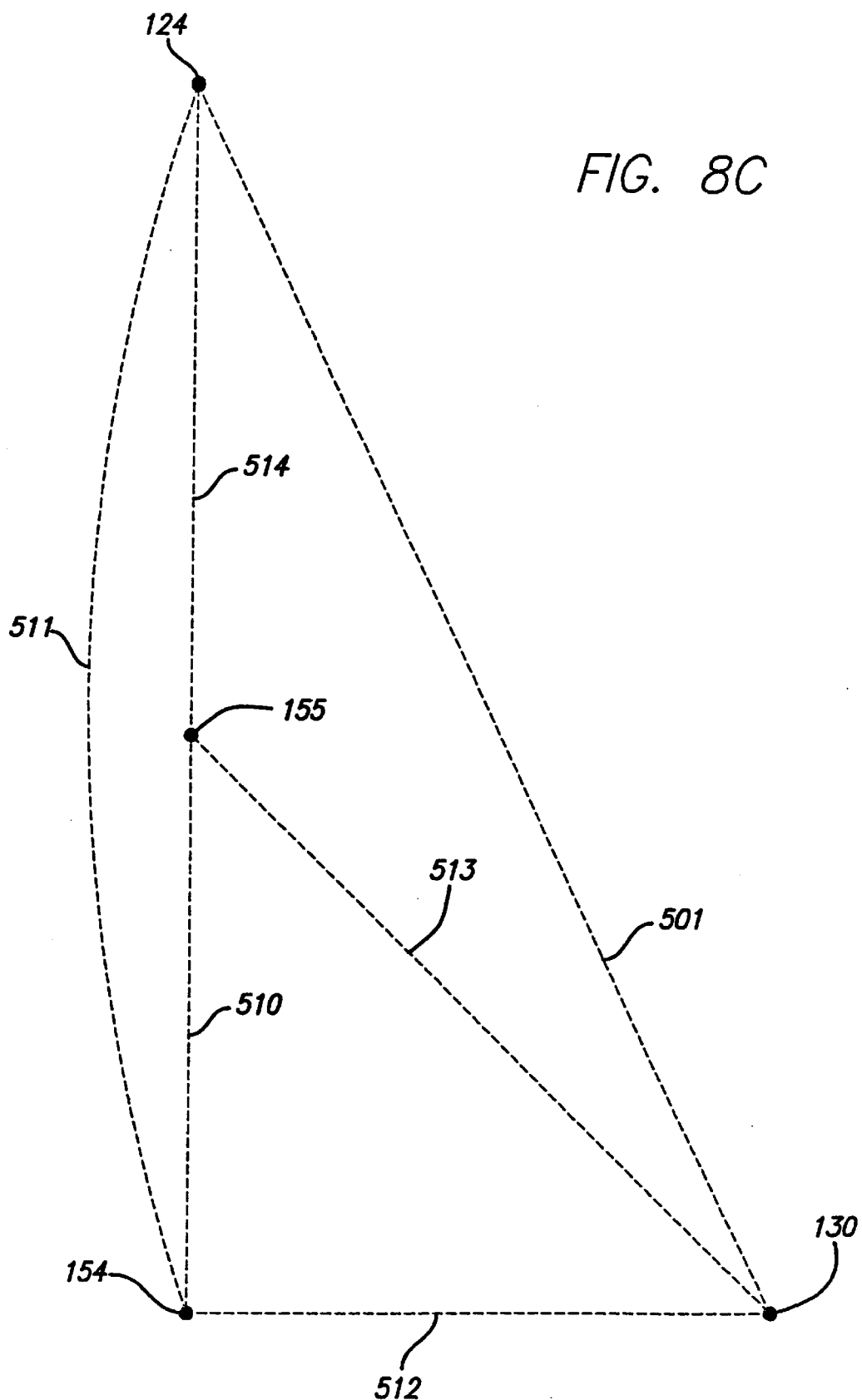
FIG. 8C shows the next expansion step, wherein the net has been expanded in the y-direction.

FIG. 8C shows the next expansion step, wherein the net has been expanded in the y-direction. Here, pin 156 has been divided into pins 154 and 155. Pre-existing elementary and quasi-elementary pairs are checked. Checking quasi-elementary pair 501 reveals that it remains intact. Checking elementary pair 502 reveals elementary pair 510 (comprising pins 154 and 155) and quasi-elementary pair 511 (comprising pins 154 and 124). Checking elementary pair 503 reveals elementary pair 512 (comprising pins 154 and 130) and quasi-elementary pair 513 (comprising pins 154 and 155).

Checking between pins which had comprised a single pin in the previous level reveals elementary pair 514 (comprising pins 124 and 155). Table 8C below sets forth in the first column the elementary and quasi-elementary pairs present after this step, and for each such pair identifies whether the pair is elementary ("E") or quasi-elementary ("Q"), the pins forming the pair, and the former pin or pair from which the pair derives. After expansion, each of the pins have the coordinates shown in Table 7F above.

TABLE 8C

| PAIR | E OR Q | PINS | FORMER PIN or PAIR |
|---|---|---|---|
| 501 | Q | 124 and 130 | 501 |
| 510 | E | 154 and 155 | 502 |
| 511 | Q | 154 and 124 | 502 |
| 512 | E | 133 and 130 | 503 |
| 513 | Q | 130 and 155 | 503 |
| 514 | E | 124 and 155 | 156 |

Figure 8D:
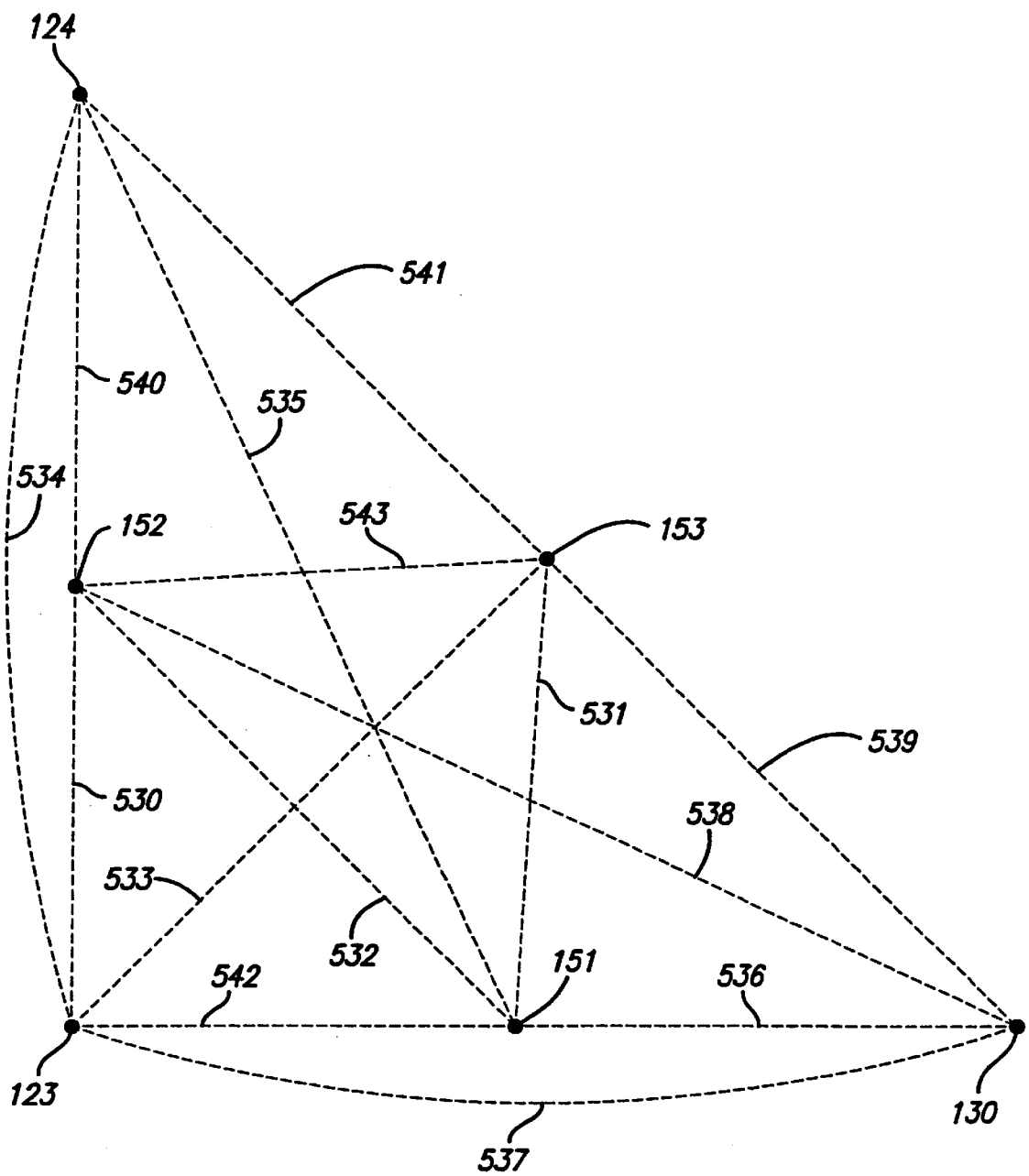
FIG. 8D shows the next expansion step, wherein the net has been expanded again in the x-direction.

FIG. 8D shows the next expansion step, wherein the net has been expanded again in the x-direction. Table 8D below sets forth in the first column the elementary and quasi-elementary pairs present after this step, and for each such pair identifies whether the pair is elementary ("E") or quasi-elementary ("Q"), the pins forming the pair, and the former pin or pair from which the pair derives. After expansion, each of the pins have the coordinates shown in Table 7E above.

TABLE 8D

| PAIR | E OR Q | PINS | FORMER PIN or PAIR |
|---|---|---|---|
| 530 | E | 123 and 152 | 510 |
| 531 | E | 151 and 153 | 510 |
| 532 | Q | 151 and 152 | 510 |
| 533 | Q | 123 and 153 | 510 |
| 534 | Q | 123 and 124 | 511 |
| 535 | Q | 124 and 151 | 511 |
| 536 | E | 130 and 151 | 512 |
| 537 | Q | 123 and 130 | 512 |
| 538 | Q | 130 and 152 | 513 |
| 539 | Q | 130 and 153 | 513 |
| 540 | E | 124 and 152 | 514 |
| 541 | Q | 124 and 153 | 514 |
| 542 | E | 123 and 151 | 154 |
| 543 | E | 152 and 153 | 155 |

It should be noted that pair 501 (comprising pins 124 and 130) is no longer considered because pin 153 now falls within the pair's bounding box such that pair 501 is neither elementary nor quasi-elementary.

Figure 8E:
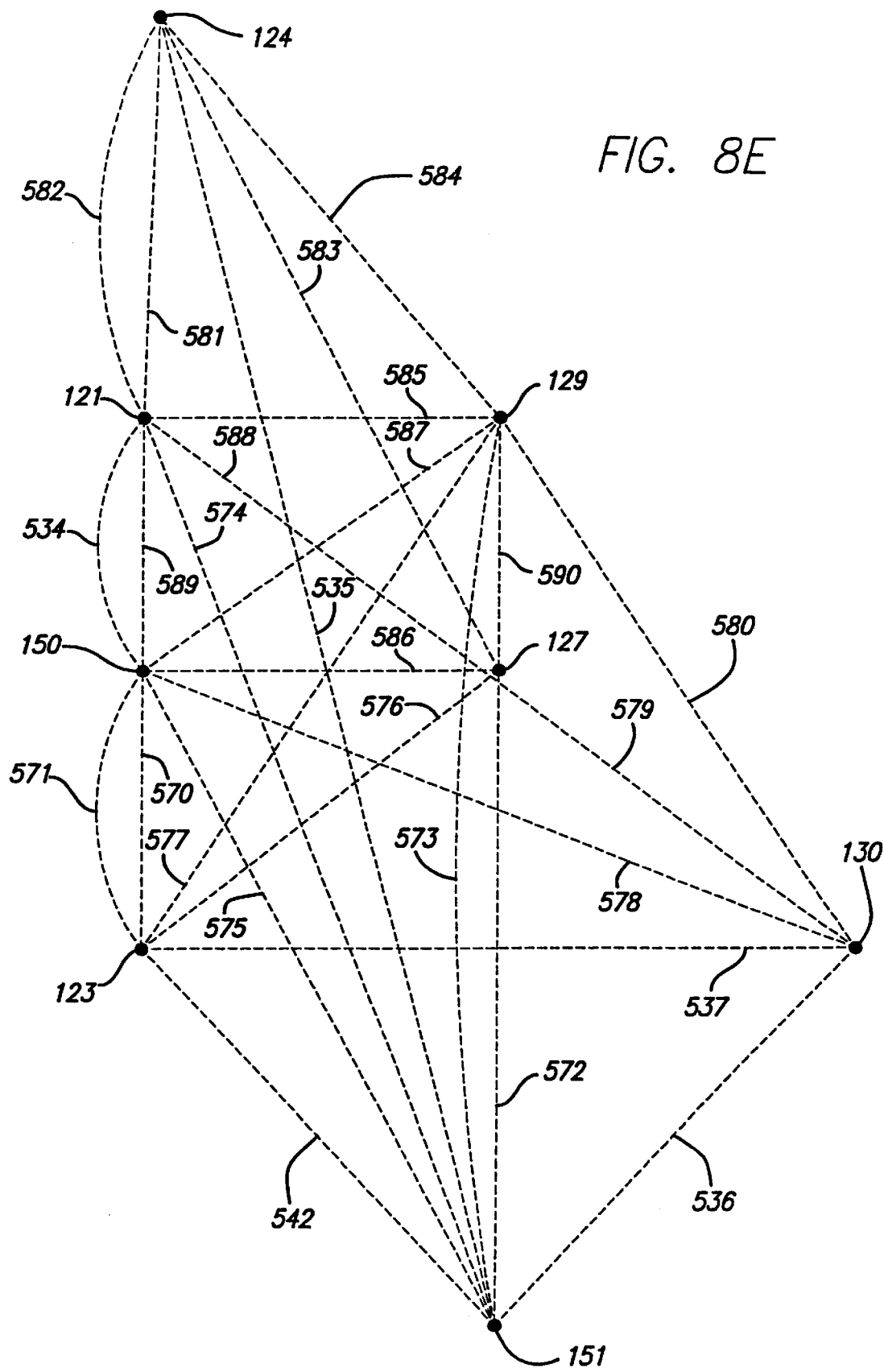
FIG. 8E shows the next expansion step, wherein the net has been expanded in the y-direction.

FIG. 8E shows the next expansion step, wherein the net has been expanded in the y-direction. Table 8E below sets forth in the first column the elementary and quasi-elementary pairs present after this step, and for each such pair identifies whether the pair is elementary ("E") or quasi-elementary ("Q"), the pins forming the pair, and the former pin or pair from which the pair derives. After expansion, each of the pins have the coordinates shown in Table 7D above.

TABLE 8E

| PAIR | E OR Q | PINS | FORMER PIN or PAIR |
|---|---|---|---|
| 570 | E | 123 and 150 | 530 |
| 571 | Q | 123 and 121 | 530 |
| 572 | E | 151 and 127 | 531 |
| 573 | Q | 151 and 129 | 531 |
| 574 | Q | 121 and 151 | 532 |
| 575 | Q | 150 and 151 | 532 |
| 576 | Q | 123 and 127 | 533 |
| 577 | Q | 123 and 129 | 533 |
| 534 | Q | 123 and 124 | 534 |
| 535 | Q | 124 and 151 | 535 |
| 536 | E | 130 and 151 | 536 |
| 537 | E | 123 and 130 | 537 |
| 578 | Q | 130 and 150 | 538 |
| 579 | E | 127 and 130 | 539 |
| 580 | Q | 129 and 130 | 539 |
| 581 | E | 121 and 124 | 540 |
| 582 | Q | 124 and 150 | 540 |
| 583 | Q | 124 and 127 | 541 |
| 584 | Q | 124 and 129 | 541 |
| 542 | E | 123 and 151 | 542 |
| 585 | E | 121 and 129 | 543 |
| 586 | E | 150 and 127 | 543 |
| 587 | Q | 150 and 129 | 543 |
| 588 | Q | 121 and 127 | 543 |
| 589 | E | 121 and 150 | 152 |
| 590 | E | 127 and 129 | 153 |

It should be noted that the status of pair 537 (comprising pins 123 and 130) changes from a quasi-elementary pair to an elementary pair because pin 151 is no longer in the pair's boundary box.

FIG. 8F shows the next expansion step, wherein the net has been expanded in the x-direction. Table 8F below sets forth in the first column the elementary and quasi-elementary pairs present after this step, and for each such pair identifies whether the pair is elementary ("E") or quasi-elementary ("Q"), the pins forming the pair, and the former pin or pair from which the pair derives. After expansion, each of the pins have the coordinates shown in Table 7C above.

TABLE 8F

| PAIR | E OR Q | PINS | FORMER PIN or PAIR |
|---|---|---|---|
| 600 | E | 123 and 125 | 570 |
| 601 | Q | 123 and 122 | 570 |
| 571 | Q | 123 and 121 | 571 |
| 602 | E | 126 and 127 | 572 |
| 603 | Q | 127 and 128 | 572 |
| 604 | E | 128 and 129 | 573 |
| 605 | Q | 126 and 129 | 573 |
| 606 | Q | 125 and 126 | 575 |
| 607 | Q | 125 and 128 | 575 |
| 576 | Q | 123 and 127 | 576 |
| 534 | Q | 123 and 124 | 534 |
| 608 | Q | 124 and 126 | 535 |
| 609 | E | 128 and 130 | 536 |
| 610 | Q | 126 and 130 | 536 |
| 537 | E | 123 and 130 | 537 |
| 611 | Q | 122 and 130 | 537 |
| 612 | Q | 125 and 130 | 578 |
| 579 | E | 127 and 130 | 579 |
| 580 | E | 129 and 130 | 580 |
| 581 | E | 121 and 124 | 581 |
| 613 | E | 124 and 125 | 582 |
| 614 | Q | 122 and 124 | 582 |
| 583 | Q | 124 and 127 | 583 |
| 584 | E | 124 and 129 | 584 |
| 615 | E | 123 and 126 | 542 |

TABLE 8F-continued

| PAIR | E OR Q | PINS | FORMER PIN or PAIR |
|---|---|---|---|
| 616 | Q | 123 and 128 | 542 |
| 585 | E | 121 and 129 | 585 |
| 617 | E | 125 and 127 | 586 |
| 618 | Q | 122 and 127 | 586 |
| 619 | Q | 122 and 129 | 587 |
| 620 | Q | 125 and 129 | 587 |
| 588 | Q | 121 and 127 | 588 |
| 621 | E | 121 and 122 | 589 |
| 622 | Q | 121 and 125 | 589 |
| 590 | E | 127 and 129 | 590 |
| 623 | E | 122 and 125 | 150 |
| 624 | E | 126 and 128 | 151 |

It should be noted that, because pin 151 has divided into pins 126 and 128, consideration of pair 574 reveals two pairs, the first comprising pins 121 and 126 and the second comprising pins 121 and 128. However, neither of these two pairs are elementary or quasi-elementary, so they are not considered further in the process. Pair 577 has also been eliminated because pin 127 is now within the pair's bounding box.

Figure 8G:
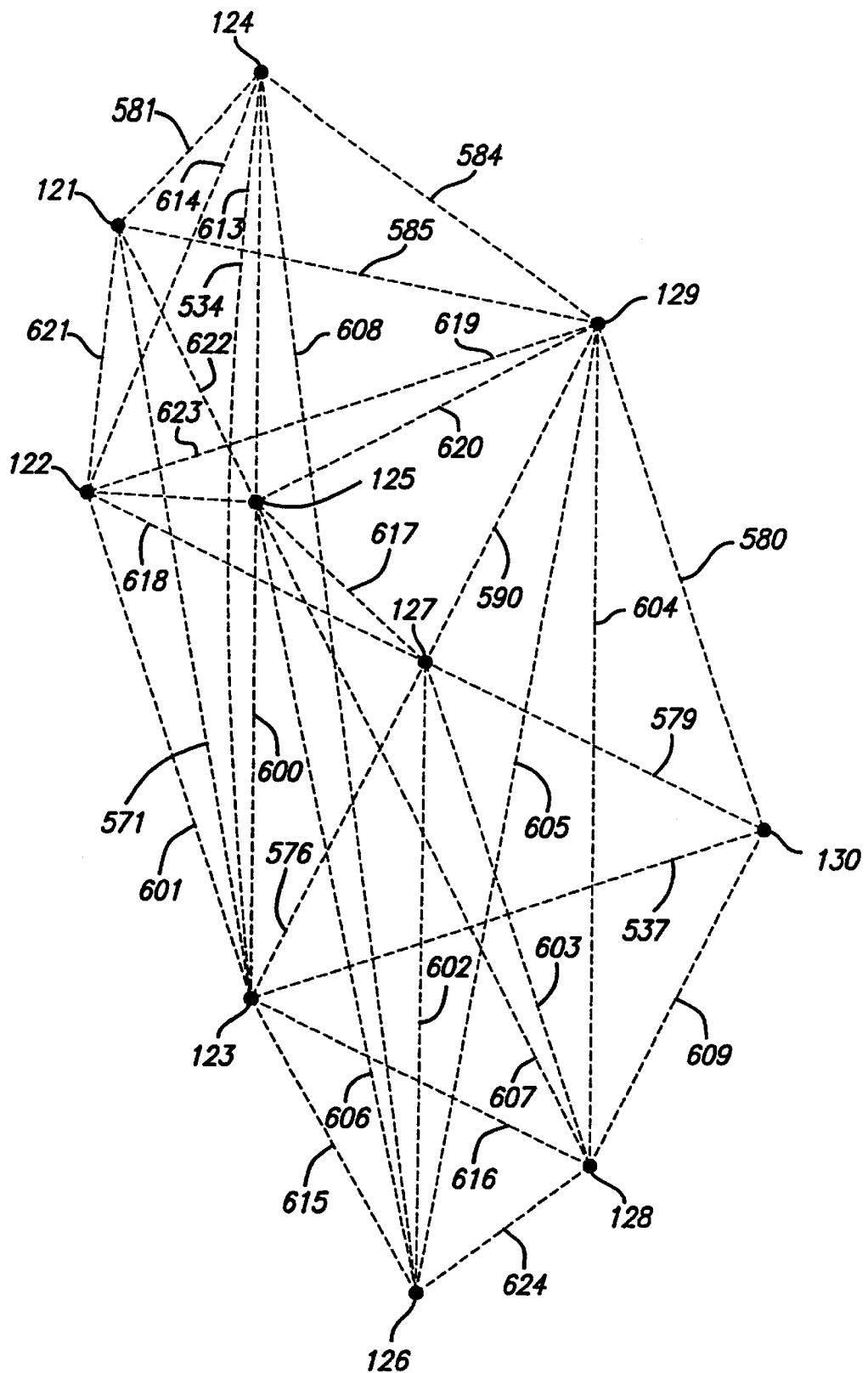
FIG. 8G shows the next expansion step, wherein the net has been expanded in the y-direction.

FIG. 8G shows the next expansion step, wherein the net has been expanded in the y-direction. Table 8G below sets forth in the first column the elementary and quasi-elementary pairs present after this step, and for each such pair identifies whether the pair is elementary ("E") or quasi-elementary ("Q"), the pins forming the pair, and the former pin or pair from which the pair derives. After expansion, each of the pins have the coordinates shown in Table 7B above.

TABLE 8G

| PAIR | E OR Q | PINS | FORMER PIN or PAIR |
|---|---|---|---|
| 600 | E | 123 and 125 | 570 |
| 601 | Q | 123 and 122 | 570 |
| 571 | Q | 123 and 121 | 571 |
| 602 | E | 126 and 127 | 572 |
| 603 | E | 127 and 128 | 572 |
| 604 | E | 128 and 129 | 573 |
| 605 | Q | 126 and 129 | 573 |
| 606 | Q | 125 and 126 | 575 |
| 607 | Q | 125 and 128 | 575 |
| 576 | E | 123 and 127 | 576 |
| 534 | Q | 123 and 124 | 534 |
| 608 | Q | 124 and 126 | 535 |
| 609 | E | 128 and 130 | 536 |
| 537 | E | 123 and 130 | 537 |
| 579 | E | 127 and 130 | 579 |
| 580 | E | 129 and 130 | 580 |
| 581 | E | 121 and 124 | 581 |
| 613 | E | 124 and 125 | 582 |
| 614 | Q | 122 and 124 | 582 |
| 584 | E | 124 and 129 | 584 |
| 615 | E | 123 and 126 | 542 |
| 616 | E | 123 and 128 | 542 |
| 585 | E | 121 and 129 | 585 |
| 617 | E | 125 and 127 | 586 |
| 618 | Q | 122 and 127 | 586 |
| 619 | Q | 122 and 129 | 587 |
| 620 | E | 125 and 129 | 587 |
| 621 | E | 121 and 122 | 589 |
| 622 | Q | 121 and 125 | 589 |
| 590 | E | 127 and 129 | 590 |
| 623 | E | 122 and 125 | 150 |
| 624 | E | 126 and 128 | 151 |

It should be noted that pairs 607, 610, 611, 612, 583 and 588 have been eliminated at this step.

In the previous expansion steps, both elementary and quasi-elementary pairs were retained for consideration. However, in the next and final expansion step, only elementary pairs are retained for further consideration. As we have done in the expansion steps before, after expansion we check both elementary and quasi-elementary pairs. However, if an elementary pair becomes quasi-elementary or a quasi-elementary pair remains quasi-elementary, we consider the pair no further. Table 8H below shows the results after the final expansion in the x-direction and pair checking is completed.

Therefore, in this final expansion step, we first check all elementary and quasi-elementary pairs for elementary pairs (but not quasi-elementary pairs). In our example, we do not have any pins which have just divided. However, if we did, they would also be checked, just as in the prior expansion steps.

TABLE 8H

| PAIR | E or Q | PINS | FORMER PIN or PAIR |
|---|---|---|---|
| 600 | E | 123 and 125 | 570 |
| 601 | Q | 123 and 122 | 570 |
| 602 | E | 126 and 127 | 572 |
| 603 | E | 127 and 128 | 572 |
| 604 | E | 128 and 129 | 573 |
| 606 | E | 125 and 126 | 575 |
| 576 | E | 123 and 127 | 576 |
| 609 | E | 128 and 130 | 536 |
| 537 | E | 123 and 130 | 537 |
| 579 | E | 127 and 130 | 579 |
| 580 | E | 129 and 130 | 580 |
| 581 | E | 121 and 124 | 581 |
| 613 | E | 124 and 125 | 582 |
| 584 | E | 124 and 129 | 584 |
| 615 | E | 123 and 126 | 542 |
| 616 | E | 123 and 128 | 542 |
| 585 | E | 121 and 129 | 585 |
| 617 | E | 125 and 127 | 586 |
| 620 | E | 125 and 129 | 587 |
| 621 | E | 121 and 122 | 589 |
| 590 | B | 127 and 129 | 590 |
| 623 | E | 122 and 125 | 150 |
| 624 | E | 126 and 128 | 151 |

It should be noted that pairs 571, 605, 534, 608, 614, 619, 619 and 622 have not been retained because they each remained quasi-elementary. However, pairs 601 and 606 were retained because their status changed from quasi-elementary to elementary. After this final expansion step, each of the pins have the coordinates shown in Table 6A above. We have now identified the elementary pairs for our 10-pin net.

D. Second Operational Step: Creating A Planar Graph.

Figure 8H:
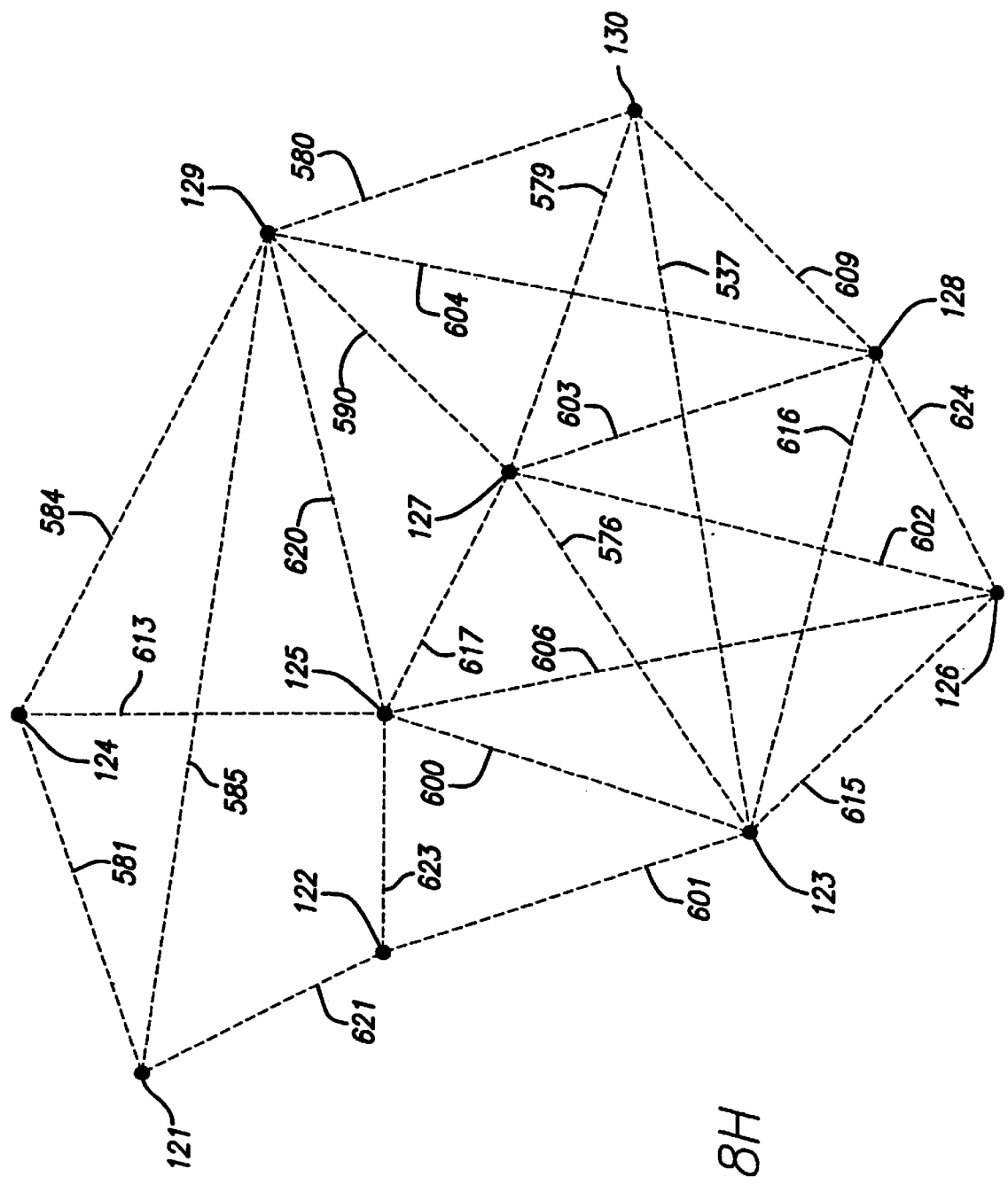
FIG. 8H shows the results of the final expansion step.

The next step in our process is to create a planar graph from the graph shown in FIG. 8H. From the graph in FIG. 8H, we make a planar graph by dropping the longer line where two lines intersect.

Figure 9:
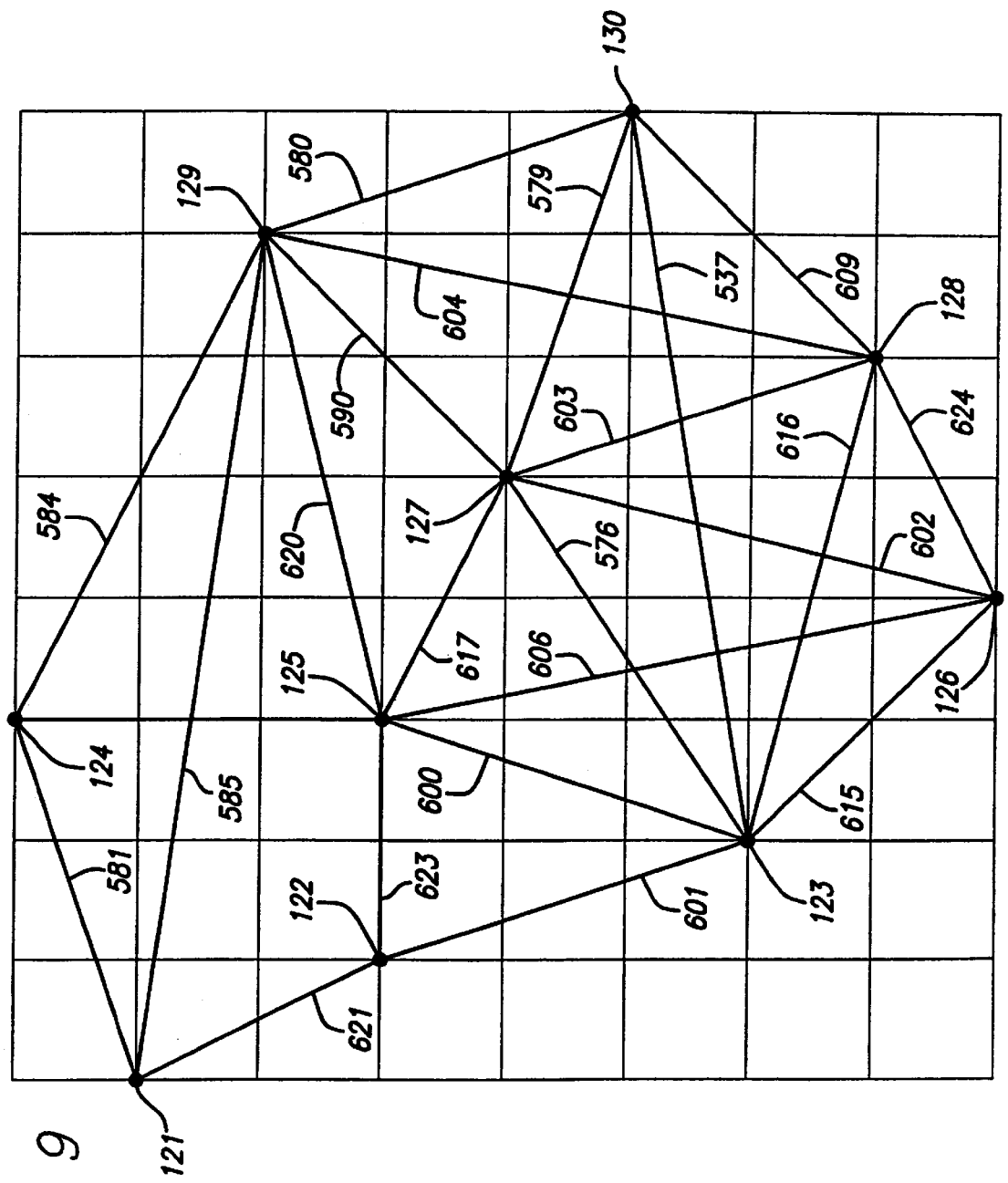
FIG. 9 shows the graph from FIG. 8H on a rectangular grid.

FIG. 9 shows the graph from FIG. 8H on a rectangular grid. For purposes of our discussion herein, each rectangle is identified as R(i,j), with the value i being the column number and the value j being the row number. In FIG. 9, i equals 1 through 8, with 1 representing the column furthest left, 8 representing the column furthest right and the other columns being numbered sequentially. Likewise, in FIG. 9, j equals 1 through 8, with 1 representing the bottom row, 8 representing the top row, and the other rows being numbered sequentially.

We start at R(1,1) and move right along the bottom row to R(8,1), checking each rectangle as we go. None of the rectangles in the bottom row have lines intersecting. We then check the next row up starting at R(1,2) and move right. At R(4,2) we come to the intersection between lines representing pairs 606 and 616. At this point, we remove the longest of the two lines. The lengths of the lines are determined from the real coordinates of their respective pins (as shown in FIGS. 5 and 6) as opposed to their relative coordinates. However, relative coordinates could be used here if desired. Here, for purposes of our example, the line representing pair 606 is the longest and it is removed.

Figure 10:
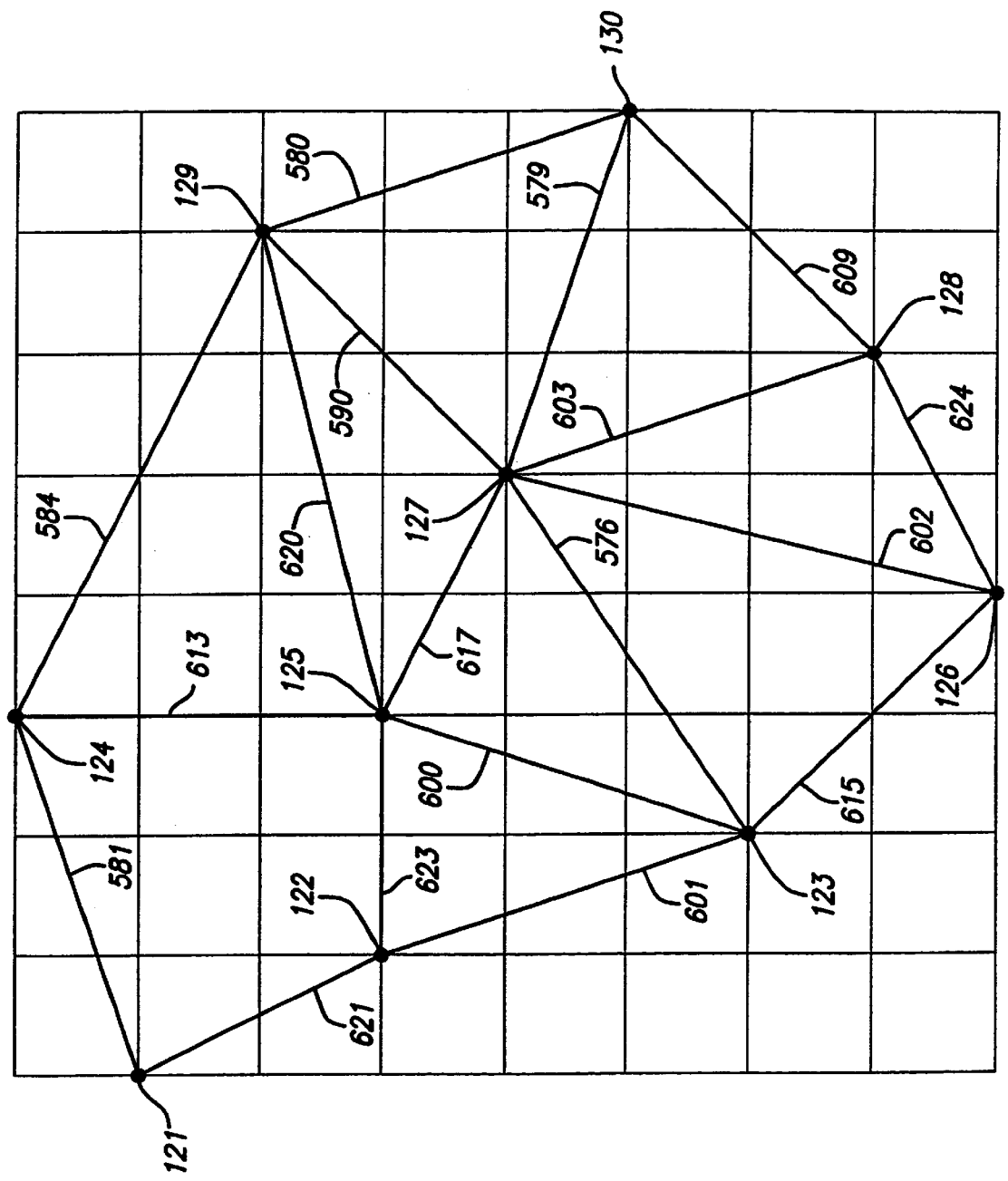
FIG. 10 shows the resulting planar graph.

We then continue checking rectangles for line intersections. At the next rectangle, R(5,2), lines 602 and 616 intersect. Again we remove the longest line, which is line 616 for purposes of our example. We then continue checking rectangles. There are no further line intersections in the row. We then check the next row, beginning with R(1,3). At R(5,3), lines 602 and 537 intersect. For purposes of our example, line 537 is the longest between the two and is removed. We then continue with the process until all the rectangles have been checked. Ultimately, two more lines are removed, 604 and 585. The resulting planar graph is shown as FIG. 10.

E. Third Operational Step: Creating a Spanning Tree.

Figure 11A:
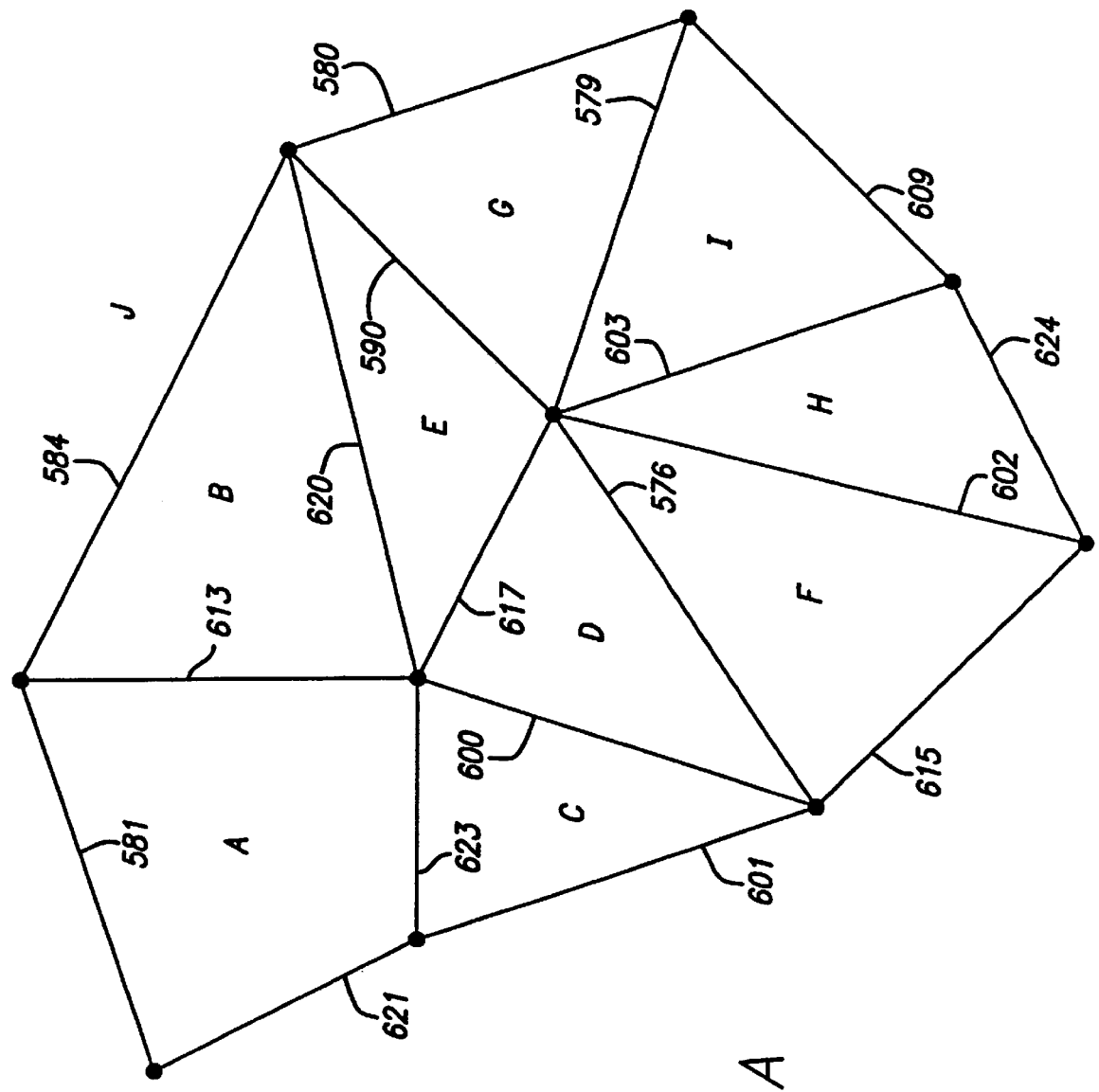
FIG. 11A shows the planar graph, which divides the plane into 10 regions.
Figure 11B:
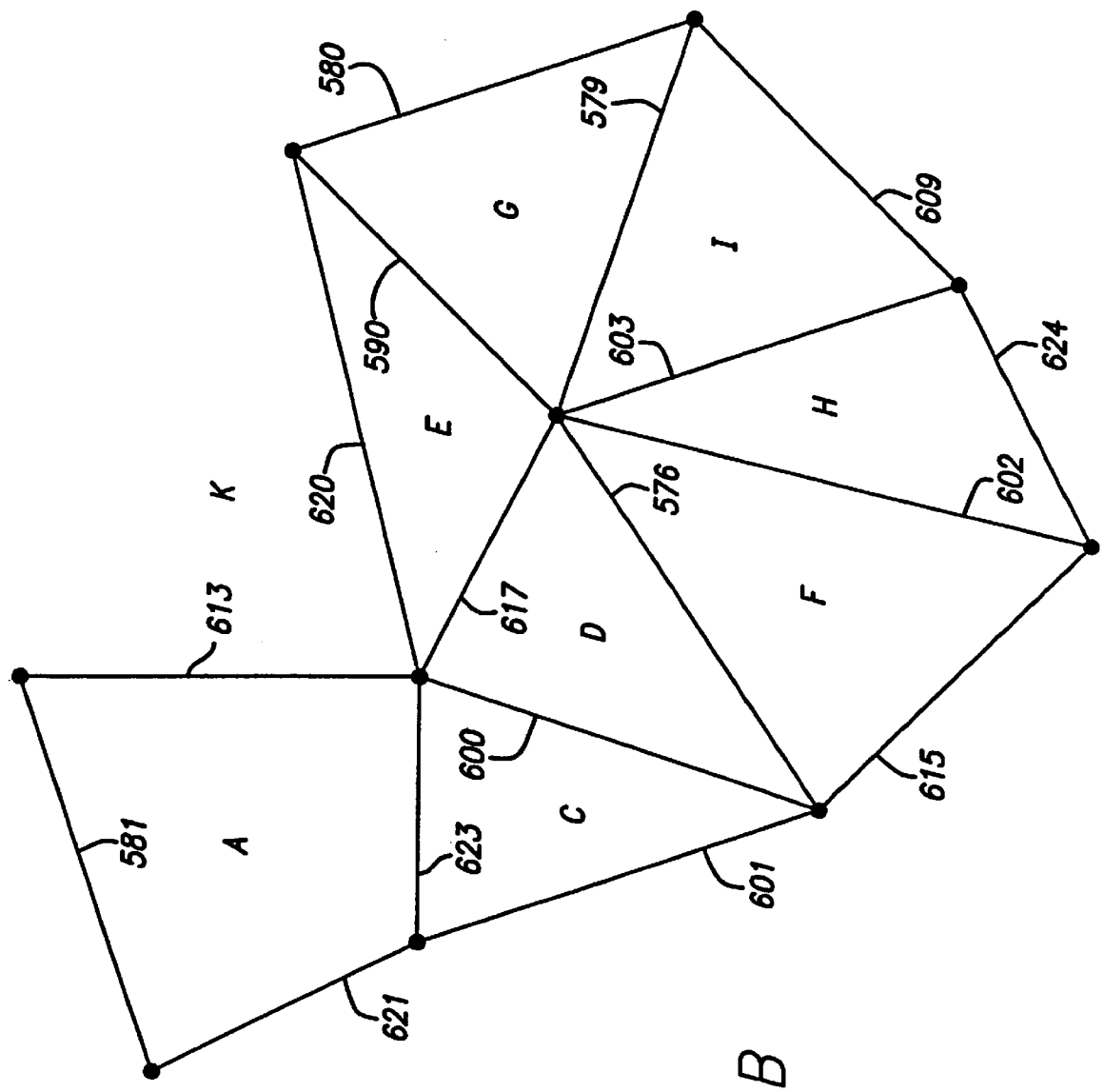
FIG. 11B shows the planar graph after the longest edge is removed.
Figure 11C:
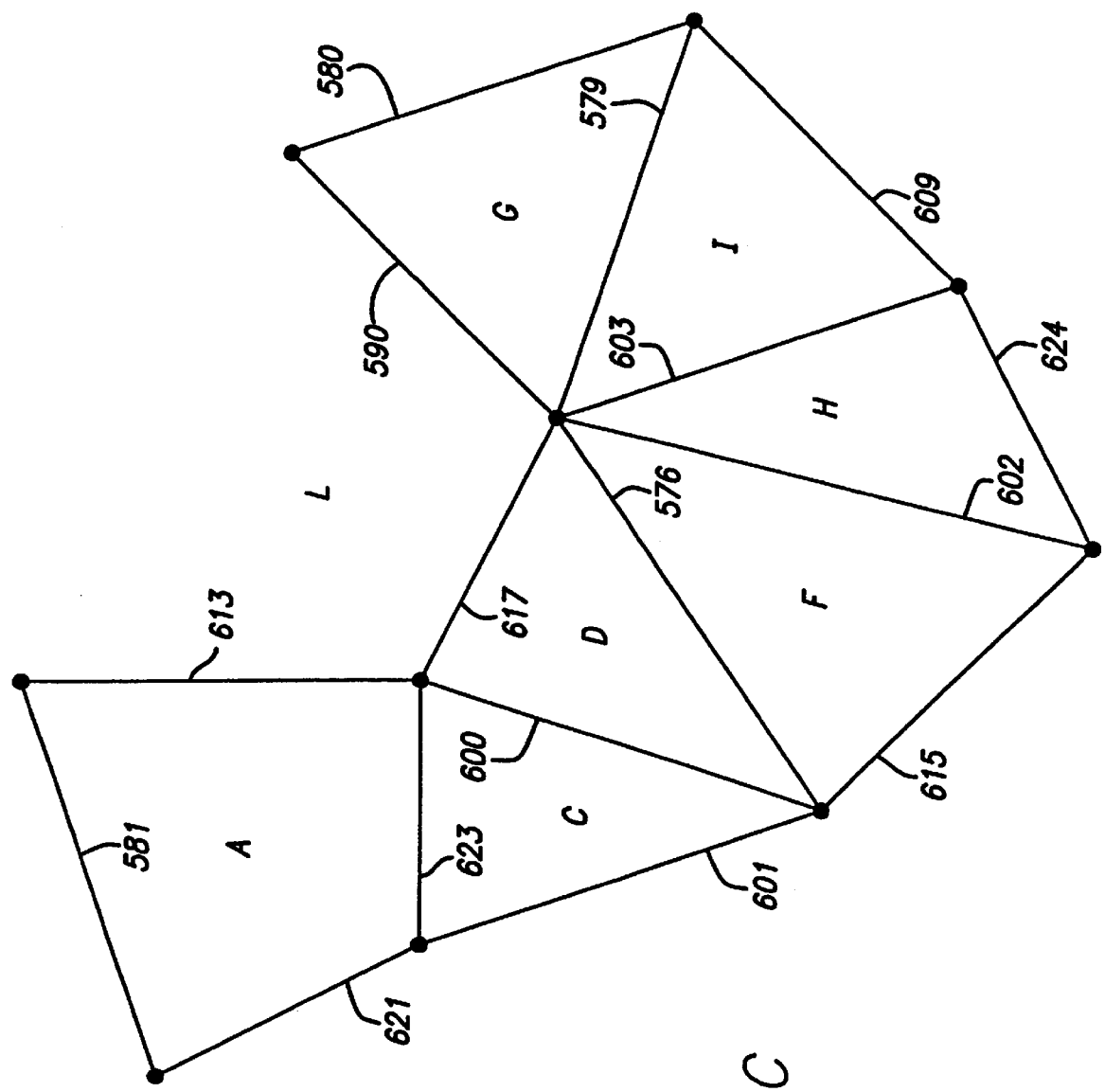
FIG. 11C shows the planar graph after the next longest edge is removed.
Figure 11D:
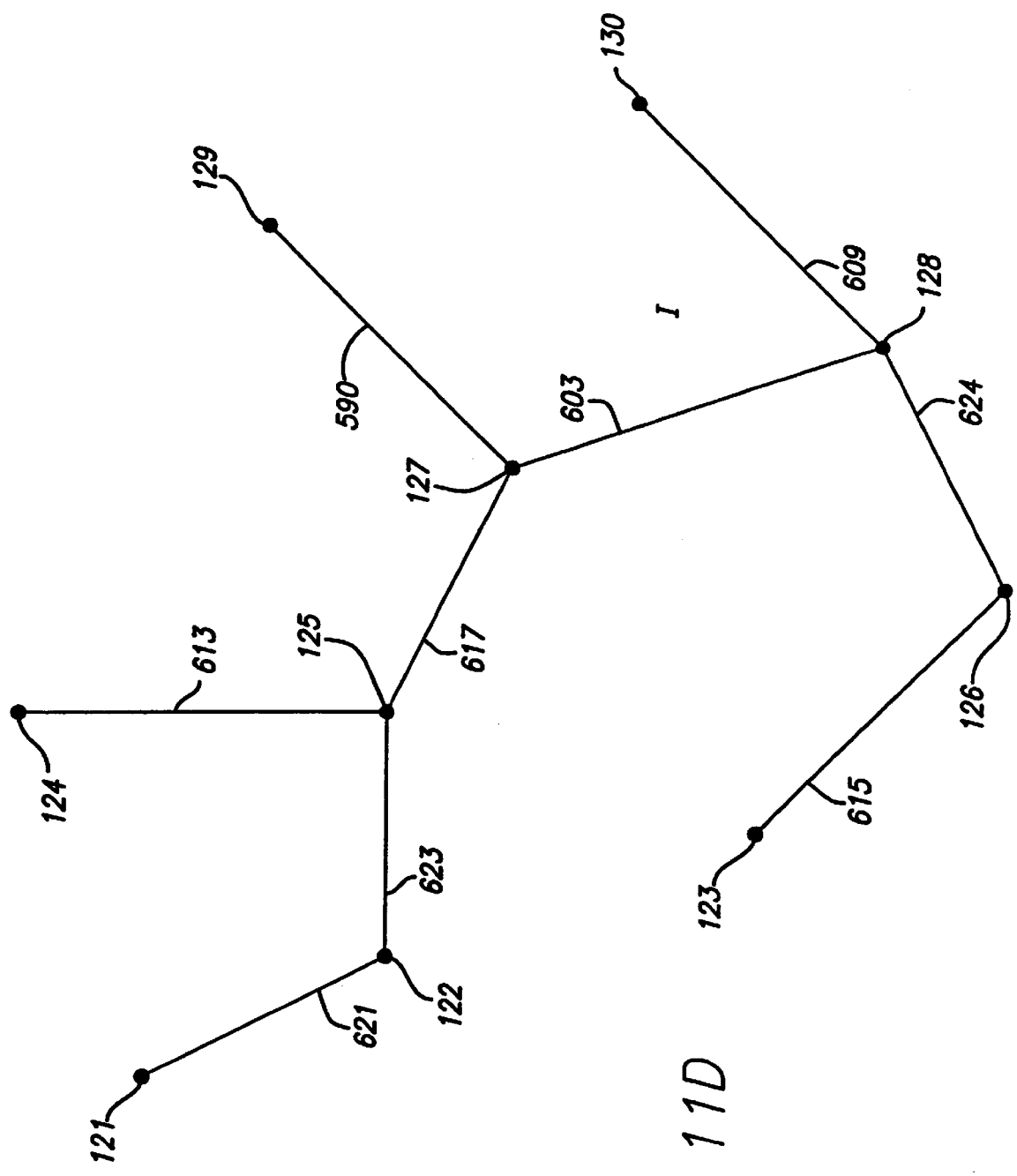
FIG. 11D shows the resulting spanning tree.

The planar graph divides the plane into regions. FIG. 11A shows the planar graph, which divides the plane into 10 regions (identified as regions A through J). Each edge (line) of the planar graph is on the boundary of two regions, which we call neighboring regions. We remove the largest edge between neighboring regions, making these two regions into one. Here, for purposes of our example, the longest edge is 584. FIG. 10B shows the graph after edge 584 is removed. Note that neighboring regions B and J have combined to form region K. We then remove the next longest edge 620 and regions K and E combine to form region L, as is shown in FIG. 11C. Where two edges are of equal length, there is no particular order for their removal. We repeat the process until there is only one region left, thereby forming our desired spanning tree. Note that the process, by always removing the largest possible edge, results in the tree having the smallest possible edges. FIG. 11D shows the remaining spanning tree. Table 11 below shows the order to the removal of edges, the newly created region, and the neighboring regions which combined to form the newly created region.

TABLE 11

| EDGE | NEWLY FORMED REGION | NEIGHBORING REGIONS |
| --- | --- | --- |
| 584 | K | B and J |
| 620 | L | E and K |
| 602 | M | F and H |
| 576 | N | D and M |
| 581 | O | A and L |
| 601 | P | C and O |
| 600 | Q | N and p |
| 580 | R | G and Q |
| 579 | S | I and R |

F. Fourth Operational Step: Identifying Basis Elements.

For each pin in our net, we create a neighborhood of the pin that has a given radius D. The typical value for parameter D is 2 or 3. To do this, we first identify all vertices that are connected to the chosen pin with one edge. We then do the same step for each of these vertices, and so on. By repeating this step D times, we get the collection of all vertices in our tree that are connected to the chosen pin with at most D edges. This is the pin's neighborhood.

For example, referring to FIG. 11D, assume a parameter D equal to 2. For pin 125, the neighborhood comprises edges 621, 623, 613, 617, 590 and 603. Note that we do not go beyond edge 613 because there is no edge connected to edge 613 at pin 124.

Next we find each subtree of this neighborhood that (1) passes through the center pin and (2) has no pins not belonging to the subtree that are located within the bounding box of the subtree. Note, for example, that there are three edges coming out of pin 125, namely 623, 613 and 617. For each such edge we form a group of subtrees containing that edge and not containing the others as follows:

Group A: {623}, {623, 621}

Group B: {613}

Group C: {617}, {617, 590}, {617, 603}, {617, 603, 590}

Now, any pin 125 neighborhood subtree can be obtained by taking at most one element (i.e., one or none) of each Group A, Group B, and Group C, and then combining these elements. For example, we can combine {623} from A, take nothing from B, and {617, 603} from C to get {623, 617, 603} as a neighborhood subtree. Conversely, any such choice (except taking nothing from each of A, B and C) produces a neighborhood subtree.

Let A equal the number of elements in Group A, B equal the number of elements in Group B and C equal the number of elements in Group C. Then, the number of neighborhood subtrees from pin 125's neighborhood equals the following: $(A+1)(B+1)(C+1)-1$. The +1's in this equation account for the fact that nothing can be taken from a particular group in forming a neighborhood subtree and the −1 accounts for the fact that taking nothing from each of A, B and C is not a choice. Therefore, since in our example A equals 2, B equals 1 and C equals 4, we have 29 neighborhood subtrees from pin 125's neighborhood. It should also be noted that there will be duplicate subtrees as a result of this process.

We then check each of these 29 neighborhood subtrees to determine if it has a pin which does not belong to the subtree within its bounding box. If so, the subtree is eliminated from consideration.

We repeat this process for all pin neighborhoods. The resulting subtrees for all the pins in the spanning tree are "basis elements".

G. Fifth Operational Step: Construct Connected Covering.

Figure 12:
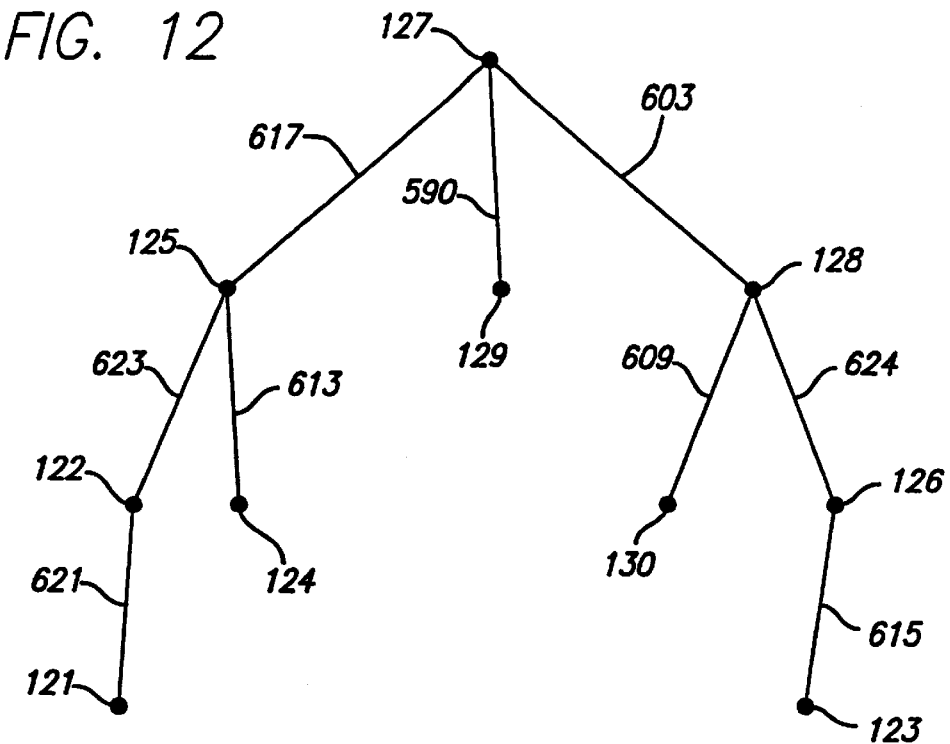
FIG. 12 shows the spanning tree directed away from a root pin.

The next major operational step is to construct a connected covering for the net. We consider one pin a root, and orient all edges to point away from it. FIG. 12 shows our 10-pin spanning tree with pin 127 as the root, such that all edges are oriented away from pin 127. At this point, we remove duplicates of basic elements such that each basic element retained is unique. In other words, for example, if there are three basic elements which are identical, we remove two of them and retain only one.

Figure 13:
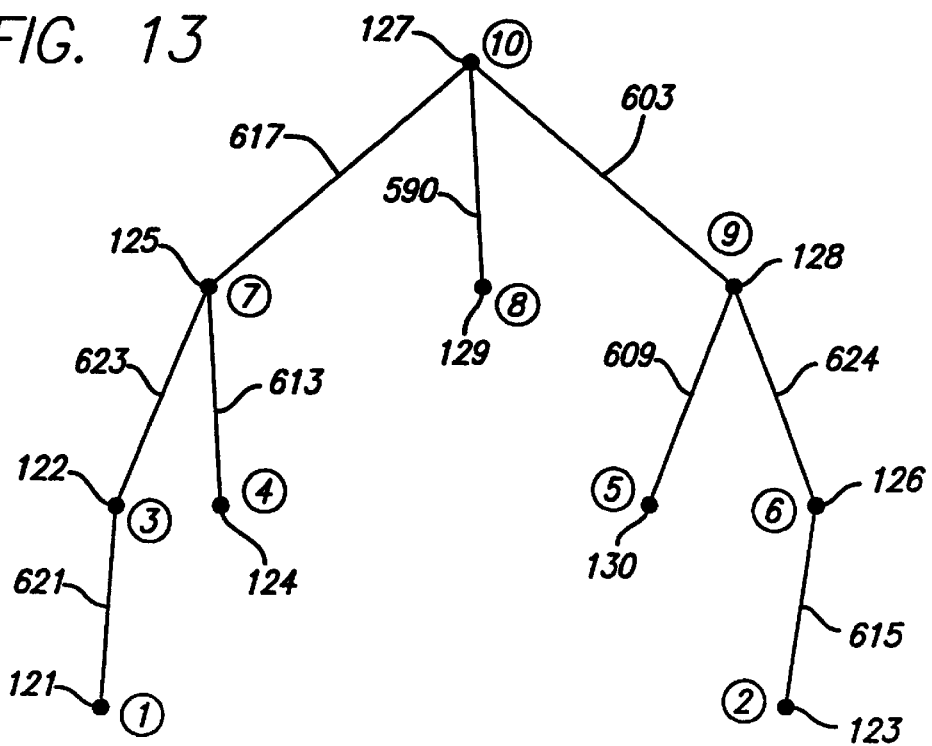
FIG. 13 shows the spanning tree directed away from the root pin, wherein the pins are numbered.

For a given pin, its descendants are all pins that can be obtained by going from it along the edges in the direction specified by the edge orientation. For example, all pins other than the root itself are the root's descendants. With respect to FIG. 13, for example, pin 121 is the descendent of pin 122 and is the descendent of pin 125. Pin 125, for example, is the descendent of pin 127. Next we numerate the pins so that each pin has a number higher than any of its descendants. This is shown in FIG. 13. In FIG. 13, each pin has been assigned the a number (which is circled). Pin 121 is assigned the number 1, pin 123 is assigned the number 2, pin 122 is assigned the number 3, and so on until we reach the root pin, pin 127, which has been assigned number 10.

We define the complexity of a basis element as the half-perimeter of its bounding box. We calculate the complexity for each basis element.

Next, we calculate the complexity of other subtrees. Each subtree has a top pin, i.e., the pin in the subtree with the highest assigned number. For example, the top pin of the subtree consisting of edges 621, 623 and 613 is pin 125, which has been assigned the number 7.

We go through all pins in the numeration order and calculate the complexity of each subtree having this pin as its top pin. This is done by induction on the pin number and the number of edges coming out of the top pin and belonging in the subtree. Namely, for a given subtree s generated by n edges coming out of the pin numbered p, we consider all basis elements having p as their top pin and that are contained in s. For one such basis element b, we already have calculated the complexity of each piece of s–b, because each such piece either has its top pin with a number less then p, or its top pin is also p, but it has less than n edges inside. So, we add the complexities of all the pieces and the complexity of b (which is the half-perimeter of its bounding box). Of all basis elements, we choose the one that produces the smallest complexity and we remember both the complexity calculated and the identity of that basis element.

To produce the covering, we start with the root. We choose and put on a list the basis element b remembered for the root and the subtree that is spanned by all edges coming out of the root. Then, for each pin in b, we add to the list the basis element remembered for that pin and spanned by the edges not in b, etc. The resulting list is the required covering.

Since every subnet in the covering is a basis element, their size is controlled by the parameter D from the step of creating pin neighborhoods. Minimizing the complexity minimizes the sum of the half-perimeters of the subnets.

The netlist is then adjusted to reflect the breakdown of the net into the subnets such that each subnet is treated as a net in the netlist. The subnets can now be processed in parallel.

III. Method and Apparatus for Memory-Saving Parallel Steiner Tree Routing.

One of the major reasons for net partitioning is to parallelize routing algorithms (such as the Steiner Tree routing algorithms) for high fanout nets. Due to the nonlinear complexity of Steiner Tree routing algorithms, it is very expensive to apply them directly on a high fanout net. Applying the same algorithms on a number of much smaller subnets is considerably less expensive computationally.

The partitioning method described in Section II above ("Method and Apparatus for Parallel Steiner Tree Routing") partitions high fanout nets into smaller subnets so that each subnet can be routed separately and in parallel. However, the first and second operational steps of the Parallel Steiner Tree Routing method described in Section II above (i.e., the operational steps of determining elementary pairs of pins and creating a planer graph) may require more computer memory than is available in the particular routing apparatus used. The Memory-Saving Parallel Steiner Tree Routing method described in this Section III offers a much more memory efficient replacement for determining elementary pairs of pins. Preferably, the memory-saving method described in this Section III is utilized for very high fanout nets (e.g., 500 pins or more) and the method described in Section II above is utilized with respect to smaller high fanout nets (e.g. 5, 6, 7, 8, 9, or 10 to 499 pin nets). See FIG. 2, element 3.

Partitioning a netlist by using the memory-saving method can be easily parallelized by splitting nets with very high fanouts among processors. Steiner tree routing algorithms can then be applied, again in parallel, to the newly obtained larger netlist that contains no high fanout nets.

As with the Parallel Steiner Tree Routing method described above in Section II, the Memory-Saving Parallel Steiner Tree Routing method starts with passing horizontal and vertical lines though each pin in the particular net to be processed. This results in a division of the plane into a coarse set of rectangles. The ordinal number of the horizontal line passing though a pin is its relative y-coordinate and the ordinal number of the vertical line passing through it is its relative x-coordinate. This is accomplished in the same manner as is discussed above in Section II with respect to drawings 5 to 7A.

For each pin in the net a "combined coordinate" is then calculated. A combined coordinate is calculated by the following steps:

a. Write the relative coordinates of the pin (x and y) as binary numbers.

b. Write a binary combined coordinate for the pin (z) by alternatively taking digits from the binary x and the binary y.

For example, suppose a pin has a relative x-coordinate of 5 and a relative y-coordinate of 3. The relative coordinates written as binary would be 101 for the x-coordinate and 011 for the y-coordinate. The combined coordinate z would be 100111. Note that the binary x-coordinate can be obtained from the combined coordinate by writing every other digit of z starting from the first one. The y-coordinate can be derived by writing every other digit of z starting from the second one.

Figure 14:
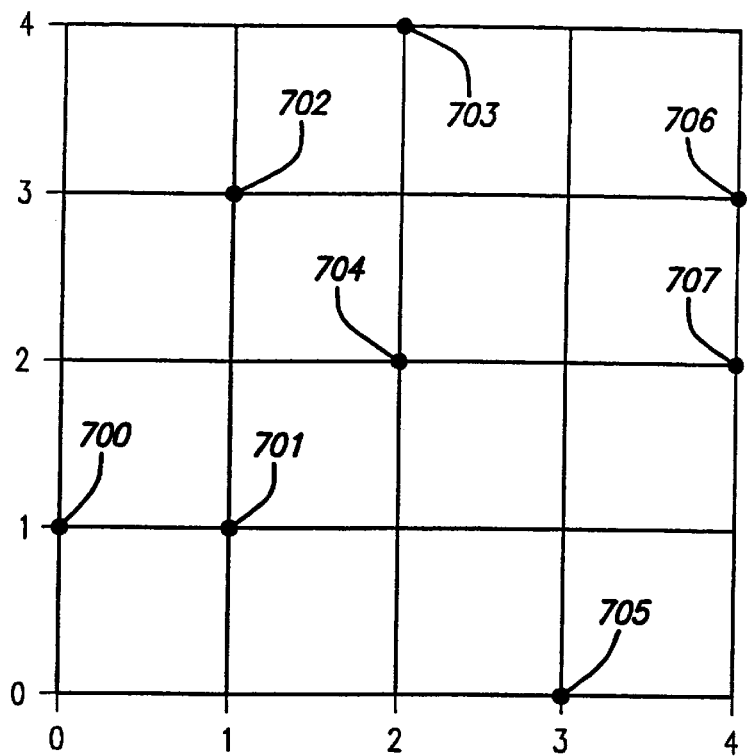
FIG. 14 shows a net wherein each pin has been assigned relative coordinates.

FIG. 14 provides an example. In FIG. 14, the pins of an eight-pin net (700–707) have been assigned relative coordinates. Of course, the nets treated by the method described in this Section III will generally be much larger than eight pins, but the particular net discussed here is only for purposes of example. Table 14 below sets forth for each pin in the net the pin number ("Pin"), the x-coordinate ("$X_{base\ 10}$"), the y-coordinate ("$Y_{base\ 10}$"), the x-coordinate expressed in binary ("$X_{base2}$"), the y-coordinate expressed in binary ("$Y_{base2}$"), and the combined coordinate ("$Z_{base2}$").

TABLE 14

| Pin | $X_{base\ 10}$ | $Y_{base\ 10}$ | $X_{base\ 2}$ | $Y_{base\ 2}$ | $Z_{base\ 2}$ |
| --- | --- | --- | --- | --- | --- |
| 700 | 0 | 1 | 000 | 001 | 000001 |
| 701 | 1 | 1 | 001 | 001 | 000011 |
| 702 | 1 | 3 | 001 | 011 | 000111 |
| 703 | 2 | 4 | 010 | 100 | 011000 |
| 704 | 2 | 2 | 010 | 010 | 001100 |
| 705 | 3 | 0 | 011 | 000 | 001010 |
| 706 | 4 | 3 | 100 | 011 | 100101 |
| 707 | 4 | 2 | 100 | 010 | 100100 |

After the combined coordinates are calculated, the pins of the net are sorted in ascending order. For each two pins appearing consecutively on the sorted list, a "level of equality" is calculated. The "level of equality" for a pair of pins is the ordinal number of the digit after which the two combined coordinates coincide, viewed from right to left. For example, if the first combined coordinate on the list is 8 (binary 1000) and the second combined coordinate on the list is 9 (binary 1001), the two combined coordinates coincide from the second digit on, viewed right to left. Therefore, the level of equality between the two pins is two.

In Table 15A below, the pins of the eight-pin net from FIG. 14 have been sorted. Also listed is the combined coordinate of each pin in the exemplary net. In addition, the level of equality between consecutive pins on the sorted list is also shown.

TABLE 15A

| Pin | $Z_2$ | Level of Equality Between Pin and Next Pin |
|---|---|---|
| 700 | 000001 | 3 |
| 701 | 000011 | 4 |
| 702 | 000111 | 5 |
| 705 | 001010 | 4 |
| 704 | 001100 | 6 |
| 703 | 011000 | 7 |
| 707 | 100100 | 2 |
| 706 | 100101 | N/A |

Figure 15A:
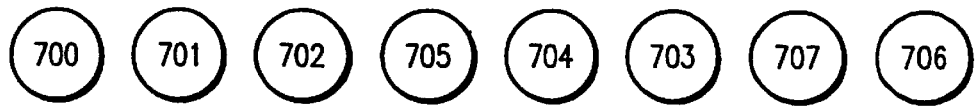
FIGS. 15A–15B shows a hierarchy tree.

The next step in the process is to create a "hierarchy tree." To create the hierarchy tree we first add all the pins as vertices to the hierarchy tree. Their level is 0 and they have no descendants. This is shown in FIG. 15A.

To create the next level of hierarchy, the process proceeds through the list and compares the level of equality of a current pin and the next pin against the level of equality of its neighbors to determine whether the current pin's level of equality with the following pin is smaller than the level of equality of its direct neighbors (both up and down). If this is not satisfied, the process moves on to the next pin. Otherwise, the process makes a new tree vertex. The new vertex's level is the level of equality of the pair consisting of the current pin and the one after it. The two pins are also the descendants of the new vertex. For the vertex's combined coordinate, the current pin's combined coordinate is used. The current pin and the one after it are removed from the list, the new vertex is inserted in these places, and the levels of equality are recalculated.

For example, in the eight-pin net discussed above, the level of equality of pins 700 and 701 are compared to the level of equality of pins 701 and 702. Note that because pin 700 is at the top of the sorted list, there is no direct neighbor above to be considered. If, for example, there was a pin 699 directly above pin 700 on the list, the level of equality between pins 700 and 701 would also be compared to the level of equality between pins 699 and 700. Since the level of equality of pins 700 and 701 is less than the level of equality of pins 701 and 702, we create a new vertex 710 with pins 700 and 701. We also recalculate the level of equality between the new vertex 710 and 702. This is reflected in Table 15B below.

TABLE 15B

| Pin | $Z_2$ | Level of Equality Between Pin and Next Pin |
|---|---|---|
| 710 | 000001 | 4 |
| 702 | 000111 | 5 |
| 705 | 001010 | 4 |
| 704 | 001100 | 6 |
| 703 | 011000 | 7 |
| 707 | 100100 | 2 |
| 706 | 100101 | N/A |

Figure 15B:
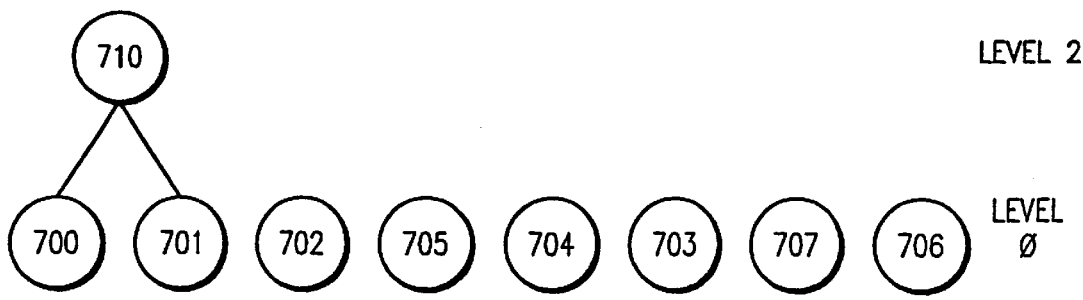

The resulting hierarchy tree is depicted by FIG. 15. Pin 710 is at the second level because the level of equality of its two direct descendants was 3. In other words, the level of a pin on the hierarchy tree is equal to the level of equality between its direct descendants less 1. This process continues with the level of equality of pins 710 and 702 being compared to the level of equality of pins 702 and 705, and so on until only one pin (vertex) remains. This last vertex is the root of the hierarchy tree.

Figure 16A:
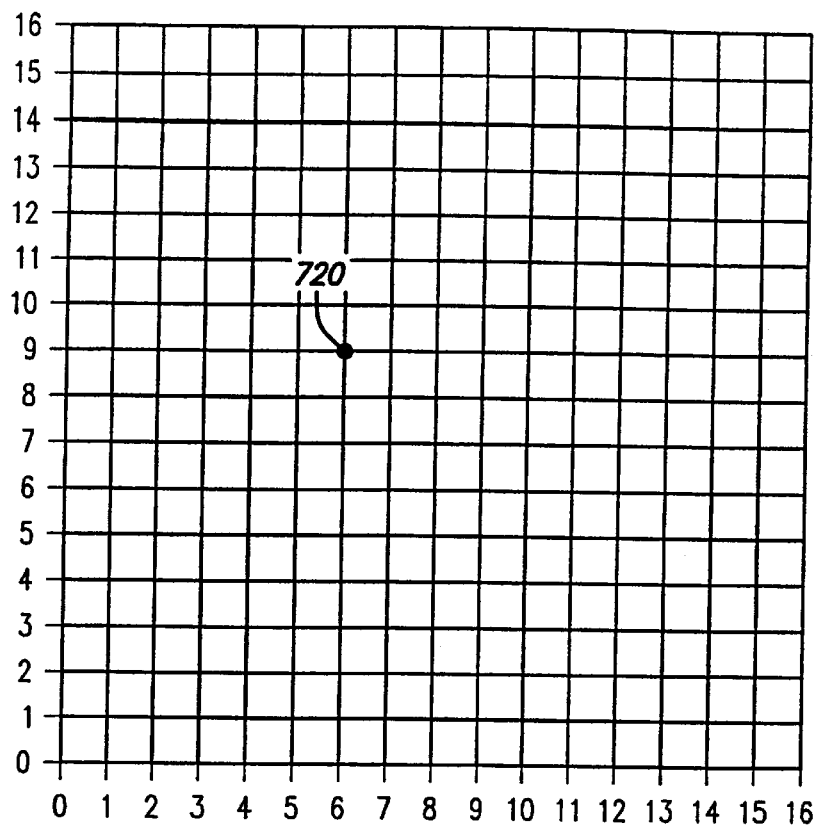
FIGS. 16A–16B shows the placement of the root vertex on a grid.
Figure 16B:
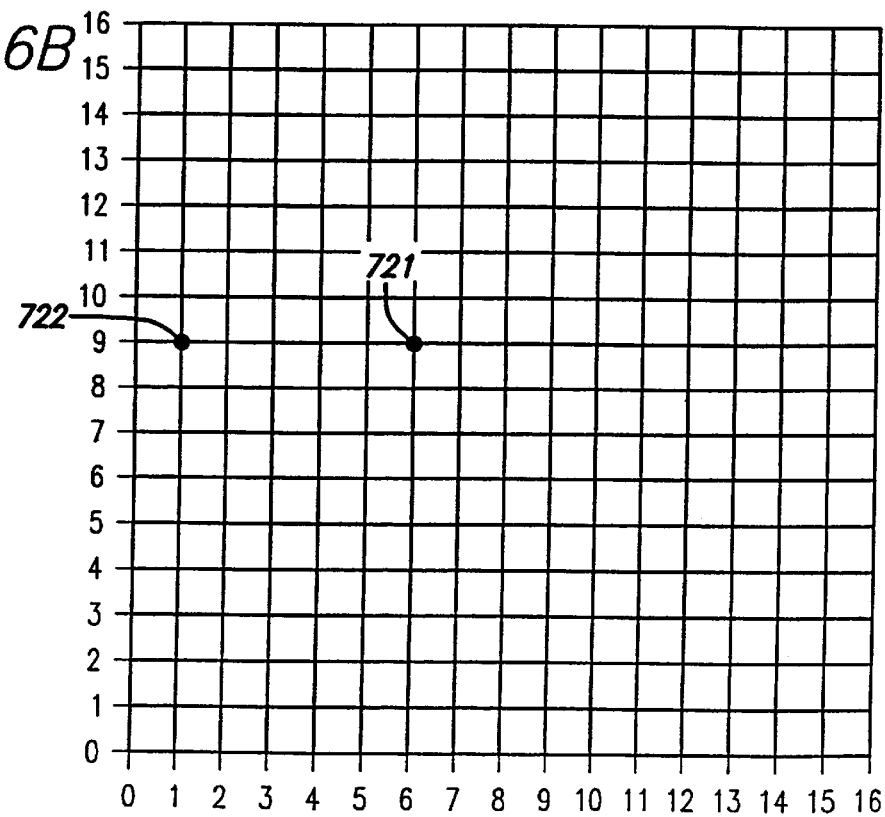

Once the hierarchy tree is completed, we expand from the root of the tree, similar to the expansion shown in FIGS. 8A to 8H. For example, suppose we have a hierarchy tree with a root vertex 720 at level eight, said root vertex having a combined coordinate of 01101001. FIG. 16A shows the placement of the root vertex on a grid. Suppose that the root vertex 720 expands at level seven to two pins, pin 721 with a combined coordinate of 01101001 and pin 722 with a combined coordinate of 01000011. FIG. 16B shows this expansion step. At this step, pins 721 and 722 form an elementary pair of pins. This expansion process continues until level zero is reached and we have set out the original net. During the expansion process, we note elementary and quasi-elementary pairs of pins as we did with respect to FIGS. 8A to 8H above. However, during the expansion process, we eliminate elementary and quasi-elementary pairs at each expansion step in accordance with the following rules:

First, if an edge joins two pins such that both coordinates of the pins differ by less than 2, we do not remove the edge in spite of the other rules discussed directly below.

Second, if more than 3 pins lie on a horizontal or a vertical edge, we remove it. Note that such an edge will necessarily be longer than 2 and the first rule will not apply here.

Third, if for all possible combinations of descendants, the two edges intersect, and one is always larger that the other, we remove the larger one. This rule is exemplified by FIG. 17. In FIG. 17, four pins are shown, 730, 731, 732 and 733. Pins 730 and 731 are connected by an edge 735 and pins 732 and 733 are connected by a second edge 736, which is shorter than edge 735. Before eliminating edge 735, we check the descendants of each of the four pins. Shown on FIG. 17 are dashed boxes 737, 738, 739 and 740 around pins 732, 733, 731 and 730, respectively. Each of these boxes is the bounding box of the descendants of its respective pin.

If an edge between a descendant of pin 733 and a descendant of pin 737 will always be shorter than an edge between a descendant of pin 740 and a descendant of pin 739, we eliminate edge 735. If this is not always the case, we randomly choose a certain number of descendent combinations (typically 64), among them we find the shortest length combination, and use its properties to decide which edge, if any, to remove. Edges that do not have a vertex in common do not participate in the third rule procedure.

In order to identify candidates for removal in accordance with the third rule, we consider lines passing through rectangles at the current hierarchy level. For each elementary pair we draw a line connecting the two pins, obtaining a graph. For each rectangle we make a list of lines passing through it. Then for each rectangle having more than one line passing through it, we check for intersections. This method is considerably faster than checking each pair of lines for intersections.

It may be beneficial to apply the above rules only under certain circumstances and not at all stages of the process. For example, if the Manhattan distance (rectilinear distance) between two pins in an edge is d, the edge intersects at most d+1 rectangles. We can start removing intersections at the previous level where the sum of the Manhattan distances for all the edges of the net is greater than 5 times the total number of edges for the net. For example, if we are in level 7 and this condition is met, we can return to level 8 and remove intersections. This way, the number of edges will not go over 30 times the number of pins, so the amount of memory required is more manageable.

When this process is completed, we have a planer graph. We then treat this planer graph utilizing the third, fourth and fifth operational steps described in Section II.

IV. Method and Apparatus for Course Global Routing.

The purpose of the Course Global Routing method described in this Section IV is to permit global routing of the given netlist in parallel with the best quality possible. This method takes congestion into consideration and endeavors to route nets in such a way that they do not pass through congested areas, if possible.

The result of this routing for each net will be a list of edges on a routing graph through which the net passes. This information will be later used by the hierarchical and detailed routers, which are described further below in other sections.

At this point in the routing process, it can be assumed that there are no large nets in the netlist since the high fanout nets have been partitioned according to the methods described above in Sections II and III.

A. Initialization Step: Input of Netlist and Parameters.

Figure 18:
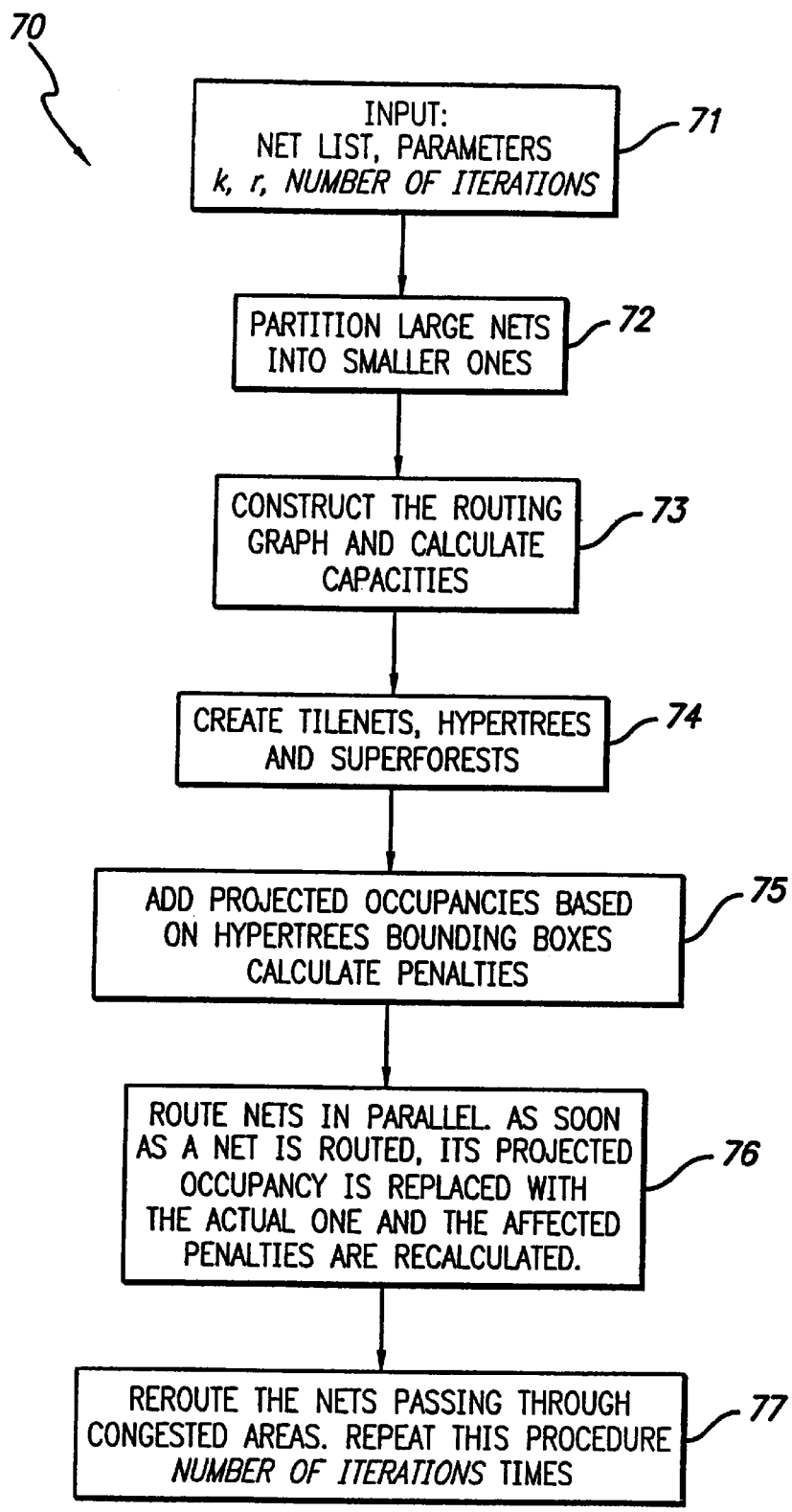
FIG. 18 is a flowchart that describes the Course Global Routing Process.

FIG. 18 is a flowchart 70 which depicts the steps in the Course Global Routing process. As a first initial step 71, we input a netlist and define certain parameters, including the parameters k, r and number of iterations. Initially, we fix a parameter k, generally at 4. The parameter r is typically set at ⅓. The parameter number of iterations is typically set at 3 or 4.

B. First Operational Step: Partition Large Nets Into Smaller Ones.

The first operational step 72 in the Course Global Routing process is to partition large nets into smaller ones. In the preferred embodiment described herein, this step has already been performed as described in Section II and Section III above. See FIG. 2, element 3.

C. Second Operational Step: Construct the Routing Graph and Calculate Capacities.

As a second operational step 73, a routing graph is constructed and capacities of edges are calculated. As discussed above, the IC design is initially divided into rectangular sections using horizontal and vertical lines. We term each of these rectangular sections a "tile." Horizontal lines are $2^k$ grids apart. Each vertical line passes through the middle of a column or the middle of a channel. Every design is divided into vertical columns, where the cells containing transistors are located, and vertical channels, which are basically spaces between columns reserved for wiring. Designs are typically divided by grid lines, which are roughly sized so as to permit wires to pass through consecutive grids. Each of these tiles we consider a vertex in a routing graph. The edges in the routing graph join each tile with its left, right, top and bottom neighbor. In this way we obtain a mesh-like graph.

FIG. 19 is an example of such a routing graph. Shown in FIG. 19 is the surface of an IC 80 divided by vertical lines (81 and 82) and horizontal lines 83. The vertical lines 81 are positioned through the middle of columns and the vertical lines 82 are positioned through the middle of channels. The vertical and horizontal divide the surface into rectangular tiles. In each tile, a point 84 is placed in the center of the tile. The point represents the tile in the routing graph. Each point is connected in the routing graph to its neighboring points to the right, left, above and below by connecting lines 85 (these lines are depicted in FIG. 19 as dashed lines). The actual routing graph consists of points 84 and the lines 85 connecting them. The columns (86, 87 and 88) are represented by the solid areas and the channels (89 and 90) are represented by the open spaces.

For each edge (i.e. the line connecting two adjacent points on the routing graph) we calculate a capacity. There are many ways in which to calculate the capacity of an edge, however, the capacity of an edge will generally be the capacity of the edge without blockages less any blockages. Where there is going to be more than one routing layer (which is generally the case) the capacity of each edge is calculated on that basis. Preferably, we calculate capacities of edges as follows:

for each vertical edge, the capacity is the width of the corresponding halfchannel expressed in grids.

for each horizontal edge going through the middle of the channel the capacity is the height of the corresponding tile expressed in grids.

for each horizontal edge going through the middle of a column, the capacity is the height of the corresponding tile expressed in grids minus the number of active pins (a pin generally takes the space of about one grid) and minus the number of grids covered by the routing blocks.

D. Third Operational Step: Creating Tilenets, Hypertrees and Superforests.

As the third operation step 74, we create tilenets, hypertrees and superforests. A tilenet is the representation of a net on the tiles, i.e. a collection of vertices of the routing graph. A typical pin lies in the middle of the cell inside one of the columns, right on the line dividing two neighboring tiles. Such a pin will be represented in the tilenet by both of these tiles. Occasionally, a pin will be blocked from one side and then we consider only the tile on the other side. Note that we can have more than one pin represented by one pair of tiles. We remove the duplicates from the list of tiles obtained above and the resulting list of tiles is our tilenet.

A vertex of the superforest is a collection of the vertices of the routing graph. An edge of the superforest is a pair of vertices. To make our superforest, we add a vertex for any set of tiles (generally two) representing the same pin. Note that these tiles do not need to be connected among themselves (as they all represent one pin) but only to other tiles.

In the beginning the superforest has no edges, they will be created in the routing process. Each time an edge is created, we create a set of all least-penalty paths from one vertex of the edge to another. This set is called the envelope of the edge.

We then create a net for which we will make a hypertree. For each vertex of the superforest we add a pin to our net. This pin will be located at the center of gravity of the tile of which the superforest vertex consists. Now we create the hypertree for this net using the process described below in Section V ("Method and Apparatus for Construction of a Spanning Hypertree").

E. Fourth Operational Step: Calculating Occupancy and Penalty.

As the next operational step 75, we add projected occupancies based on hypertrees' bounding boxes and calculate penalties for routing in particular paths. For each edge of the routing graph we calculate occupancy as follows. We start with an occupancy equal to 0. For each net that has not yet been routed, we calculate the probability of passing through this edge by using the bounding box of the corresponding hypertree. For example, if there are four parallel edges within the bounding box of the corresponding hypertree, such that the net must pass through one of the edges, the probability of passing through one of the four edges is 0.25. This is the net's projected occupancy, and we add it to the edge's occupancy.

As nets are routed, we replace the projected occupancies with the actual ones, i.e., if the net passes through this edge, we add 1 to its occupancy and subtract the projected occupancy relative to the particular net. For example, if the projected occupancy relative to a particular net was 0.25, we add 1 and subtract 0.25. The occupancies are also adjusted accordingly for other edges which are eliminated as a path for the net by virtue of the assignment.

The penalty for passing through an edge will be a function of the quotient occupancy/capacity and of the length of the edge, for example we can use $$5 \cdot \frac{\text{occupancy}}{\text{capacity}} \cdot \text{length} + \text{length}$$

This penalty function can vary although it is preferred that the penalty increase as a function of occupancy/capacity and that the penalty further increase as a function of length. For example, we could also calculate the penalty as follows:

$$\text{length} \cdot e^{\frac{\text{occupancy}}{\text{capacity}}} + \text{length}$$

Penalties are also adjusted to reflect the occupancy changes as nets are routed.

F. Fifth Operational Step: Routing in Parallel.

As the fifth operational step in the Course Global Routing process, we now route in parallel. Steiner trees must be constructed for connecting sets of tiles on the routing graph. For two sets of tiles, we grow neighborhoods for each set of tiles until they intersect, marking the total penalty to get to each point in the neighborhood. Then, going backward, we choose the least-penalty path from one set to another.

For three sets of tiles, we grow neighborhoods until they reach a point in another set. If there is a point in the intersection of all neighborhoods, we find the sum of the penalties to all three sets from that point. In other words, we find a point P for which that sum is minimal. We also make a minimal spanning tree (There are only three choices for the tree.). The edges of this tree are made as above in case there are two sets. If the sum of the penalties of the tree edges is less than the sum of penalties from P to the 3 sets, then the tree is the Steiner tree; otherwise it is the union of paths connecting P with the 3 sets. These paths are also obtained using neighborhoods.

For four sets of tiles, we first consider the case where we have points rather then sets. We restrict ourselves to the situation where none of the points is inside the bounding box of the other three points. Then we have left, right, top and bottom points, that we shall call $V_1$, $V_p$ $V_t$ and $V_b$, respectively. By $hp(V_1, V_2)$ we shall denote the half-perimeter of the bounding box of the points $V_1$ and $V_2$. Assume that $hp(V_1, V_t)+hp(V_p V_b)<hp(V_1, V_b)+hp(V_p V_t)$. (The other case is treated similarly.) Then A and B are going to be the Steiner points. $V_1$ and $V_t$ need to be joined with A, $V_1$ and $V_t$ with B, and also A and B need to be joined with each other.

For joining 4 sets we first consider the 4 centers of gravity of these sets. For them we find Steiner points and decide which points will be joined as above. Then we join the corresponding sets using the above method for joining two sets.

For the routing of a net, the hyperedges of the hypertree belonging to the net are sorted in ascending order according to the half-perimeter of their bounding boxes. For each hyperedge we associate a routing rectangle which is a bounding box of the hyperedge expanded in all four directions by r times hp, where hp is the half-perimeter, and r is a parameter, typically $\frac{1}{3}$. If the original bounding box intersects blocks or megacells, we expand this rectangle until it contains them.

We start connecting the vertices of the superforest using the hypertree as a guide. This is done as follows. We start with the first hyperedge. For every vertex of the hyperedge inside the routing rectangle of this hyperedge we consider the corresponding superforest vertex (which is a set of tiles). We join these sets by a Steiner tree using the set connection method described above (note that the hyperedge has at most four vertices, so there will be at most four sets to be joined.) Then we consider the next hyperedge. For every vertex of the hyperedge inside the routing rectangle of this hyperedge we consider the corresponding superforest vertex. We find the intersection of the connected component of these vertices with the routing rectangle. We then find the intersection of the envelopes of all edges of the superforest belonging to the components and passing through the routing rectangle. They form the sets that need to be connected by a Steiner tree. For this we use the set connection methods described above. We repeat this process until we run out of hyperedges. Notice that after each step the connected components of the superforest correspond exactly to connected components of the part of the hypertree generated by the used hyperedges. Then, when we have addressed all of the hyperedges, the superforest will be connected since the hypertree is connected. From each of the envelopes we choose one of the least-penalty paths, and that creates our routing.

Since we are updating the occupancies and the penalties of each edge of the routing graph that the net passes through, we need to make sure that while working in parallel we never need to adjust the same edge at the same time. The easiest way to do that is to make sure that the nets worked on simultaneously are not in the same area. In order to assure that we do as follows.

For each net we calculate the two quotients: The length of net's bounding box divided by the length of the design, and the width of the net's bounding box divided by the width of the design. The larger of the two we term the net's characteristic. This roughly suggests how large a part of design needs to be in order to contain the net's bounding box. We order the nets in descending order according to this characteristic. The nets with the characteristic larger than $\frac{1}{4}$ we route sequentially. There will not be many such nets. Then we split the design into four parts, give different processors different parts and instruct them to route only the nets that are completely contained in the corresponding parts and have a characteristic that is larger than $\frac{1}{8}$. Then we shift the parts to the right by a quarter of the design's length and follow the same operation. We then shift the parts from their original positions down by a quarter and repeat the routing procedure. Then we shift the parts from their original positions both down and to the right by a quarter and repeat the routing procedure. This way all nets with characteristics larger than $\frac{1}{8}$ will be routed.

Next we split the design into twice smaller parts, consider the nets of characteristic larger than $\frac{1}{16}$ and repeat the shifting process, moving the parts $\frac{1}{8}$ instead of $\frac{1}{4}$. Note that now we can include more processors to speed up the routing process. We repeat this process a few times using smaller and smaller parts, and once we keep all the processors busy, we route all the remaining nets.

We can then reroute nets passing through congested areas 77. For this, we preferably utilize the procedure discussed in Section VII below.

V. Method and Apparatus for Construction of a Spanning Hypertree.

Making a Steiner tree for a given net, especially if congestion is taken into account, can be computationally very expensive for nets larger then 4 pins. Therefore, we split such a net into smaller subnets and use the subnets to guide the routing of the net.

A collection of pins is a "hyperedge." A connected covering of the net with hyperedges is called a spanning hypertree if it contains no cycles. By having no cycles we mean that the spanning hypertree forms a tree and that there are no closed loops within the tree.

Figure 20:
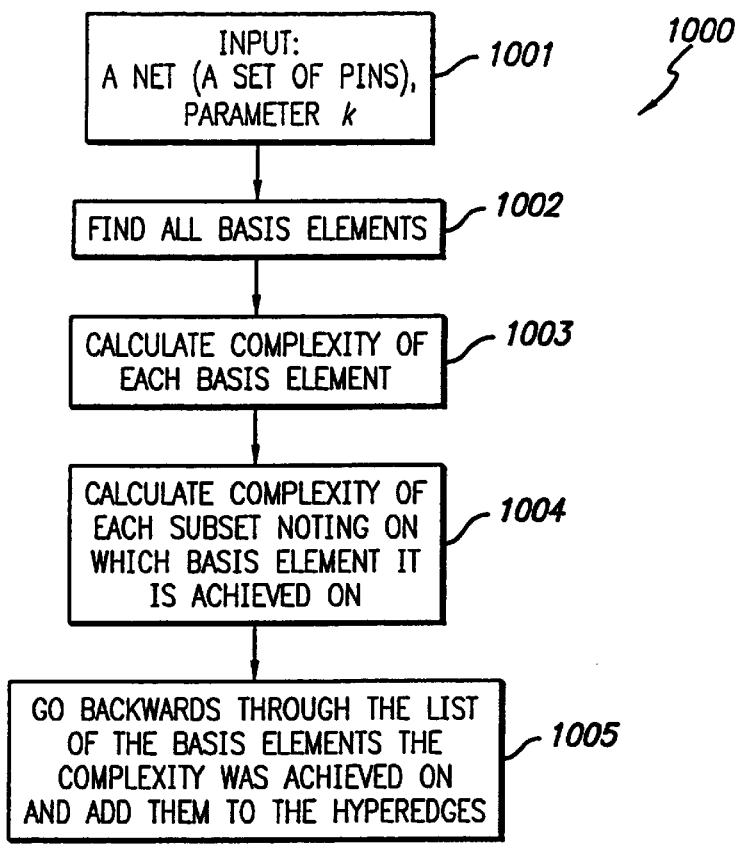
FIG. 20 is a flowchart which depicts the steps in the Construction of a Spanning Hypertree process.

The purpose of the Construction of a Spanning Hypertree process described in this Section V is to create a spanning hypertree for a given net. FIG. 20 is a flowchart 1000 which depicts the operational steps of the Construction of a Spanning Hypertree process.

A. Initilizing Step: Inputting Net and Hyperedge Size Parameter K.

As a first initializing step 1001, we input the net to be processed and fix a parameter K from 2 to 4. The spanning hypertree needs to satisfy the following conditions:

a. Each hyperedge must have a size (number of pins) less than or equal to K and greater than 1.

b. The bounding box of each hyperedge must contain no pins from the net that are not in the hyperedge.

c. For hyperedges containing more than two pins, no pin in the hyperedge can be contained in the bounding box of the other pins of the hyperedge.

d. The sum of the minimal lengths of Steiner trees of the hyperedge must be as small as possible.

Condition "a" insures that the hyperedges will be sufficiently small. Conditions "b" and "c" insure that the pins not in the hyperedge will not interfere with the creation of the Steiner tree routing for each hyperedge. Condition "d" implies that the obtained routing will have minimal wire length possible.

At this point, we can assume that the net has no more than 15 vertices, which will be guaranteed because the netlist will have already been processed by the Parallel Steiner Tree Routing method (described in Section II above) and the Memory-Saving Parallel Steiner Tree Routing method (described in Section III above).

B. First Operational Step: Find All Basis Elements.

As the first operational step 1002, we make a list of all potential hyperedges, which we shall call basis elements. These are all subsets satisfying conditions "a", "b" and "c" above. As our net has at most 15 vertices, this can be done by checking all possible subsets of size up to K.

C. Second Operational Step: Calculate Complexity of Each Basis Element.

Figure 21A:
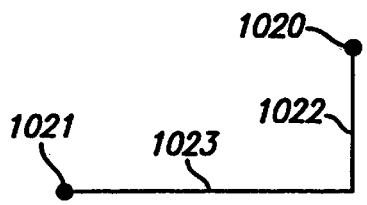
FIG. 21A depicts a two-pin basis element.
Figure 21B:
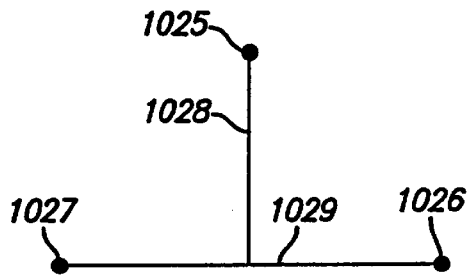
FIG. 21B depicts a three-pin basis element.

As the next operational step 1003, we calculate the complexity of each basis element. To do this, for each basis element we save the length of its minimal Steiner tree. For 2- and 3-pin basis elements, it is the half-perimeter of the basis element's bounding box. FIG. 21A shows a two-pin basis element with pins 1020 and 1021. The complexity of that basis element is the sum of the lengths of the legs 1022 and 1023. FIG. 21B depicts a basis element with three pins, pins 1025, 1026 and 1027. The complexity of that basis element is the sum of the lengths of the legs 1029 (from pin 1027 to pin 1026) and 1028.

Figure 21C:
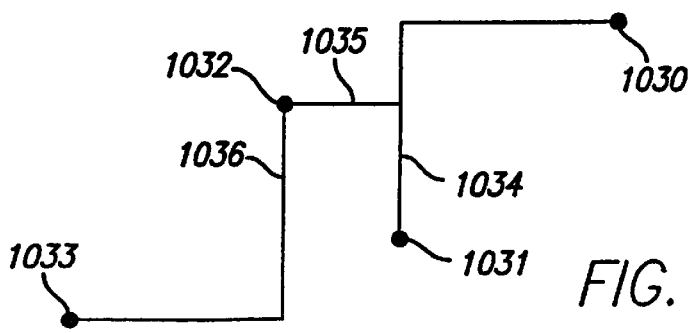
FIG. 21C depicts a four-pin basis element.

For four-pin basic elements we construct a quick Steiner tree to find the length. FIG. 21C shows a four-pin basic element, comprising pins 1030, 1031, 1032 and 1033. The complexity of the four-pin basic element is the sum of the total length of L-shaped leg 1034, the total length of L-shaped leg 1036 and the length of leg 1035.

D. Third Operational Step: Calculate the Complexity of Each Subset Noting The Basis Element On Which It Is Achieved.

As the third operational step 1004, we calculate the length of the minimal spanning hypertree for each subset of our net having size greater than 1. We shall call that length the "complexity" of the subset. We calculate this complexity by induction on the number of pins of the subset. In other words, we first calculate the complexity of small subnets and work our way up to larger subnets. In this way, we already have the complexities of the small subnets calculated and when calculating the complexities of larger subnets the complexities of the small subnets can be plugged in where appropriate.

Where a subnet has two pins, if it is a basis element, the complexity is already calculated; otherwise we set its complexity to infinity.

Suppose that we have already calculated the complexity of all subsets having less than n pins, and that A is a subset having n pins. If A does not contain any basis elements, we set its complexity to infinity. If A is a basis element, we have the complexity calculated already. In the remaining case, we take a basis element B contained in A and a point x in B. The potential complexity of A is the sum of complexities of B and of A–B U {x}. Since A–B U {x} has less than n pins, we have already calculated its complexity. We vary all basis elements B in A, as well as for each B we vary all possible x. Then we take the minimal potential complexity of all these variations as the complexity of A, and we save on which B and which x it occurs.

E. Fourth Operational Step: Go Backwards Through The List Of The Basis Elements On Which The Complexity Was Achieved.

As the next operational step 1005, we go backwards in order to obtain the required hyperedges. Starting with the complete net N, we add the basis element B that its complexity was achieved on to the list of hyperedges, and then we consider the set A=N–B U {x}, where x was the element saved for N. We repeat this procedure, each time adding a new basis element to our list of hyperedges and making our subset smaller until our subset becomes a basis element, at which stage we include it as well in the list of hyperedges and stop. The list so obtained will have the sum of the minimal lengths of Steiner trees of the hyperedges as small as possible.

VI. Method and Apparatus for Hierarchical Global Routing Descend.

The purpose of the Hierarchical Global Routing Descend process described in this Section VI is to create, in a parallel fashion, a hierarchy of finer and finer global routings of the given netlist with the best quality possible. This process takes congestion into consideration and tries to route nets in such a way that they do not pass through congested areas if possible.

As discussed above, the overall IC design is initially divided with horizontal and vertical lines. Vertical lines pass through the middle of columns and the middle of channels and they do not change. Horizontal lines are $2^k$ grid lines apart initially, where k is a parameter, usually 4. On each level of hierarchy, the distance between horizontal lines is halved and new horizontal lines are added. On the last level of the hierarchy, horizontal lines are 1 grid apart.

The nets are initially routed using the Course Global Routing process described in Section IV above. The Hierarchical Global Routing Descend process described in this Section VI comprises a method to obtain a routing on the next level of the hierarchy using the routing on the previous level.

Figure 22:
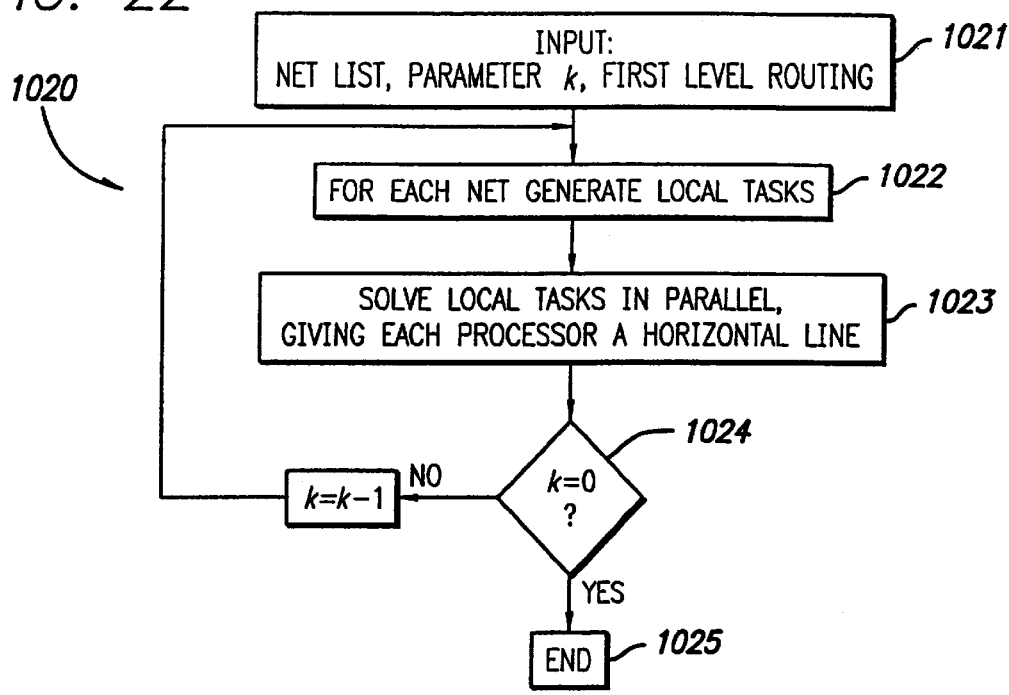
FIG. 22 is a flowchart that describes the steps of the Hierarchical Global Routing Descend process.

FIG. 22 sets forth a flowchart that describes the steps in the Hierarchical Global Routing Descend process. For purposes of the Hierarchical Global Routing Descend process, we use the notions of the routing graph and the tilenet from the Course Global Routing process described in Section IV. We can assume that the routing has been done on a certain level, and we want to use it for the routing on the next level.

A. Initializing Step: Input Netlist Parameter k and First Level Routing.

As the first initializing step 1021, the system accepts the netlist, the parameter k used previously in the Course Global Router and the first level routing (i.e., the routing achieved with the Course Global Router).

B. First Operational Step: Generate Local Tasks for Each Net.

Figure 23B:
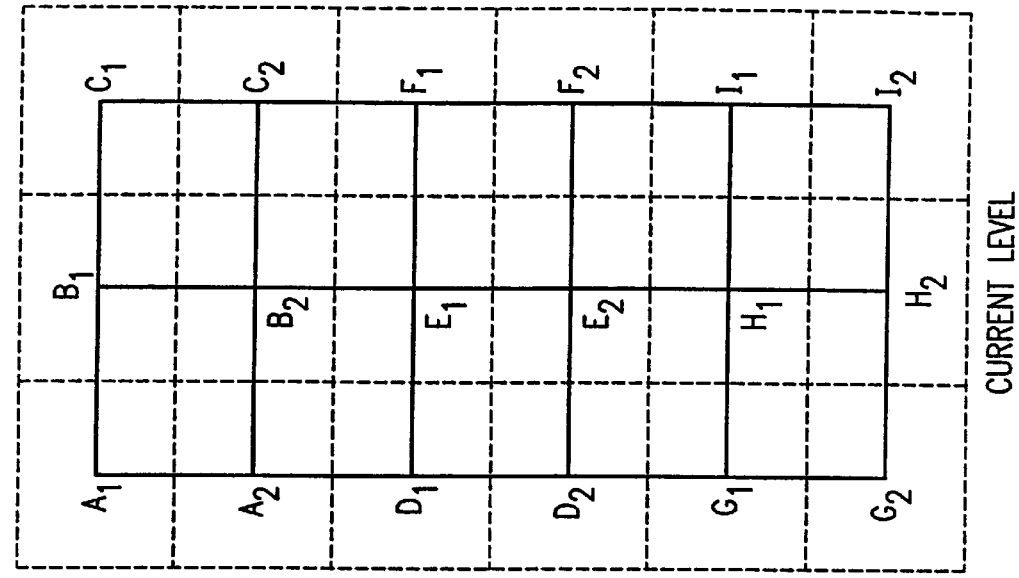
FIG. 23B is a routing graph for the current level.
Figure 23A:
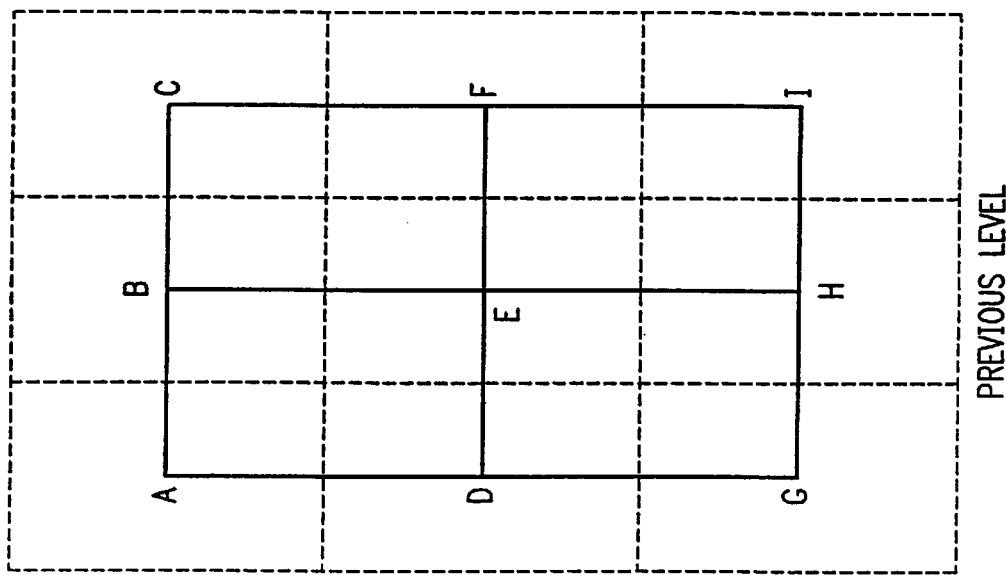
FIG. 23A is a routing graph for the previous level.

As the first operational step 1022, we generate local tasks for each net. Vertical edges from the previous level will correspond to vertical edges in the new routing graph. Horizontal lines from the previous level, however, are twice as far apart as are the horizontal lines on the current level. This is shown on FIG. 23A and FIG. 23B. FIG. 23A represents the routing graph for the previous level. The tiles are represented by dashed lines and the routing graph by solid lines. On the previous level, we have vertices A, B, C, D, E, F, G, H and I. On the current level, two vertices (denoted with subscripts 1 and 2) correspond to each of the previous level vertices. To a vertical edge, say the one connecting B and E, correspond a vertical edge connecting $B_2$ and $E_1$. Corresponding to a horizontal edge connecting D and E is a rectangle $E_1$, $E_1$, $E_2$, $E_2$.

Given a net, we consider its routing on the previous level. To each vertical line will correspond a vertical line on the new level. We combine horizontal edges of the net into connected fragments. For each of these fragments we have a local task, i.e., we need to route the piece of the net inside the rectangle corresponding to the fragment on the current level. This can be described as follows. We number the half-channels of the design from left to right, and the horizontal lines from the bottom to the top. Each vertex of the routing graph lies in one half-channel, and on one horizontal lines, so it can be completely described with a pair of numbers (i, j), where i is the half-channel's number and j is the horizontal line's number.

Corresponding to a vertex (i,j) from the previous level are two vertices on the current level, namely (i, 2j) and (i, 2j+1). An edge can be represented as a pair of vertices. The graph of a local task is a set of vertices (i, 0) and (i, 1) and a set of edges ((i−1, 0), (i, 0)), ((i−1, 1), (i, 1) and (i, 0), (i, 1)). Where i=0, we ignore edges containing i−1. A fragment will contain all the vertices (i, j) of the line where $i_1 \leq i \leq i_2$.

We create a local net that will correspond to the fragment. A vertex (i, k), $i_1 \leq i \leq i_2$, $k \in \{0, 1\}$ of this local task will be considered a pin of the local net if at least one of the following conditions applies:

a. There is a pin from our original net corresponding to this vertex.
  b. k=0 and the edge ((i, j), (i, j−1)) was in the net's routing on the previous level.
  c. k=1 and the edge ((i, j), (i, j+1)) was in the net's routing on the previous level. The local task consists of routing this local net inside the local task graph.

C. Second Operational Step: Solving the Local Task.

As a second operational step 1023, the local net is given by a sequence $\beta = (\beta_{i_1}, \beta_{i_1+1}, \ldots, \beta_{i_2})$, where $\beta_i \in \{0, 1, 2, 3\}$. The value of $\beta_i$ is given with the following Table 24A. A number "1" in the table means that the vertex is a pin in the local net; the number "0" means that it is not.

TABLE 24A

| (i,0) | (i,1) | $\beta_i$ |
|---|---|---|
| 0 | 0 | 0 |
| 1 | 0 | 1 |
| 0 | 1 | 2 |
| 1 | 1 | 3 |

Similarly, the routing is given by $\alpha = (\alpha_{i_1}, \alpha_{i_1+1}, \ldots, \alpha_{i_2})$, where $\alpha_i \in \{0, 1, 2, 3\}$. The value of $\alpha_i$ is given by the following Table 24B, that relates to whether the edges (i−1, 0), (i, 0)), (i−1, 1), (i, 1)) and (i, 0), (i, 1)), $i_1 \leq i \leq i_2$ are part of the routing.

TABLE 24B

| ((i−1,0), (i,0)) | ((i−1,1), (i,1)) | ((i,0), (i,1)) | $\alpha_i$ |
|---|---|---|---|
| 1 | 0 | 0 | 0 |
| 0 | 1 | 0 | 1 |
| 1 | 0 | 1 | 2 |
| 0 | 1 | 1 | 3 |

Penalty pen (i, $\alpha_i$) is defined to be the sum of the penalties of those edges of the triple (i−1, 0), (i, 0)), (i−1, 1), (i, 1)) and (i, 0), (i, 1)) that participate in $\alpha_i$.

The penalty PEN($\alpha$) of the whole sequence $\alpha$ is calculated by the following formula.

$$PEN(\alpha) = pen(i_1, \alpha_{i_1}) + \sum_{i=i_1+1}^{i_2} (\Phi(\alpha_{i-1}, \alpha_i) + \psi(\beta_i, \alpha_i)) \cdot pen(i, \alpha_i)$$

We assume that pen(i, $\alpha_i$) is always positive and that $\Phi$ and $\Psi$ are given by the following tables, Table 24C and Table 24D.

TABLE 24C

| $\alpha$ | $\Phi(\alpha, 0)$ | $\Phi(\alpha, 1)$ | $\Phi(\alpha, 2)$ | $\Phi(\alpha, 3)$ |
|---|---|---|---|---|
| 0 | 1 | $\infty$ | 1 | $\infty$ |
| 1 | $\infty$ | 1 | $\infty$ | 1 |
| 2 | 1 | 1 | 1 | 1 |
| 3 | 1 | 1 | 1 | 1 |

TABLE 24D

| $\beta$ | $\psi(\beta, 0)$ | $\psi(\beta, 1)$ | $\psi(\beta, 2)$ | $\psi(\beta, 3)$ |
|---|---|---|---|---|
| 0 | 1 | 1 | 1 | 1 |
| 1 | 1 | $\infty$ | 1 | 1 |
| 2 | $\infty$ | 1 | 1 | 1 |
| 3 | $\infty$ | $\infty$ | 1 | 1 |

The role of pen is to ensure that the routing has the smallest penalty, while the only role of functions $\Phi$ and $\Psi$ is to rule out the impossible routings by setting their penalty to infinity. Our routing is going to be given by the sequence a that yields the minimal value of PEN($\alpha$).

In order to find such a sequence, we define the function PEN(i, $\alpha$)=

$$\min_{\alpha_{i_1},\ldots,\alpha_i,\alpha_i=\alpha}\left(pen(i_1,\alpha_{i_1})+\sum_{k=i_1+1}^{i}(\Phi(\alpha_{k-1},\alpha_k)+\Psi(\beta_k,\alpha_k))\cdot pen(k,\alpha_k)\right)$$

The above function gives the least possible penalty up to $i^{th}$ position for $\alpha_i=\alpha$. We save the information on which $\alpha_k$, $i_1 \leq k \leq i$ this minimum is accomplished. This function is calculated recursively using $$PEN(i,\alpha) = \min_{\alpha_1}(PEN(i-1,\alpha_1)+(\Phi(\alpha_1,\alpha)+\Psi(\beta_i,\alpha))\cdot pen(i,\alpha))$$

We calculate all possible values of the function. Then we choose the value for the sequence that makes PEN $(i_2, \alpha)$ minimal. This is our required routing. Note that all horizontal lines can be done independently, hence this process is easy to parallelize. This process can then be iterated 1024 until we reach horizontal lines one grid apart 1025.

VII. Method and Apparatus for Local Optimization of the Global Routing.

The purpose of the Local Optimization of the Global Routing method described in this Section VII is to optimize the results of the global routing by rerouting parts of some nets on rectangular pieces of the routing graph. These re-routings, due to particulars of the area, can be done in a faster and better way than the general global routing, thereby providing better quality without increasing the run time dramatically.

As discussed above, the design is initially divided with horizontal and vertical lines. Vertical lines pass through the middle of columns and the middle of channels and they do not change. Horizontal lines are $2^k$ grid lines apart initially, where k is a parameter, usually 4. Then the hierarchy of divisions is created. On each level of hierarchy, the horizontal lines are twice closer than on the previous level. The last level is when lines are 1 grid apart.

The nets are initially routed using the Course Global Routing method described above. Passing to the next level is done using the Hierarchical Global Routing Descend method. The optimizations discussed in this Section VII can be applied on each level, and can be accomplished utilizing parallel processing.

Figure 24:
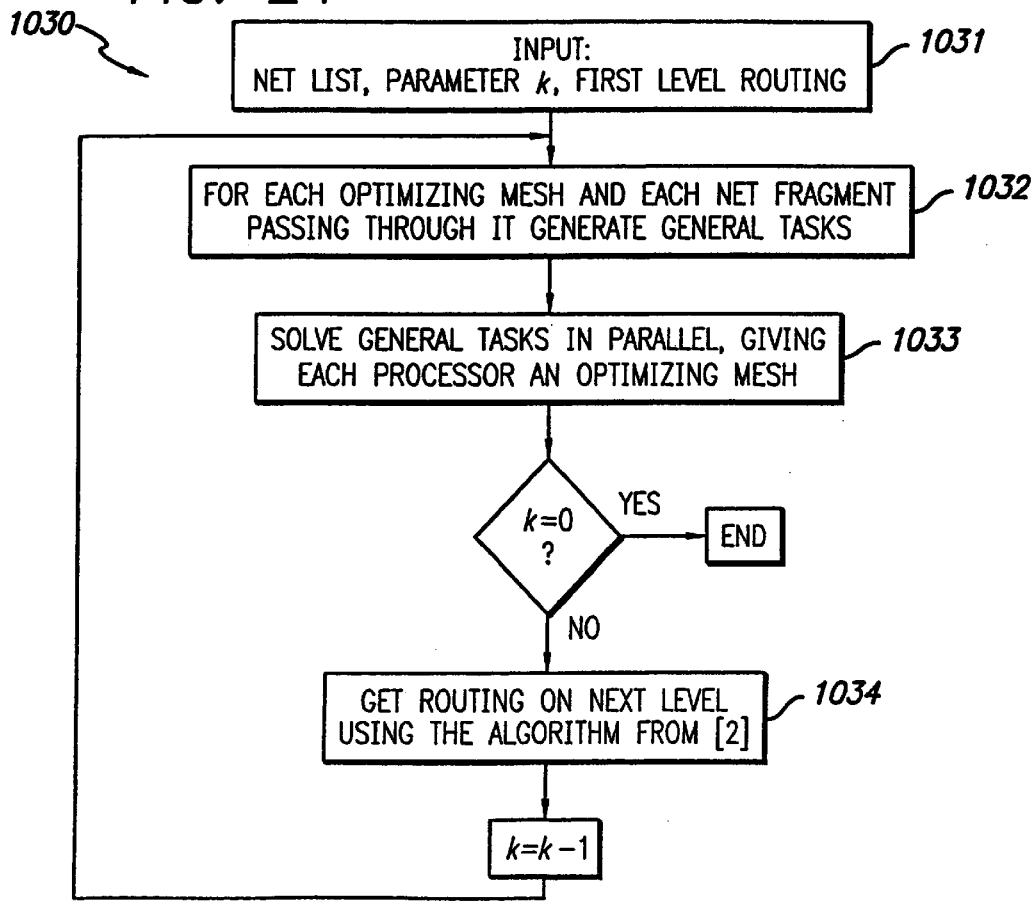
FIG. 24 is a flowchart that depicts the steps of the Local Optimization of the Global Routing process.

The basic operational steps of the Local Optimization of the Global Routing method described herein are set forth in the flowchart 1030 in FIG. 24.

A. Initializing Step: Input of the Netlist, Parameter k and the First Level Routing.

As initializing step 1031, we input the netlist, the parameter k described above and the first level routing. For purposes of this Local Optimization method, we use the notions of the routing graph and the tilenet from the Course Global Routing method described in Section IV above and the hierarchy from the Hierarchical Global Routing Descend described in Section VI above.

B. First Operational Step: Formulate and Solve The General Task Of Optimization In A Strip.

As a first operational step 1032 we formulate and solve the general task of optimization in a strip. This can be mathematically described as follows.

The segments of the strip are numbered from 1 to LN. The $i^{th}$ segment is described with an element of the set $U_i$, so the conditions of the task are a vector $$\vec{u}=(u_1,u_2,\ldots,u_{LN})\in U_1\times U_2\times\ldots\times U_{LN}$$

The penalty for a vector is described with a function $$\Phi(\vec{u}) = \sum_{i=2}^{LN} \varphi_i(u_{i-1},u_i)$$

We need to find the vector of minimal penalty. Let us consider a function $$\Phi_k(u) = \min_{u_1,\ldots,u_k,u_k=u} \sum_{i=2}^{k} \varphi_i(u_{i-1},u_i)$$

This function can be calculated by a recursive formula $$\Phi_k(u) = \min_{v \in U_k}(\Phi_k(v)+\varphi_{k+1}(v,u))$$

Each time we calculate the left side, we write which element v it is achieved on. Using which we calculate all values $$\Phi_k(u_k), u_k \in U_k, k=2, 3, \ldots, LN$$

It follows that, $$\min_{\vec{u}}\Phi(\vec{u}) = \min_{u \in U_{LN}} \Phi_{LN}(u)$$

We find $u_{LN}$ such that $$\Phi_{LN}(u_{LN}) = \min_{u \in U_{LN}} \Phi_{LN}(u)$$

We start with k=LN−1 and decrease k until it reaches 1. For each k we read $u^k$ for which $$\Phi_{k+1}(u_{k+1})=\Phi_k(u_k)+\phi(u_k,u_{k+1})$$

The obtained vector $(u_1,u_2,\ldots,u_{LN})$ is the solution of our task.

C. Second Operational Step: Optimizing On A Mesh.

As a second operational step 1033, we optimize the design on a mesh. We consider a subset of the routing graph consisting of a few horizontal lines and all vertical lines connecting them. Such a subset we shall call optimizing mesh. Typically, on higher levels of hierarchy where lines are more than 4 grids apart on the design, we use the optimizing mesh that is two lines high, while on lower levels we can consider 3 to 5 lines. Basically, we are trying to make sure that the total height of the optimizing mesh is not too large.

In mathematical terms, the mesh is a set of pairs (i,j), where $0 \leq i \leq n-1$, where n is the number of half-channels, and $0 \leq j \leq t-1$, where t is the number of horizontal lines. This mesh is a part of the routing graph, and its starting point (0,0) corresponds to a point (I,J) on the routing graph.

We consider all nets passing through the mesh. Notice that the nets are now routed, so we consider all the edges that connect the pins. For each such net we consider the connected components of its intersection with the mesh. These components are the subject of our optimization. We shall basically re-route all of them. We will make a new net, called the local net for each of the components and then route it.

A vertex (i,k) in the component will be considered a pin in the local net if at least one of these conditions apply:

a. It represents a real pin from the tilenet.
b. k=0 and the edge ((I+i,J), (I+i,J−1)) is part of the routing of the tilenet.
c. k=0 and the edge ((I+i, J+t−1), (1+i, J+t)) is part of the routing of the tilenet.

By $W_i$ we denote a set of local nets that contain a pin with a first coordinate less than or equal to i−I and a pin with a first coordinate greater than or equal to i. Such a pin must pass through one of the edges of the type ((i−1, j), (i,j)). We consider it will pass through only one such edge due to the fact that there are relatively few horizontal lines in the mesh. Hence, which net passes through which edge can be described by a function f:W−>{0, 1, . . . , t−1}. This also determines the vertical edges in the following way.

Given a net w, we define mn (w,i) and mx (w,i) as follows. mn (w,i) is a minimum of $f_i(w), f_{i+1}(w)$ and the first coordinates of all the pins in w, while mx(w,i) is the maximum of the same set of numbers. Then the routing of the net w contains all the edges of the type ((i,j), (i,j+1)), mn(w,i) ≦j<mx(w,i). In that way we can calculate the penalty for each edge of the local net.

Now we can apply the general task algorithm to solve this problem and obtain the optimal routing of the local nets. Note that all horizontal lines can be done independently, hence this algorithm can be parallelized.

Similarly we can do the optimizations in the vertical strips, basically swapping roles of horizontal and vertical edges above. On the routing graph, these would be two halfchannels wide.

If the number of possible choices for $f_1$ turns out to be very large, we can consider working only in the neighborhood of the existing routing, i.e. we can consider only such $f_i$ that do not differ much from the descriptions of the original routings of the nets. This optimizing procedure can be repeated a few times.

VIII. Method and Apparatus for the Minimization of Process Defects While Routing.

The purpose of the method and apparatus for the minimization of process defects described in this Section VIII is to optimize the results of the routing by spreading the wires as evenly as possible. The need for this arises in the production and fabrication of the IC designs. When a lot of wires are very close to each other, the machines that lay the wires on sometimes produce "spots" of metal, which cause the designs to be defective.

As discussed above, the design is initially divided with horizontal and vertical lines. Vertical lines pass through the middle of columns and the middle of channels and they do not change. Horizontal lines are $2^k$ grid lines apart initially, where k is a parameter, usually 4. Then the hierarchy of divisions is created. On each level of hierarchy, the horizontal lines are twice closer than on the previous level. The last level is when lines are I grid apart. After that the detailed routing is performed on each half-channel. The optimization process discussed in this Section VIII can be done on each level of hierarchy as well as before and after performing the detailed routing. The hierarchy optimizations attempt to evenly distribute the global routing of the nets over different parts of the design. The optimization before detailed routing attempts to distribute vertical wires evenly between the first and third layers of the design. After the detailed routing, the optimization is utilized in an attempt to continuously deform the routing without changing the relative order of wires.

The nets are initially routed using the Course Global Routing method described above in Section IV. Passing to the next level is done using the Hierarchical Global Routing Descend described above. The optimizations discussed in this Section VIII can be applied on each level and can be accomplished with parallel processing.

A. Optimization of the Hierarchy.

For purposes of the Minimization of Process Defects method described herein, we use the notions of the routing graph, capacity, occupancy, penalty and the tilenet from the Course Global Routing method, the hierarchy from the Hierarchical Global Routing Descend method, and the general task from the Local Optimization of the Global Routing method.

The optimization of the hierarchy is performed by adding a new expression to the penalty of each edge. The additional penalty adds to the overall penalty as a function of the actual or projected neighboring wires, thus increasing tendencies to distribute the routing evenly. This can be done while performing other optimizations from the Local Optimization of the Global Routing method, or after them on similar parts of the design.

Consider the horizontal edges of the type $$w_j=((i,j), (i+1,j)), j=0, 1, \ldots , t-1.$$

Let $c_j$ be the capacity of the $j^{th}$ edge, and $z_j$ its occupancy. An additional penalty is calculated using the formula $$\left(\sum_{j=0}^{t-1} (c_j - 1) \cdot \left(\frac{z_j}{c_j}\right)^2\right) + \left(\sum_{j=1}^{t-1} \frac{z_{j-1}}{c_{j-1}} \cdot \frac{z_j}{c_j}\right)$$

The weight of this penalty can be decided through testing, starting with 1. This modification of the penalty can be done for vertical edges as well.

B. Optimization Before Detailed Routing.

For purposes of describing the use of the Minimization of Process Defects While Routing method, assume that the design has three layers. We attempt to distribute the vertical wires between the first and third layer before they are assigned precise horizontal positions.

For purposes of our discussion, we restrict our attention to a particular half-channel. Horizontal grid lines containing beginnings or ends of vertical wires are marked. The half-channel is divided into little strips. The lines marked above become strips. Non-empty spaces (i.e. containing at least one horizontal grid line) between neighboring marked lines become strips. A strip corresponds to two vertices of the graph, one for first and one for third level. Each vertex is joined with an edge to vertices above and below it. A pair of vertices corresponding to the same strip is joined with an edge as well. The capacity of such edges is equal to 1 if the corresponding horizontal line is free on the second level, otherwise it is 0.

This penalty is similar to the penalty for optimization on the hierarchy, except that it is multiplied for each strip by its height in grids. The penalty is considered infinite if the configuration leads to occupancy being higher than capacity, notably in case of edges joining the first and third level.

The task here is very similar to the general task of the Local Optimization of the Global Routing method with t=2. Instead of a net we have a wire. We have the initial and the final strip for the wire. The solution is a sequence of edges that joins the initial and the final strip, which is obtained using methods described in connection with the Local Optimization of the Global Routing.

C. Optimization of Detailed Routing.

The Minimization of Process Defects while Routing optimization can be used after detailed routing, in a horizontal or vertical strip. For the solution we permit short pieces of wires on a layer that are perpendicular to the general direction of the layer. We do not change the relative order of wires, we just attempt to continuously deform the routing.

The local situation is described on a cross-cut, i.e. a set of vertices $$v_j=(i,j), j=0, 1, \ldots, t-1.$$

For each such cross-cut there is a set of wires $W_i$ passing through the it and a set of blocks $B_i$ which consists of grids that cannot be used for wires. The set $W_i$ splits into two sets, $W^1_i$ and $W^2_i$ of free and fixed wires, respectively. Wires are called fixed on a cross-cut if they contain a pin on the same cross-cut. The function $$\alpha_i: W_i \cup B_i \rightarrow \{0, 1, \ldots, t-1\}$$

describes the current values of wire on the grids. The possible values of wires on grids are given by a pair of functions $$bt_i: W_i \cup B_i \rightarrow \{0, 1, \ldots, t-1\}$$

$$tp_i: W_i \cup B_i \rightarrow \{0, 1, \ldots, t-1\}$$

that satisfy the following conditions

1) $bt_i(x) \leq tp_i(x)$
2) if $\alpha_i(x) < \alpha_i(y)$ then $tp_i(x) < bt_i(y)$
3) if the wire x is fixed, then $bt_i(x) \leq \alpha_i(x) \leq tp_i(x)$
4) if x is a block then $bt_i(x) = \alpha_i(x) = tp_i(x)$ Corresponding to each wire x on a cross-cut is a piece $$(i, bt_i(x)), \ldots, (i, tp_i(x)).$$

The ordering of wires and blocks is not violated, and the fixed wires have to contain their pin.

A given configuration is called "regular" if for any wire x intersecting the $(i-1)^{th}$ and $i^{th}$ cross-cut the following conditions are satisfied.

$$bt_{i-1}(x) \leq tp_i(x), bt_i(x) \leq t_{i-1}(x)$$

Otherwise, its penalty is set to infinity. In regular cases the penalty is equal to the sum of penalties for all cross-cuts.

The problem of finding the minimal penalty is solved using the general solution for linear equations.

IX. Method and Apparatus for Parallel Routing Locking Mechanism.

The purpose of the Method and Apparatus for Parallel Routing Locking Mechanism described in this Section IX is to enable data consistency while routing a large number of nets in parallel. As described above, for each horizontal strip of a design, we need to reroute all wires passing through it, and we want to do that in parallel. Since this information is stored on a per-net basis, we cannot allow different processors to simultaneously change the data belonging to one net, as this might corrupt the data Accordingly, we assign to each processor a portion of the design on which to work and we spread the portions apart in order to avoid conflicts between parallel processors. However, there is no way to completely avoid such conflicts, as some nets have pins far away from each other, forcing the routing to pass through many portions of the design.

Standard procedure would require a processor locking each net it works on, then unlocking the net as it is finished. This requires a multiple exclusion ("mutex") lock structure for each net. Such a structure takes a significant amount of memory, especially on large designs. Taking so much memory just for locking is not feasible.

A better approach is to have a single lock dealing with collisions for a group of nets. This is described in FIG. 25, which is a flowchart 1060 depicting the steps of the mechanism.

As an initializing step 1061, we input a netlist and the parameter n. The parameter n will typically be about 10 although this can vary depending on the likelihood of conflicts between processors. If conflicts are likely, n will be less than 10 and if conflicts are not likely, n can be larger. As the first operational step 1062, we then divide the nets into groups of n nets and assign a lock to each group.

As a second operational step 1063, we create a character array with a place for each net in our netlist. Initially, the character array is filled with 0's. During the routing process, for each net we will store a 1 if a processor is working on the net and 0 otherwise. We also create an array of locks, one for each group of n nets. Preferably, the locks will be mutex locks. As will be familiar to those skilled in the art of multi-process and/or multi-threaded computing environments, a "mutex" is a synchronization variable which enables multiple computer entities executing within a single operating system to properly synchronize their operation. The patch chain mutex effectively prevents other computer entities from modifying the patch chain while the patch manager owns the patch chain mutex. As will be appreciated, other types of synchronization variables as well as other lock mechanisms may be suitable for use in locking in the present invention.

When a processor needs to work on $i^{th}$ net 1064, it looks at the $i^{th}$ place in the character array 1065. If there is a 1 there, another processor is working on the $i^{th}$ net, so our processor waits. If there is a 0 there, it attempts to lock. Attempts continue until the lock is obtained. Then we must check again to see if the value $\alpha(i)$ was changed to 1 by another processor while we waited for the lock 1066.

If it was changed, that means that another processor grabbed the same net while we waited for the lock, so we release the lock and wait again 1071. If it was not changed, then we know for sure the net is ours alone, so we set $\alpha(i)$ to 1 and release the lock (1067 and 1068). After finishing the work with the net, we set $\alpha(i)$ to 0 (1069 and 1070). Note that now we do not have to ask for a lock, as no other processor could change the value once it is set to 1.

The character array takes 1 byte per member, so it requires 64 times less memory than the array of locks. Our smaller lock array is n times smaller than the full array, so varying n we can achieve various levels of memory-saving. The parameter n is chosen such that the required memory saving is obtained, while at the same time maintaining good runtime. Since a processor's waiting for a lock is expensive, we cannot take n to be too large.

X. Design Environment.

Figure 26:
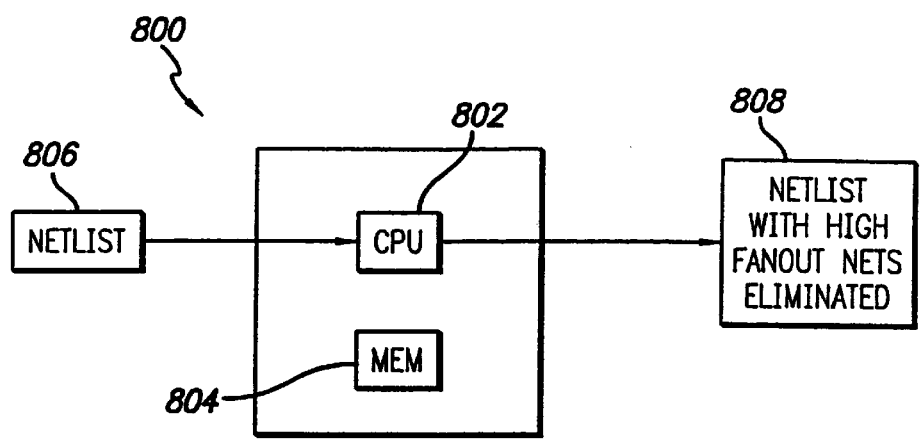
FIG. 26 depicts an apparatus constituting the present invention having a single processor.

Each of the steps discussed above can be encoded for use in a general computer. Now referring to FIG. 26, a computing apparatus 800 for routing according to the methods described above is illustrated. The apparatus comprises a processor 802 and memory 804. The memory 804, connected to the processor 802, stores instructions for the processor 802 to accept input of the netlist and associated parameters and to follow the steps discussed above.

The memory 804 may be any kind of machine-readable storage medium containing the instructions for the processor. It is well known in the art that the memory may be formed as a semiconductor memory device, magnetic device, optical device, magneto-optical device, floppy diskette, hard drive, CD-ROM, magnetic tape, computer memory, or memory card.

Figure 27:
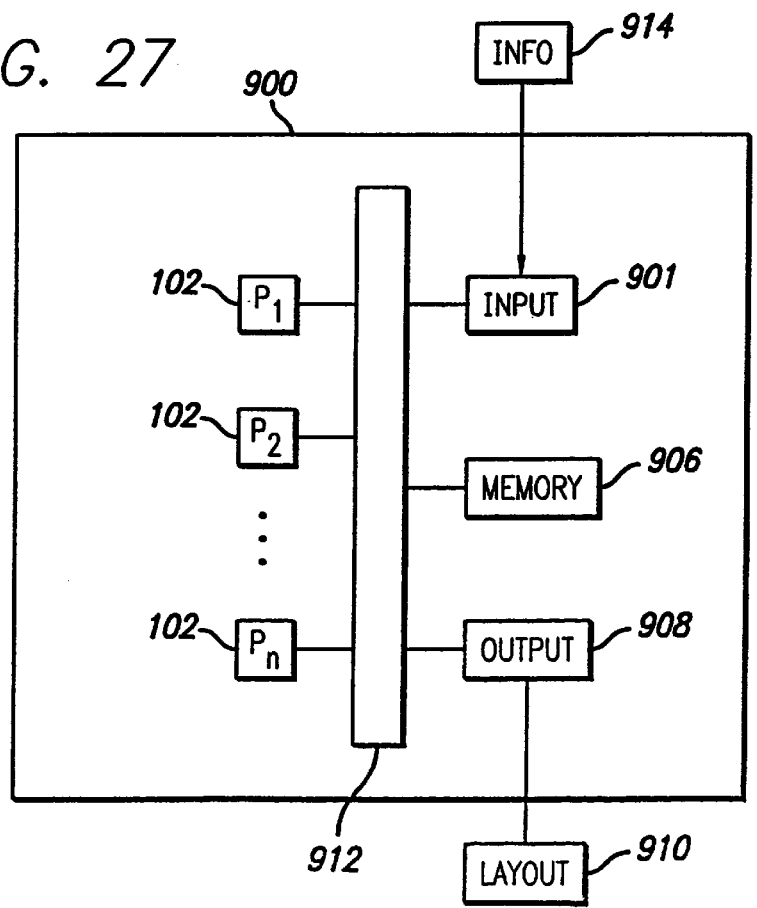
FIG. 27 depicts an apparatus constituting the present invention having multiple processors.

Referring now to FIG. 27, an additional apparatus 900 for applying the methods and operations discussed above is illustrated. The apparatus 900 comprises a plurality of processors 902 and memory 906 for storing instructions for the processors 902 as described above. The processors 902 may be of any commercially produced RISC or CISC processors commonly made by a number of vendors, or custom made processors such as LSI Logic's CoreWare modules. The processors and the memory is connected 912. Also connected to the processors 902 and memory 906 are an input device 904 and an output device 908 for retrieving the netlist and parameter information 914 and for outputting the results of the routing of the netlist as discussed above 910.

As discussed above, the specific algorithms and steps described herein, as well as the basic steps which such algorithms represent (even if they are replaced by different algorithms), are designed for implementation in a general purpose computer. Furthermore, each of the algorithms and steps described herein, as well as the basic steps represented by such algorithms, can be encoded on computer storage media such as CD ROMS, floppy disks, computer harddrives, and other magnetic, optical, other machine readable media, whether alone or in combination with one or more of the algorithms and steps described herein.

Although the methods discussed herein have been described in detail with regard to the exemplary embodiments and drawings thereof, it should be apparent to those skilled in the art that various adaptations and modifications of the methods may be accomplished without departing from the spirit and the scope of the invention. Thus, by way of example and not of limitation, the methods are discussed as illustrated by the figures. Accordingly, the invention is not limited to the precise embodiment shown in the drawings and described in detail hereinabove.

What is claimed is:

1. A method for optimizing the routing of nets in an integrated circuit device, said method comprising:
    a. dividing an integrated circuit design with lines in a first direction and lines in a second direction, wherein said first direction is substantially orthogonal to said second direction;
    b. forming a routing graph with vertices corresponding to locations where lines in said first direction and lines in said second direction cross and with edges connecting the vertices;
    c. for each of a plurality of the edges in said routing graph, computing an individual edge occupancy value, wherein the individual edge occupancy value is computed by determining at least one of a probability of a wire passing through said edge and a number of actual wires passing through said edge;
    d. for an edge in said plurality of edges, computing a penalty value as a function of the individual edge occupancy value of a different edge; and
    e. routing a net as a function of said penalty value.

2. The method of claim 1 wherein the edge for which the penalty value is computed is connected directly to said different edge.

3. The method of claim 1 further comprising the step of, for each edge in said plurality of edges, computing an individual capacity value.

4. The method of claim 3 wherein said penalty value is further computed as a function of the individual capacity value of said different edge.

5. The method of claim 4 wherein the penalty value is a function of the individual capacity value of the different edge divided by the individual occupancy value of the different edge.

6. The method of claim 4 wherein said penalty value is further a function of the individual occupancy value and the individual capacity value computed for the edge for which the penalty value is computed.

7. The method of claim 1 wherein the individual occupancy value of an edge is computed as a function of the potential occupancy of the edge.

8. The method of claim 1 wherein the individual occupancy value of an edge is computed as a function of the current occupancy of the edge.

9. The method of claim 1 wherein the individual occupancy value of an edge is computed as a function of both the current occupancy of the edge and the potential occupancy of the edge.

10. A method for distributing wires between layers in an integrated circuit design, said method comprising:
    a. for a particular half-channel, marking grid lines in a first direction containing beginnings or ends of wires;
    b. dividing said half-channel into strips based on the markings made in step a;
    c. forming a routing graph that includes two vertices for each strip, wherein each of the two vertices corresponds to a different one of plural routing layers;
    d. computing a capacity value for an edge between the two vertices corresponding to one of the strips; and
    e. routing a net on said plural routing layers as a function of the capacity value.

11. The method of claim 10 wherein said plural routing layers comprise a first layer and a third layer, and wherein there is a second layer between said first and third layers.

12. The method of claim 11 wherein said capacity value is a function of the occupancy of a portion of the second layer.

13. A method according to claim 10 wherein the capacity value is constrained to be one of 0 and 1.

14. A method according to claim 10, wherein the layers corresponding to the two vertices are for routing wires in a same direction.

15. A method according to claim 10, wherein the capacity value is a function of the occupancy of a portion of a layer that lies between the layers to which the two vertices correspond.

16. An apparatus for optimizing the routing of nets in an integrated circuit device, said apparatus comprising:
    a. means for dividing an integrated circuit design with lines in a first direction and lines in a second direction, wherein said first direction is substantially orthogonal to said second direction;
    b. means for forming a routing graph with vertices corresponding to locations where lines in said first direction and lines in said second direction cross and with edges connecting the vertices;
    c. means for, for each of a plurality of the edges in said routing graph, computing an individual edge occupancy value, wherein the individual edge occupancy value is computed by determining at least one of a probability of a wire passing through said edge and a number of actual wires passing through said edge;
    d. means for, for an edge in said plurality of edges, computing a penalty value as a function of the individual edge occupancy value of a different edge; and
    e. means for routing a net as a function of said penalty value.

17. The apparatus of claim 16 wherein the edge for which the penalty value is computed is connected directly to said different edge.

18. The apparatus of claim 16 further comprising means for, for each edge in said plurality of edges, computing an individual capacity value.

19. The apparatus of claim 18 wherein said penalty value is further computed as a function of the individual capacity value of said different edge.

20. The apparatus of claim 19 wherein the penalty value is a function of the individual capacity value of the different edge divided by the individual occupancy value of the different edge.

21. The apparatus of claim 20 wherein said penalty value is further a function of the individual occupancy value and the individual capacity value computed for the edge for which the penalty value is computed.

22. The apparatus of claim 16 wherein the individual occupancy value of an edge is computed as a function of the potential occupancy of the edge.

23. The apparatus of claim 16 wherein the individual occupancy value of an edge is computed as a function of the current occupancy of the edge.

24. The apparatus of claim 16 wherein the individual occupancy value of an edge is computed as a function of both the current occupancy of the edge and the potential occupancy of the edge.

25. An apparatus for distributing wires between layers in an integrated circuit design, said apparatus comprising:
  a. for a particular half-channel, means for marking grid lines in a first direction containing beginnings or ends of wires;
  b. means for dividing said half-channel into strips based on the markings made by means a;
  c. means for forming a routing graph that includes two vertices for each strip, wherein each of the two vertices corresponds to a different one of plural routing layers;
  d. means for computing a capacity value for an edge between the two vertices corresponding to one of the strips; and
  e. means for routing a net on said plural routing layers as a function of the capacity value.

26. The apparatus of claim 25 wherein said plural routing layers comprise a first layer and a third layer, and wherein there is a second layer between said first and third layers.

27. The apparatus of claim 26 wherein said capacity value is a function of the occupancy of a portion of the second layer.

28. An apparatus according to claim 25 wherein the capacity value is constrained to be one of 0 and 1.

29. An apparatus according to claim 25, wherein the layers corresponding to the two vertices are for routing wires in a same direction.

30. An apparatus according to claim 25, wherein the capacity value is a function of the occupancy of a portion of a layer that lies between the layers to which the two vertices correspond.

31. A computer storage device with instructions thereon for optimizing the routing of nets in an integrated circuit device, said storage device comprising:
  a. a computer encoded instruction for dividing an integrated circuit design with lines in a first direction and lines in a second direction, wherein said first direction is substantially orthogonal to said second direction;
  b. a computer encoded instruction for forming a routing graph with vertices corresponding to locations where lines in said first direction and lines in said second direction cross and with edges connecting the vertices;
  c. a computer encoded instruction for, for each of a plurality of the edges in said routing graph, computing an individual edge occupancy value, wherein the individual edge occupancy value is computed by determining at least one of a probability of a wire passing through said edge and a number of actual wires passing through said edge;
  d. a computer encoded instruction for, for an edge in said plurality of edges, computing a penalty value as a function of the individual edge occupancy value of a different edge; and
  e. a computer encoded instruction for routing a net as a function of said penalty value.

* * * * *